(12) United States Patent
Higuchi et al.

(10) Patent No.: US 7,268,472 B2
(45) Date of Patent: Sep. 11, 2007

(54) PIEZOELECTRIC DEVICE, LIQUID JETTING HEAD, FERROELECTRIC DEVICE, ELECTRONIC DEVICE AND METHODS FOR MANUFACTURING THESE DEVICES

(75) Inventors: Takamitsu Higuchi, Nagano-ken (JP); Setsuya Iwashita, Nagano-ken (JP); Hiromu Miyazawa, Nagano-ken (JP); Koji Sumi, Nagano-ken (JP); Masami Murai, Nagano-ken (JP); Maki Ito, Nagano-ken (JP); Li Xin-Shan, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 295 days.

(21) Appl. No.: 10/705,251

(22) Filed: Nov. 12, 2003

(65) Prior Publication Data

US 2005/0122005 A1    Jun. 9, 2005

(30) Foreign Application Priority Data

| Nov. 11, 2002 | (JP) | 2002-326447 |
| Nov. 11, 2002 | (JP) | 2002-326448 |
| Nov. 11, 2002 | (JP) | 2002-326449 |
| Nov. 19, 2002 | (JP) | 2002-335628 |
| Nov. 21, 2002 | (JP) | 2002-338514 |
| Nov. 28, 2002 | (JP) | 2002-346397 |
| Dec. 9, 2002 | (JP) | 2002-357167 |
| Nov. 10, 2003 | (JP) | 2003-380085 |
| Nov. 10, 2003 | (JP) | 2003-380094 |
| Nov. 10, 2003 | (JP) | 2003-380102 |

(51) Int. Cl.
*H01L 41/047* (2006.01)
*H01L 41/22* (2006.01)

(52) U.S. Cl. .............................. 310/365; 310/311

(58) Field of Classification Search ........ 310/300–371, 310/800; 29/25.35
See application file for complete search history.

(56) References Cited

U.S. PATENT DOCUMENTS

| 5,401,544 | A | * | 3/1995 | Nakahata et al. ............ 427/585 |
| 5,656,382 | A | * | 8/1997 | Nashimoto .................. 428/620 |
| 6,229,250 | B1 | * | 5/2001 | Nakanishi et al. .......... 310/364 |

(Continued)

FOREIGN PATENT DOCUMENTS

JP    06-145977 A    5/1994

(Continued)

*Primary Examiner*—Thomas M. Dougherty
(74) *Attorney, Agent, or Firm*—Sughrue Mion, PLLC

(57) ABSTRACT

An intermediate film (15, 12, 53) is formed on a substrate (11, 52), a bottom electrode (13, 542) is formed on top of this intermediate film, a ferroelectric film (24) or piezoelectric film (543) is formed on top of this bottom electrode by an ion beam assist method, and a top electrode (25, 541) is formed on top of this ferroelectric film or piezoelectric film. The ferroelectric film or piezoelectric film is formed by PZT, BST or a relaxer material. As a result of the use of an ion beam assist method in the formation of any one of the intermediate film, bottom electrode, ferroelectric film or piezoelectric film, a piezoelectric device or ferroelectric device which has a piezoelectric film or ferroelectric film with an in-plane orientation can be manufactured with good efficiency.

28 Claims, 31 Drawing Sheets

U.S. PATENT DOCUMENTS

| | | | |
|---|---|---|---|
| 6,255,762 B1* | 7/2001 | Sakamaki et al. | 310/358 |
| 6,630,767 B2* | 10/2003 | Inoue et al. | 310/313 A |
| 2002/0149019 A1* | 10/2002 | Iwashita et al. | 257/72 |
| 2003/0067509 A1* | 4/2003 | Sakamaki et al. | 347/68 |
| 2003/0175062 A1* | 9/2003 | Kashiwaya et al. | 400/103 |

FOREIGN PATENT DOCUMENTS

| | | |
|---|---|---|
| JP | 2614948 B2 | 2/1997 |
| JP | 2670391 B2 | 7/1997 |
| JP | 2721595 B2 | 11/1997 |

* cited by examiner

PIEZOELECTRIC DEVICE, LIQUID JETTING HEAD, FERROELECTRIC DEVICE, ELECTRONIC DEVICE AND METHODS FOR MANUFACTURING THESE DEVICES

BACKGROUND OF THE INVENTION

1. Field of the Invention

The present invention relates to a piezoelectric device or ferroelectric device comprising a piezoelectric film or ferroelectric film and a pair of electrodes between which this film is sandwiched, and a liquid jetting head and electronic device equipped with such devices, and more particularly relates to a piezoelectric device or the like comprising a piezoelectric film or ferroelectric film which has superior orientation properties.

2. Description of the Related Art

Compound oxides which have a perovskite type crystal structure and which can be expressed by the chemical formula $ABO_3$ are known as piezoelectric films or ferroelectric films used in piezoelectric devices or ferroelectric devices. For example, lead zirconate titanate (PZT) which uses lead (Pb) as A and a mixture of zirconium (Zr) and titanium (Ti) as B is known.

In order to improve the characteristics of such piezoelectric films or ferroelectric films, various attempts have been made to arrange the crystal orientation in a desired direction. In particular, there is a demand for the production of piezoelectric films or ferroelectric films with an in-plane orientation in which the orientation is suitably arranged in all three dimensions.

In the field of oxide superconductors, the formation of films with an in-plane orientation by means of an ion beam assist method has been proposed (Japanese Patent Application Laid-Open No. 6-145977).

SUMMARY OF THE INVENTION

However, the efficient production of piezoelectric films or ferroelectric films with an in-plane orientation has been difficult.

It is an object of the present invention to provide a method for the efficient manufacture of piezoelectric devices or ferroelectric devices comprising piezoelectric films or ferroelectric films which have an in-plane orientation.

In a first aspect of the piezoelectric device manufacturing method, liquid jetting head manufacturing method and liquid jetting apparatus manufacturing method of the present invention, a bottom electrode is formed on a substrate, a piezoelectric film is formed on top of this bottom electrode by an ion beam assist method, and a top electrode is formed on top of this piezoelectric film. In particular, it is desirable that the piezoelectric film contain PZT, BST or a relaxer material.

In a second aspect, in a step in which a piezoelectric film is formed by performing a process in which firing is performed after a sol containing the material of the piezoelectric film is applied as a coating, dried and degreased so that a precursor is formed, the abovementioned precursor is irradiated at least once with an ion beam following the abovementioned degreasing. In particular, it is desirable that [this piezoelectric film] be formed by repeating the execution of a process (several times) in which firing is performed following the formation of a precursor by the coating application, drying and degreasing of a sol, and that the abovementioned irradiation with an ion beam be performed in a single process among the abovementioned processes. Furthermore, [this formation] may also be accomplished by means of a single process. Moreover, it is desirable that the irradiation with an ion beam be performed after the abovementioned degreasing, either before the abovementioned firing or during this firing.

In a third aspect, a bottom electrode is formed on a substrate by an ion beam assist method, a piezoelectric film is formed on top of this bottom electrode, and a top electrode is formed on top of this piezoelectric film. It is desirable that the abovementioned piezoelectric film be formed on the abovementioned bottom electrode by epitaxial growth.

In a fourth aspect, an intermediate film is formed on a substrate using an ion beam assist method (at least in part), a bottom electrode is formed on top of this intermediate film, a piezoelectric film is formed on top of this bottom electrode, and a top electrode is formed on top of this piezoelectric film. In particular, in this fourth aspect, an ion beam assist method is used to form the portion of the abovementioned intermediate film that is located on the bottom electrode side.

A fifth aspect has a common feature with the fourth aspect in that an intermediate film is formed on a substrate using an ion beam assist method at least in part. In particular, in this fifth aspect, the abovementioned intermediate-layer is formed by forming a first layer of this intermediate film on the substrate by an ion beam assist method, and forming a second layer of this intermediate film on top of the abovementioned first layer. It is desirable that the abovementioned second layer be formed by epitaxial growth on to of the first layer of the intermediate film.

In the fourth aspect and fifth aspect, it is desirable that the abovementioned bottom electrode be formed by epitaxial growth on top of the intermediate film, and that the abovementioned piezoelectric film be formed by epitaxial growth on top of the bottom electrode.

In a sixth aspect, the intermediate film is formed by a step in which a first layer with an in-plane orientation is formed by an ion beam assist method, and a step in which a second layer is formed by continuing deposition while stopping the ion beam assist. It is desirable that the above-mentioned bottom electrode and piezoelectric film be successively formed by epitaxial growth on top of the intermediate film.

In a seventh aspect, the bottom electrode is formed by a step in which a first layer is formed by an ion beam assist method, and a step in which a second layer is formed by continuing deposition while stopping the ion beam assist. It is desirable that the piezoelectric film be formed by epitaxial growth on top of the abovementioned bottom electrode.

In an eighth aspect, the piezoelectric film is formed by a step in which a first layer is formed by an ion beam assist method, and a step in which a second layer is formed by continuing deposition while stopping the ion beam assist. Even if deposition is continued with the ion beam assist stopped, the deposition of the second layer is affected by the crystal structure of the first layer; accordingly, the crystal orientation of the second layer can also be arranged in the desired direction.

In a ninth aspect, the surface on which the intermediate film is to be formed is irradiated with an ion beam prior to the formation of the intermediate film. Since crystals whose crystal planes are oriented in a fixed direction remain on the surface on which the intermediate film is to be formed, the crystal orientations of the intermediate film, bottom electrode and piezoelectric film can be arranged in desired directions. It is desirable that the intermediate film, bottom electrode and piezoelectric film be successively formed by epitaxial growth following this ion beam irradiation.

In a tenth aspect, the surface on which the bottom electrode is to be formed is irradiated with an ion beam prior to the formation of the bottom electrode. Since crystals whose crystal planes are oriented in a fixed direction remain on the surface on which the bottom electrode is to be formed, the crystal orientations of the bottom electrode and piezoelectric film can be arranged in desired directions. It is desirable that the bottom electrode and piezoelectric film be successively formed by epitaxial growth following this ion beam irradiation.

In an eleventh aspect, the surface on which the piezoelectric film is to be formed is irradiated with an ion beam prior to the formation of the piezoelectric film. Since crystals whose crystal planes are oriented in a fixed direction remain on the surface on which the piezoelectric film is to be formed, the crystal orientation of the piezoelectric film can be arranged in the desired direction.

In a first aspect of the ferroelectric device manufacturing method, ferroelectric memory manufacturing method and electronic device manufacturing method of the present invention, a bottom electrode is formed on a substrate, a ferroelectric film is formed on top of this bottom electrode by an ion beam assist method, and a top electrode is formed on top of this ferroelectric film.

In a second aspect, in a step in which a ferroelectric film is formed by performing a process in which firing is performed after a sol containing the material of the ferroelectric film is applied as a coating, dried and degreased so that a precursor is formed, the abovementioned precursor is irradiated at least once with an ion beam following the abovementioned degreasing.

In a third aspect, a bottom electrode is formed on a substrate by an ion beam assist method, a ferroelectric film is formed on top of this bottom electrode, and a top electrode is formed on top of this ferroelectric film.

In fourth and fifth aspects, an intermediate film is formed on a substrate using an ion beam assist method (at least in part), a bottom electrode is formed on top of this intermediate film, a ferroelectric film is formed on top of this bottom electrode, and a top electrode is formed on top of this ferroelectric film.

In a sixth aspect, the intermediate film is formed by a step in which a first layer with an in-plane orientation is formed by an ion beam assist method, and a step in which a second layer is formed by continuing deposition while stopping the ion beam assist.

In a seventh aspect, the bottom electrode is formed by a step in which a first layer is formed by an ion beam assist method, and a step in which a second layer is formed by continuing deposition while stopping the ion beam assist.

In an eighth aspect, the ferroelectric film is formed by a step in which a first layer is formed by an ion beam assist method, and a step in which a second layer is formed by continuing deposition while stopping the ion beam assist.

In a ninth aspect, the surface on which the intermediate film is to be formed is irradiated with an ion beam prior to the formation of the intermediate film.

In a tenth aspect, the surface on which the bottom electrode is to be formed is irradiated with an ion beam prior to the formation of the bottom electrode.

In an eleventh aspect, the surface on which the ferroelectric film is to be formed is irradiated with an ion beam prior to the formation of the ferroelectric film.

In a first aspect of the piezoelectric device, liquid jetting head and liquid jetting apparatus of the present invention, a bottom electrode, piezoelectric film and top electrode are formed on a substrate, and the above-mentioned piezoelectric film is a film with an in-plane orientation formed by an ion beam assist method.

In a second aspect, in a step in which a piezoelectric film is formed by performing a process in which firing is performed after a sol containing the material of the piezoelectric film is applied as a coating, dried and degreased so that a precursor is formed, the piezoelectric film is formed by irradiating the abovementioned precursor at least once with an ion beam following the abovementioned degreasing.

In a third aspect, the bottom electrode is a film with an in-plane orientation which is formed by an ion beam assist method.

In fourth and fifth aspects, at least a portion of the intermediate film is a film with an in-plane orientation which is formed by an ion beam assist method.

In a sixth aspect, the intermediate film comprises a first layer with an in-plane orientation which is formed by an ion beam assist method, and a second layer which is formed by continuing deposition while stopping the ion beam assist.

In a seventh aspect, the bottom electrode comprises a first layer with an in-plane orientation which is formed by an ion beam assist method, and a second layer which is formed by continuing deposition while stopping the ion beam assist.

In an eighth aspect, the piezoelectric film comprises a first layer with an in-plane orientation which is formed by an ion beam assist method, and a second layer which is formed by continuing deposition while stopping the ion beam assist.

In a ninth aspect, the surface on which the intermediate film is to be formed is oriented with an in-plane orientation by irradiation with an ion beam.

In a tenth aspect, the surface on which the bottom electrode is to be formed is oriented with an in-plane orientation by irradiation with an ion beam.

In an eleventh aspect, the surface on which the piezoelectric film is to be formed is oriented with an in-plane orientation by irradiation with an ion beam.

In a first aspect of the ferroelectric device, ferroelectric memory and electronic device of the present invention, a bottom electrode, ferroelectric film and top electrode are formed on a substrate, and the above-mentioned ferroelectric film is a film with an in-plane orientation which is formed by an ion beam assist method.

In a second aspect, in a step in which a ferroelectric film is formed by performing a process in which firing is performed after a sol containing the material of the ferroelectric film is applied as a coating, dried and degreased so that a precursor is formed, the ferroelectric film is formed by irradiating the abovementioned precursor at least once with an ion beam following the abovementioned degreasing.

In a third aspect, the bottom electrode is a film with an in-plane orientation which is formed by an ion beam assist method.

In fourth and fifth aspects, at least a portion of the intermediate film is a film with an in-plane orientation which is formed by an ion beam assist method.

In a sixth aspect, the intermediate film comprises a first layer with an in-plane orientation which is formed by an ion beam assist method, and a second layer which is formed by continuing deposition while stopping the ion beam assist.

In a seventh aspect, the bottom electrode comprises a first layer with an in-plane orientation which is formed by an ion beam assist method, and a second layer which is formed by continuing deposition while stopping the ion beam assist.

In an eighth aspect, the ferroelectric film comprises a first layer with an in-plane orientation which is formed by an ion beam assist method, and a second layer which is formed by continuing deposition while stopping the ion beam assist.

In a ninth aspect, the surface on which the intermediate film is to be formed is oriented with an in-plane orientation by irradiation with an ion beam.

In a tenth aspect, the surface on which the bottom electrode is to be formed is oriented with an in-plane orientation by irradiation with an ion beam.

In an eleventh aspect the surface on which the piezoelectric film is to be formed is oriented with an in-plane orientation by irradiation with an ion beam.

DESCRIPTION OF THE PREFERRED EMBODIMENTS

<1. Ferroelectric Device Construction (1)>

Figure 1:
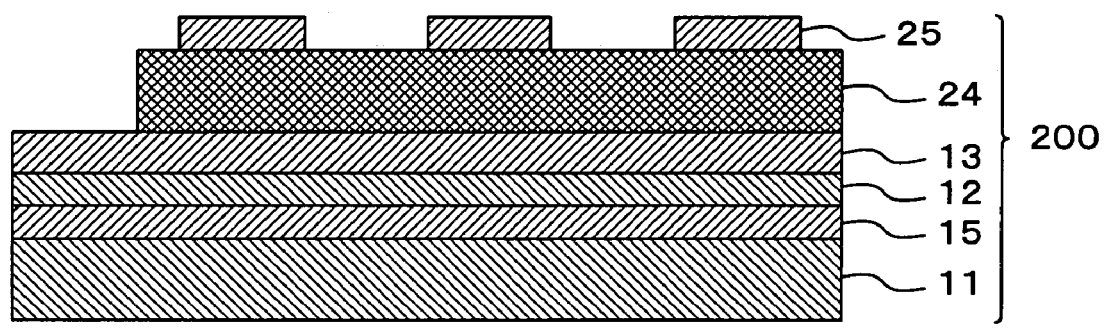
FIG. 1 is a sectional view of a capacitor constituting a ferroelectric device of the present invention.

FIG. 1 is a sectional view of a capacitor constituting a ferroelectric device of the present invention. First, a capacitor 200 which is a first embodiment of the ferroelectric device will be described.

The capacitor 200 of the first embodiment comprises a substrate 11, an amorphous insulating layer 15 which is the first layer of an intermediate film formed on the substrate 11, a buffer layer 12 which is the second layer of this intermediate film, and which is formed on the insulating layer 15, a bottom electrode 13 which is formed on top of this buffer layer 12, a ferroelectric film 24 which is formed in a specified region on top of this bottom electrode 13, and a top electrode 25 which is formed on top of the ferroelectric film 24. In particular, in the present embodiment, the ferroelectric film 24 is formed by an ion beam assist method.

<1-1. Substrate>

The substrate 11 has the function of supporting the bottom electrode 13 and the like, and is constructed from a flat-plate-form member. An amorphous insulating layer 15 is formed on the surface (upper side in FIG. 1) of this substrate 11. The insulating layer 15 may be formed as an integral unit with the substrate 11, or may be fastened to the substrate 11.

For example, an Si substrate, an SOI (Si on insulator) substrate or the like may be used as the substrate 11. In this case, a substrate whose surface is covered by an $SiO_2$ film which is a natural oxidation film or thermal oxidation film may be used. Specifically, in such a case, this natural oxidation film or thermal oxidation film constitutes the insulating layer 15.

Furthermore, besides $SiO_2$, the insulating layer 15 may also be formed using various types of metal materials or the like such as silicon nitride, silicon nitride oxide, zirconium oxide or the like. For example, a two-layer structure comprising 1000 nm of $SiO_2$ and 400 nm of $ZrO_2$ may be used.

For example, such an insulating layer 15 is formed by a chemical vapor deposition method (CVD) such as thermal CVD, plasma CVD, laser CVD or the like, a physical vapor deposition method (PVD) such as vacuum evaporation, sputtering, ion plating or the like, or by sputtering reflow, thermal oxidation of the surface of the Si substrate or the like.

Furthermore, the substrate 11 itself may also be formed by an amorphous substance so that this substrate has insulating properties. In such cases, a substrate constructed from various types of glass materials or various types of resin materials, e.g., polyolefins such as polyethylenes, polypropylenes, ethylene-propylene copolymers, ethylene-vinyl acetate copolymers (EVA) or the like, ring-form polyolefins, modified polyolefins, polyvinyl chlorides, polyvinylidene chlorides, polystyrenes, polyamides, polyimides, polyamidoimides, polycarbonates, poly-(4-methylpentene-1)s, ionomers, acrylic resins, polymethyl methacrylates, acrylonitrile-butadiene-styrene copolymers (ABS resins), acrylonitrile-styrene copolymers (AS resins), butadiene-styrene copolymers, polyoxymethylenes, polyvinyl alcohols (PVA), ethylene-vinyl alcohol copolymers (EVOH), polyester such as polyethylene terephthalates (PET), polybutylene terephthalates (PBT), polycyclohexane terephthalates (PCT) or the like, polyethers, polyether ketones (PEK), polyether ether ketones (PEEK), polyether imides, polyacetals (POM), polyphenylene oxides, modified polyphenylene oxides, polysulfones, polyether sulfones, polyphenylene sulfides, polyallylates, aromatic polyesters (liquid crystal polymers), polytetrafluoroethylenes, polyvinylidene fluorides and other fluororesins, various types of thermoplastic elastomers such as styrene type, polyolefin type, polyvinyl chloride type, polyurethane type, polyester type, polyamide type, polybutadiene type, transpolyisoprene type, fluoro-rubber type, chlorinated polyethylene type elastomers and the like, epoxy resins, phenol resins, urea resins, melamine resins, unsaturated polyesters, silicone resins, polyurethanes and the like, or copolymers, blends, polymer alloys or the like consisting mainly of these polymers, may be used as the substrate 11.

Such Si substrates, SOI substrates, various types of resin substrates, various types of glass substrates and the like are all commonly used substrates. Accordingly, the manufacturing cost of the ferroelectric device can be reduced by using such substrates.

There are no particular restrictions on the mean thickness of the substrate 11; however, it is desirable that this mean thickness be approximately 10 µm to 1 mm, and a mean thickness of approximately 100 to 600 µm is even more desirable. By setting the mean thickness of the substrate 11 within the abovementioned range, it is possible to make the ferroelectric device thinner (i.e., to reduce the size of the ferroelectric device) while ensuring a sufficient strength.

<1-2. Buffer Layer>

A buffer layer 12 comprising a thin film is preferably formed on top of the insulating layer 15. By installing such a buffer layer 12, it is possible to obtain superior adhesion (bonding) between the insulating layer 15 and the bottom electrode 13. However, this buffer layer 12 is not essential in the present embodiment.

In regard to the composition of such a buffer layer 12, for example, a compound with a fluorite structure such as yttria-stabilized zirconia, $CeO_2$, $ZrO_2$, $ThO_2$, $UO_2$, $HfO_2$ or the like, a c-type rare earth oxide such as $Y_2O_3$ or the like, a material with a high Young's modulus and high rigidity such as $Si_3N_4$, SiC, diamond, alumina or the like, a transition metal oxide such as $Ta_2O_5$, $Cr_2O_3$, $Nb_2O_5$ or the like, an insulating compound oxide such as $LiTaO_3$, $MgAl_2O_4$ or the like, a conductive compound oxide such as $LaCoO_3$, $LaSrCuO_4$, $LaCaMnO_3$ or the like, or a compound with an NaCl structure such as MgO, CaO, SrO, BaO, MnO, FeO, CoO, NiO or the like is desirable.

In particular, $CeO_2$, $ZrO_2$, $HfO_2$ and solid solutions of these compounds are desirable as compounds with a fluorite structure. Such metal oxides with a fluorite structure show especially little lattice mismatching with metal oxides that have a perovskite structure.

In particular, MgO, CaO, SrO, BaO, NiO and solid solutions of these compounds are desirable as compounds that have an NaCl structure. Such metal oxides with an NaCl structure show especially little lattice mismatching with metal oxides that have a perovskite structure.

The buffer layer 12 may have any of the following orientations: e.g., a cubic crystal (100) orientation, a cubic crystal (110) orientation, a cubic crystal (111) orientation or the like. Among these orientations, however, a cubic crystal (100) orientation is especially desirable. By setting the orientation of the buffer layer 12 as a cubic crystal (100) orientation, it is possible to set the mean thickness of the buffer layer 12 at a relatively small value. Accordingly, even in cases where the buffer layer 12 is constructed from a metal oxide with an NaCl structure which shows deliquescence such as MgO, CaO, SrO or BaO, the problem of deterioration caused by moisture in the air during manufacture or during use can be appropriately prevented, so that a ferroelectric device suitable for practical use can be obtained.

From such a standpoint, it is desirable to form the buffer layer 12 with as small a thickness as possible. In concrete terms, it is desirable that the mean thickness be 10 nm or less, and a mean thickness of 5 nm or less is even more desirable. As a result, the abovementioned effect is improved.

Furthermore, if the mean thickness of the buffer layer 12 is thus set at a small value, the following advantage is also obtained: e.g., in cases where a ferroelectric memory is manufactured, thin capacitors (e.g., with a thickness on the order of 10 nm) that are required as the design rule of this ferroelectric memory becomes finer can be manufactured.

<1-3. Bottom Electrode>

A bottom electrode 13 is formed on the substrate 11.

There are no particular restrictions on the composition of this bottom electrode 13, as long as the electrode possesses conductivity. However, it is desirable to construct this electrode from a metal material such as Pt, Ir or the like. For example, this electrode may have a layer structure comprising a layer containing Ir/layer containing Pt/layer containing Ir (from the bottommost layer), or may have a two-layer structure comprising a layer containing Ir/layer containing Pt, or a layer containing Pt/layer containing Ir. Furthermore, the electrode may also be constructed from only a layer containing Ir.

Furthermore, a bonding layer (not shown in the figures) comprising a metal that bonds both of the layers, preferably titanium or chromium, may be disposed between the bottom electrode and the substrate. This bonding layer is formed in order to improve the adhesion to the installation surface of the piezoelectric element, and need not be formed in cases where this adhesion can be ensured. For example, the bottom electrode can be formed by a layer structure comprising Ti with a thickness of 20 nm/Ir with a thickness of 20 nm/Pt with a thickness of 140 nm.

Furthermore, the composition of the bottom electrode 13 may also contain metal oxides that have a perovskite structure. In such cases, the electrode preferably contains metal oxides with a perovskite structure as the main materials [of the electrode].

Examples of metal oxides that have a perovskite structure include $CaRuO_3$, $SrRuO_3$, $BaRuO_3$, $SrVO_3$, $(La,Sr)MnO_3$, $(La,Sr)CrO_3$, $(La,Sr)CoO_3$, $LaNiO_x$ and solid solutions that contain these oxides. In particular, it is desirable to use at least one compound selected from a set comprising $CaRuO_3$, $SrRuO_3$, $BaRuO_3$ and solid solutions that contain these oxides. These metal oxides that have a perovskite structure are superior in terms of conductivity and chemical stability. Accordingly, the bottom electrode 13 can also be formed as an electrode that is superior in terms of conductivity and chemical stability.

Furthermore, there are no particular restrictions on the mean thickness of the bottom electrode 13; however, it is desirable to set this mean thickness at approximately 10 to 300 nm, and a mean thickness of approximately 50 to 150 nm is even more desirable. As a result, the bottom electrode 13 can exhibit a sufficient function as an electrode, and an increase in the size of the ferroelectric device can also be prevented.

<1-4. Ferroelectric Film>

A ferroelectric film 24 is formed with an in-plane orientation on top of this bottom electrode 13 by an ion beam assist method.

As result, for example, the residual polarization of the capacitor 200 is increased, the counter electric field is reduced, and the like. Specifically, various characteristics of the capacitor 200 are improved. Accordingly, in cases where a ferroelectric memory is manufactured using such a capacitor 200, this ferroelectric memory can be formed as a memory that is superior in terms of the angularity of the hysteresis curve.

The ferroelectric film 24 can be constructed from various types of ferroelectric materials. However, it is desirable that this film contain ferroelectric materials that have a perovskite structure, and a ferroelectric film in which ferroelectric materials that have a perovskite structure are the main materials is even more desirable. Furthermore, such ferroelectric materials that have a perovskite structure may be any of the following materials: i.e., materials with a tetragonal crystal (001) orientation, materials with a rhombohedral crystal (100) orientation, materials that are epitaxially grown with a cubic crystal (100) orientation, or materials that are epitaxially grown with a quasi-cubic crystal (100) orientation. In particular, materials with a tetragonal crystal (001) orientation are especially desirable. As a result, the abovementioned effect is improved.

Examples of ferroelectric materials which have such a perovskite structure include metal oxides with a perovskite structure such as $Pb(Zr,Ti)O_3$ (PZT), $(Pb,La)(Zr,Ti)O_3$ (PLZT), $(Ba,Sr)TiO_3$ (BST), $BaTiO_3$, $KNbO_3$, $Pb(Zn,Nb)O_3$ (PZN), $Pb(Mg,Nb)O_3$ (PMN), $PbFeO_3$ and $PbWO_3$, Bi layer-form compounds such as $SrBi_2(Ta,sNb)_2O_9$ and $(Bi, La)_4Ti_3O_{12}$, and solid solutions that contain such compounds (PMN-PT, PZN-PT and the like). Among these materials, PZT, BST and relaxer materials such as PMN-PT, PZN-PT or the like are especially desirable as materials which show good characteristics and which are suitable for the formation of in-plane oriented films by the ion beam assist method. Furthermore, it is desirable that this film contain a solid solution of $PMN_y$-$PZT_{1-y}$ consisting of a relaxer material PMN comprising any of the compounds $Pb(M_{1/3}N_{2/3})O_3$ (M=Mg, Zn, Co, Ni, Mn; N=Nb, Ta), $Pb(M_{1/2}N_{1/2})O_3$ (M=Sc, Fe, In, Yb, Ho, Lu; N=Nb, Ta), $Pb(M_{1/2}N_{1/2})O_3$ (M=Mg, Cd, Mn, Co; N=W, Re) or $Pb(M_{2/3}N_{1/3})O_3$ (M=Mn, Fe; N=W, Re) or mixed phases of these compounds, and $Pb(Zr_xTi_{1-x})O_3$ (PZT, $0.0 \leq x \leq 1.0$). As a result, the capacitor 200 is superior in terms of various characteristics.

Furthermore, there are no particular restrictions on the mean thickness of the ferroelectric film 24; however, a mean thickness of approximately 50 to 300 nm is desirable, and a mean thickness of approximately 100 to 200 nm is even more desirable. By setting the mean thickness of the ferroelectric film 24 in the abovementioned range, it is possible to form a capacitor that can exhibit various characteristics in a favorable manner while preventing an increase in the size of the capacitor 200.

<1-5. Top Electrode>

A comb-form (or band-form) top electrode 25 is formed on top of the ferroelectric film 24.

For example, one material or a combination of two or more materials selected from a set comprising Pt, Ir, Au, Ag, Ru or alloys containing these metals and the like can be used as the constituent material of this top electrode 25.

Furthermore, there are no particular restrictions on the mean thickness of the top electrode 25; however, a mean thickness of approximately 10 to 300 nm is desirable, and a mean thickness of approximately 50 to 150 nm is even more desirable.

<2. Ferroelectric Device Manufacturing Method (1)>

Figure 2:
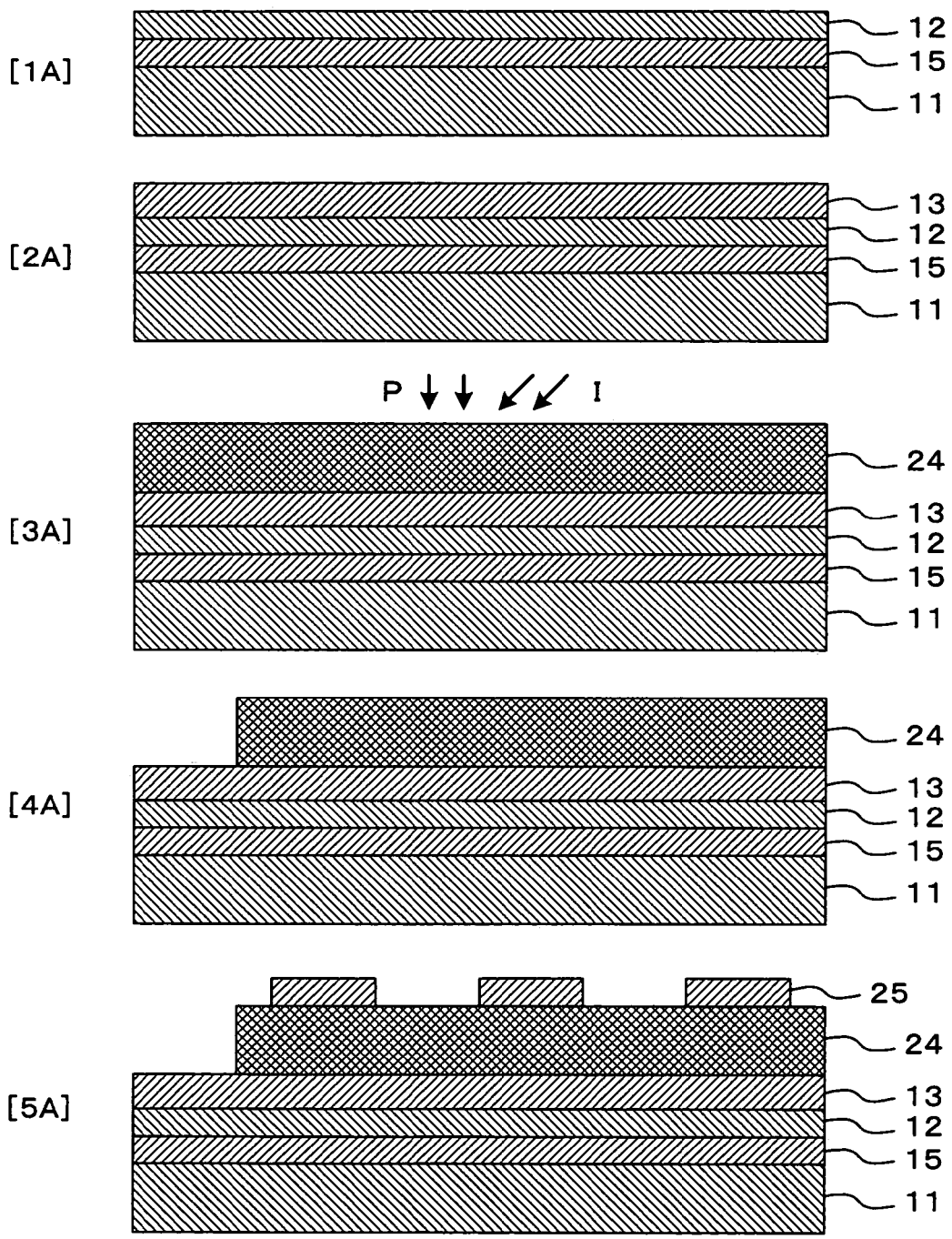
FIG. 2 is a diagram which is used to illustrate the ferroelectric device manufacturing method of a first embodiment of the present invention.

Next, a manufacturing method for a capacitor 200 constituting such a ferroelectric device according to a first embodiment [of the present invention] will be described with reference to FIG. 2.

The method for manufacturing the capacitor 200 described below comprises a step in which a buffer layer 12 is formed on the insulating layer 15 (buffer layer formation step), a step in which a bottom electrode 13 is formed (bottom electrode formation step), a step in which a ferroelectric film 24 is formed on top of the bottom electrode 13 (ferroelectric film formation step), a step in which a portion of the ferroelectric film 24 is removed (bottom electrode lead-out step), and a step in which a top electrode 25 is formed on top of the ferroelectric film 24 (top electrode formation step). These respective steps will be described in order below.

First, a substrate 11 which has an insulating layer 15 is prepared. A substrate which has a uniform thickness, and which is free of any warping or scratches, may be appropriately used as this substrate 11. The method used to form the insulating layer 15 is as described above.

[1A] Buffer Layer Formation Step

First, a buffer layer 12 is preferably formed on top of the insulating layer 15. The formation of this buffer layer 12 may be omitted, and there are no particular restrictions on the formation method used; however, this layer may be formed using a universally known thin film formation method such as a sputtering method, CVD method, MOCVD method, laser ablation method or the like.

[2A] Bottom Electrode Formation Step

Next, a bottom electrode 13 is formed on top of the insulating layer 15 or on top of the buffer layer 12. There are no particular restrictions on the method used to form this bottom electrode; for example, this electrode can be formed by a universally known thin film formation method such as a sputtering method, CVD method, MOCVD method, laser ablation method or the like.

[3A] Ferroelectric Film Formation Step

Next, a ferroelectric film 24 is formed on top of the bottom electrode 13. For example, this is accomplished as follows:

First, the substrate 11 on which the bottom electrode 13 and the like have been formed is mounted in a substrate holder, and is placed inside a vacuum apparatus.

Furthermore, a target containing the constituent elements of the ferroelectric film 24 as described above (ferroelectric film target) is placed inside the vacuum apparatus facing the bottom electrode 13 on the substrate 11 in a position that is separated from the substrate 11 by a specified distance. Furthermore, a target which has a composition that is the same as or similar to the composition of the desired ferroelectric film 24 may be appropriately used as the abovementioned target.

Next, when the target is irradiated with (for example) laser light, atoms including oxygen atoms and metal atoms are knocked out of the target so that a plume P is generated. In other words, this plume P is directed toward the bottom electrode 13. Then, this plume P contacts the surface of the bottom electrode 13.

Furthermore, at substantially the same time, the surface of the bottom electrode 13 is irradiated with an ion beam I that is inclined at a specified angle. As a result, a ferroelectric film 24 which has (for example) a tetragonal crystal (001) orientation and which is oriented in an in-plane orientation is formed on the surface of the bottom electrode 13.

Furthermore, besides a method in which the surface of the target is irradiated with laser light, a method in which an argon gas (inert gas) plasma, electron beam or the like is caused to be incident on the surface of the target can also be employed as the method that is used to knock the abovementioned atoms out of the target.

Among these methods, a method in which the surface of the target is irradiated with laser light is especially desirable as the method used to knock the abovementioned atoms out of the target. If such a method is used, the atoms can be knocked out of the target easily and reliably using a vacuum apparatus with a simple construction that is equipped with a laser light entry window.

Furthermore, this laser light is preferably pulsed light with a wavelength of approximately 150 to 300 nm and a pulse width of approximately 1 to 100 ns. In concrete terms, examples of laser light that can be used include excimer lasers such as ArF excimer lasers, KrF excimer lasers and XeCl excimer lasers, as well as YAG lasers, $YVO_4$ lasers, $CO_2$ lasers and the like. Among these types of laser light, ArF excimer lasers or KrF excimer lasers are especially desirable as the laser light used. Both ArF excimer lasers and KrF excimer lasers are easy to handle, and can knock atoms out of the target with greater efficiency.

It is desirable that the energy density of the laser light be set at 0.5 $J/cm^2$ or greater, and it is even more desirable to set this energy density at 2 $J/cm^2$ or greater.

It is desirable that the temperature of the substrate 11 on which a bottom electrode 13 has been formed be set at approximately 0 to 100° C., and it is even more desirable to set this temperature at approximately 30 to 70° C.

It is desirable that the distance between the substrate 11 on which a bottom electrode 13 has been formed and the target be set at approximately 30 to 100 mm, and it is even more desirable to set this distance at approximately 50 to 80 mm.

It is desirable that the pressure inside the vacuum apparatus be set at $133 \times 10^{-1}$ Pa ($1 \times 10^{-1}$ Torr) or less, and it is even more desirable to set this pressure at $133 \times 10^{-3}$ Pa ($1 \times 10^{-3}$ Torr) or less. In this case, furthermore, it is desirable that the mixture ratio of inert gas to oxygen in the atmosphere inside the vacuum apparatus be set in the range of approximately 300:1 to 10:1 (volume ratio), and it is even more desirable to set this ratio in the range of approximately 150:1 to 50:1.

If the respective conditions in the formation of the ferroelectric film 24 are set in the abovementioned ranges, the ferroelectric film 24 can be formed with good efficiency.

In this case, furthermore, the mean thickness of the ferroelectric film 24 can be adjusted to the range described above by appropriately setting the laser light irradiation time. This laser light irradiation time varies according to the abovementioned conditions; ordinarily, however, it is desirable to set this time at approximately 3 to 90 minutes, and it is even more desirable to set this time at approximately 15 to 45 minutes.

Meanwhile, there are no particular restrictions on the ion beam that irradiates the surface of the bottom electrode 13; for instance, at least one species of ions selected from ions of inert gases such as argon, helium, neon, xenon or krypton, or mixed ions comprising such ions and oxygen ions, may be cited as examples of ions that can be used.

For example, it is desirable to use a Kauffman ion source or the like as the ion source of this ion beam. An ion beam can be generated relatively easily by using this ion source.

Furthermore, there are no particular restrictions on the irradiation angle of the ion beam I with respect to the normal direction of the surface of the bottom electrode 13 (i.e., the abovementioned specified angle); however, it is desirable to set this angle at approximately 35 to 65°. In particular, it is even more desirable to set this angle at approximately 42 to 47° or at approximately 52 to 57°. If the ion beam I is set at such an irradiation angle and directed onto the surface of the bottom electrode 13, a ferroelectric film 24 which has a tetragonal crystal (001) orientation and which is oriented in an in-plane orientation can be formed.

It is desirable that the ion beam acceleration voltage be set at approximately 100 to 300 V, and it is even more desirable to set this acceleration voltage at approximately 150 to 250 V.

Furthermore, it is desirable that the irradiation dose of the ion beam be set at approximately 1 to 30 mA, and it is even more desirable to set this irradiation dose at approximately 5 to 15 mA.

If such a method for forming the ferroelectric film 24 is used, the arranged orientation can be adjusted to any desired direction by the simple method of adjusting the irradiation angle of the ion beam. Furthermore, since the orientation of the ferroelectric film can thus be arranged with good precision, the following advantage is also obtained: namely, the mean thickness of the ferroelectric film 24 can be made smaller.

The ferroelectric film 24 is obtained as described above.

[4A] Bottom Electrode Lead-Out Step

Next, the bottom electrode 13 is led out by removing a portion of the ferroelectric film 24. For example, this can be accomplished by using a photolithographic method.

First, a resist layer is formed on the surface of the ferroelectric film 24 except for the portion that is to be removed.

Next, an etching treatment (e.g., a wet etching treatment, dry etching treatment or the like) is performed on the ferroelectric film 24.

Next, the abovementioned resist layer is removed. As a result, a portion of the bottom electrode 13 (the portion on the left side in FIG. 1) is exposed.

[5A] Top Electrode Formation Step

Next, a top electrode 25 is formed on top of the ferroelectric film 24. For example, this can be accomplished as follows:

First, a mask layer which has a desired pattern shape is formed on top of the ferroelectric film 24 by a sputtering method or the like.

Next, the material of the top electrode 25 (comprising Pt or the like) is formed into a film using (for example) a vapor deposition method, sputtering method, printing method or the like.

Next, the abovementioned mask layer is removed.

The top electrode is obtained as described above.

The capacitor 200 of the first embodiment is manufactured by the abovementioned steps [1A] through [5A].

<3. Ferroelectric Device Construction (2)>

Next, a capacitor which is a second embodiment of the ferroelectric device [of the present invention] will be described. The capacitor 200 of the second embodiment has the same construction as the first embodiment shown in FIG. 1. In particular, in the present embodiment, the ferroelectric film 24 is formed by performing a process in which firing is performed after a sol containing the material of the piezoelectric film is applied as a coating, dried and degreased so that a precursor is formed. In this step, the ferroelectric film 24 is formed by irradiating the abovementioned precursor at least one with an ion beam following the above-mentioned degreasing.

Since the ferroelectric film 24 is thus formed by a sol-gel method in which an ion beam assist method is introduced, the ferroelectric film has a uniformly arranged orientation.

As a result, the capacitor 200 shows (for example) an increase in the residual polarity, a decrease in the counter electric field and the like. In other words, various characteristics of the capacitor 200 are improved. Accordingly, in cases where a ferroelectric memory is manufactured using such a capacitor 200, this ferroelectric memory can be formed as a memory that is superior in terms of the angularity of the hysteresis curve.

The remaining construction of the ferroelectric film 24 is the same as in the abovementioned first embodiment.

<4. Ferroelectric Device Manufacturing Method (2)>

Figure 3:
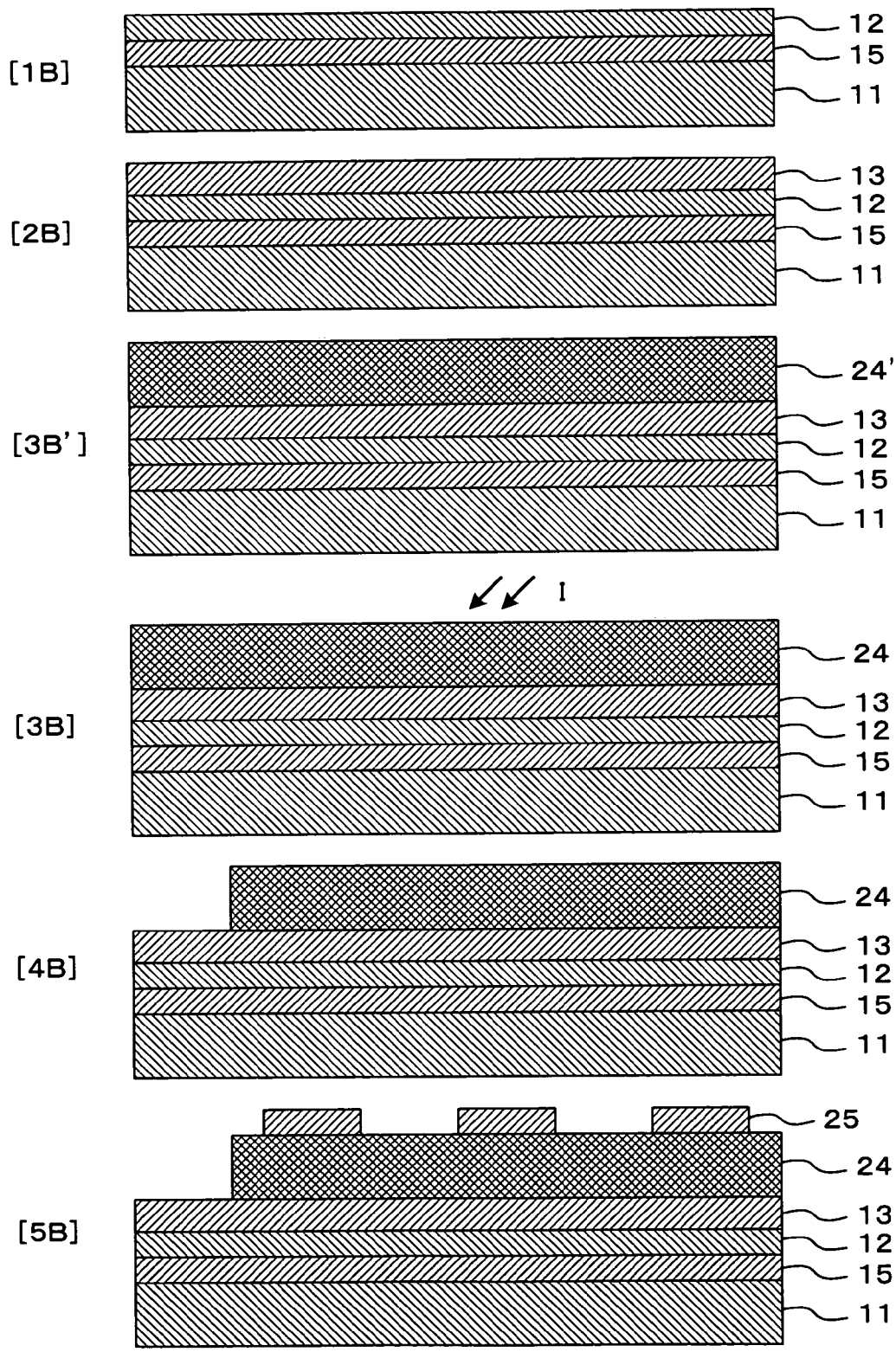
FIG. 3 is a diagram which is used to illustrate the ferroelectric device manufacturing method of a second embodiment of the present invention.

Next, a manufacturing method for such a capacitor 200 according to a second embodiment [of the present invention] will be described with reference to FIG. 3. This capacitor 200 can be manufactured by the following steps.

[1B] Buffer Layer Formation Step

This step can be performed in the same manner as the abovementioned step [1A].

[2B] Bottom Electrode Formation Step

This step can be performed in the same manner as the abovementioned step [2A].

[3B'] Ferroelectric Precursor Film Formation Step

A ferroelectric film 24 is formed following the formation of the bottom electrode 13. For example, this can be accomplished as follows. Furthermore, it is desirable to cause the crystal growth of the ferroelectric film 24 to proceed from the bottom electrode side with Ti crystals as nuclei by forming a Ti layer (not shown in the figures) to a thickness of 3 to 7 nm, preferably 4 to 6 nm, by a sputtering method or the like prior to the formation of the ferroelectric film 24.

First, a ferroelectric precursor film is formed. In order to accomplish this, a sol comprising an organo-metal alkoxide solution is applied as a coating to the surface of the bottom electrode, or to the surface of the Ti layer in cases where a Ti layer is formed, by a coating method such as spin coating or the like. For example, this sol is obtained by hydrolyzing an alkoxide (such as a methoxide, ethoxide, propoxide, butoxide or the like) or acetate compound of a metal such as titanium, zirconium, lead, zinc or the like with an acid or the like. A method such as spin coating, dip coating, roll coating, bar coating, flexo printing, offset printing or the like is used to apply the coating.

Next, the solvent is evaporated by drying [the coating film] for a fixed period of time at a fixed temperature. It is desirable that the drying temperature be 150° C. to 200° C., and that the drying time be 5 minutes to 15 minutes.

Following drying, degreasing is performed for a fixed period of time at a specified high temperature in the atmosphere, so that the organic ligands that are coordinated with the metal are thermally decomposed, thus producing a metal oxide. The degreasing time is preferably 300° C. to 500° C., and the degreasing time is preferably 5 minutes to 90 minutes. If the degreasing temperature is set on the high side, numerous minute crystal grains tend to be formed in the precursor film.

A ferroelectric precursor film comprising two layers is laminated by repeating the respective steps of coating, drying and degreasing a specified number of times, e.g., two times. As a result of the drying and degreasing treatments, the metal alkoxide and acetic acid salt in the solution form a network of metal, oxygen and metal via the thermal decomposition of the ligands, thus producing a ferroelectric precursor film 24'.

[3B] Ion Beam Irradiation and Firing Step

Following degreasing, this precursor film 24' is irradiated with an ion beam I' from a specified angle. As a result, the atoms in the precursor film can be placed in a specified arrangement. The principle involved is not completely clear; however, it is inferred that certain metal atoms are knocked out of the precursor film, and certain metal atoms are pushed into the shadows of other metal atoms, as a result of irradiation with an ion beam from a specified angle, so that the metal atoms are arranged in a specified arrangement.

The concrete method used for ion beam irradiation is as follows:

First, the substrate 11 on which a precursor film has been formed on the bottom electrode 13 is mounted in a substrate holder, and is placed inside a vacuum apparatus. For example, this vacuum apparatus is equipped with a Kauffman ion source or the like, and is arranged so that irradiation with an ion beam can be performed in a specified position inside the vacuum apparatus.

Furthermore, there are no particular restrictions on the ion beam used; for instance, at least one species of ions selected from ions of inert gases such as argon, helium, neon, xenon or krypton, or mixed ions comprising such ions and oxygen ions, may be cited as examples of ions that can be used.

Furthermore, there are no particular restrictions on the irradiation angle of the ion beam I with respect to the normal direction of the surface of the bottom electrode 13 (i.e., the abovementioned specified angle); however, it is desirable to set this angle at approximately 35 to 65°. In particular, it is even more desirable to set this angle at approximately 42 to 47° or at approximately 52 to 57°. If the ion beam I is set at such an irradiation angle and directed onto the surface of the bottom electrode 13, a ferroelectric film 24 which has a tetragonal crystal (001) orientation and which is oriented in an in-plane orientation can be formed.

It is desirable that the ion beam acceleration voltage be set at approximately 100 to 300 V, and it is even more desirable to set this acceleration voltage at approximately 150 to 250 V.

Furthermore, it is desirable that the irradiation dose of the ion beam be set at approximately 1 to 30 mA, and it is even more desirable to set this irradiation dose at approximately 5 to 15 mA.

It is desirable that the temperature of the substrate 11 be set at approximately 0 to 100° C., and it is even more desirable to set this temperature at approximately 30 to 70° C.

It is desirable that the pressure inside the vacuum apparatus be set at $133 \times 10^{-1}$ Pa ($1 \times 10^{-1}$ Torr) or less, and it is even more desirable to set this pressure at $133 \times 10^{-3}$ Pa ($1 \times 10^{-3}$ Torr) or less. In this case, furthermore, it is desirable that the mixture ratio of inert gas to oxygen in the atmosphere inside the vacuum apparatus be set in the range of approximately 300:1 to 10:1 (volume ratio), and it is even more desirable to set this ratio in the range of approximately 150:1 to 50:1.

In this case, furthermore, the ion beam irradiation time varies according to the abovementioned conditions; ordinarily, however, it is desirable to set this time at approximately 20 to 200 seconds, and it is even more desirable to set this time at approximately 50 to 100 seconds.

After the precursor film has been irradiated with an ion beam, this precursor film is fired and crystallized. As a result of this firing, the precursor film is transformed from an amorphous state into a perovskite type crystal structure, thus producing a ferroelectric film 24.

It is desirable that the firing temperature be 600° C. to 800° C. By setting the firing temperature at a temperature of 600° C. or greater, it is possible to obtain a piezoelectric film that is superior in terms of piezoelectric characteristics. Meanwhile, by setting this temperature at 800° C. or less, it is possible to suppress diffusion of the lead, and to prevent unnecessary oxidation of the bottom electrode. An RTA (rapid thermal annealing) apparatus, diffusion furnace or the like is used for this firing.

The firing of the precursor film may also be performed during the abovementioned ion beam irradiation. In this case, ion beam irradiation and firing can be caused to proceed simultaneously by setting the substrate temperature at 600° C. to 800° C. in the vacuum apparatus in which the abovementioned ion beam irradiation is performed.

In cases where the ferroelectric film 24 is to be formed as a thick film, the abovementioned process from the formation of the precursor film to firing is repeated a multiple number of times. In this case, furthermore, ion beam irradiation may be performed following degreasing in each of the abovementioned plurality of processes, or ion beam irradiation may be performed only in the initial process among the above-mentioned plurality of processes. By performing ion beam irradiation following degreasing in the initial process, it is possible to obtain the desired orientation in the initial layer of the ferroelectric film; since the layers of the ferroelectric film that are formed on top of this initial layer undergo crystal growth while being affected by the underlayers, the desired orientation can be obtained in the ferroelectric film 24 as a whole.

If such a method for forming the ferroelectric film 24 is used, the arranged orientation can be adjusted to any desired direction by the simple method of adjusting the irradiation angle of the ion beam. Furthermore, since the orientation of the ferroelectric film can thus be arranged with good precision, the following advantage is also obtained: namely, the mean thickness of the ferroelectric film 24 can be made smaller.

The ferroelectric film 24 is obtained as described above.

[4B] Bottom Electrode Lead-Out Step

This step can be performed in the same manner as the abovementioned step [4A].

[5B] Top Electrode Formation Step

This step can be performed in the same manner as the abovementioned step [5A].

The capacitor 200 according to a second embodiment [of the present invention] is manufactured by the abovementioned steps [1B] through [5B].

<5. Ferroelectric Device Construction (3)>

Next, a capacitor which is a ferroelectric device constituting a third embodiment [of the present invention] will be described. The capacitor 200 of this third embodiment has a construction similar to that of the first embodiment shown in FIG. 1. In particular, in the present embodiment, the bottom electrode 13 is formed with an in-plane orientation by means of an ion beam assist method.

<5-1. Bottom Electrode>

In regard to the composition of this bottom electrode 13, it is desirable that the electrode be constructed from a metal material such as Pt, Ir, Ti, Rh, Ru or the like. A plurality of layers of such metal materials may also be formed. For example, the bottom electrode [may be] constructed with a layer structure of Ti with a thickness of 20 nm/Ir with a thickness of 20 nm/Pt with a thickness of 140 nm. These metal materials are suitable for the formation of an in-plane oriented film by the ion beam assist method, and also have a good conductivity.

Furthermore, the composition of the bottom electrode 13 may include metal oxides that have a perovskite structure. In this case, the composition of the electrode preferably includes metal oxides with a perovskite structure as the main materials.

Examples of metal oxides that have a perovskite structure include any of the compounds $M_2RuO_4$ (M=Ca, Sr, Ba), $RE_2NiO_4$ (RE=La, Ce, Pr, Nd, Pm, Sm, Eu, Gd, Tb, Dy, Ho, Er, Tm, Yb, Lu, Y), $REBa_2Cu_3O_x$ (RE=La, Ce, Pr, Nd, Pm, Sm, Eu, Gd, Tb, Dy, Ho, Er, Tm, Yb, Lu, Y), $MRuO_3$ (M=Ca, Sr, Ba), $(RE,M)CrO_3$ (RE=La, Ce, Pr, Nd, Pm, Sm, Eu, Gd, Tb, Dy, Ho, Er, Tm, Yb, Lu, Y; M=Ca, Sr, Ba), $(RE,M)MnO_3$ (RE=La, Ce, Pr, Nd, Pm, Sm, Eu, Gd, Tb, Dy, Ho, Er, Tm, Yb, Lu, Y; M=Ca, Sr, Ba), $(RE,M)CoO_3$ (RE=La, Ce, Pr, Nd, Pm, Sm, Eu, Gd, Tb, Dy, Ho, Er, Tm, Yb, Lu, Y; M=Ca, Sr, Ba), RENiO$_3$ (RE=La, Ce, Pr, Nd, Pm, Sm, Eu, Gd, Tb, Dy, Ho, Er, Tm, Yb, Lu, Y) and solid solutions containing these compounds or the like. In particular, CaRuO$_3$, SrRuO$_3$, BaRuO$_3$, SrVO$_3$, (La,Sr)MnO$_3$, (La,Sr)CrO$_3$, (La,Sr)CoO$_3$, LaNiO$_x$, REBa$_2$Cu$_3$O$_x$ (RE=La, Ce, Pr, Nd, Pm, Sm, Eu, Gd, Tb, Dy, Ho, Er, Tm, Yb, Lu, Y) or solid solutions containing these compounds are especially desirable, and it is desirable to select at least one substance from a set comprising SrRuO$_3$, LaNiO$_x$, REBa$_2$Cu$_3$O$_x$ (RE=La, Ce, Pr, Nd, Pm, Sm, Eu, Gd, Tb, Dy, Ho, Er, Tm, Yb, Lu, Y), and solid solutions containing these compounds, as a substance which is suitable for the formation of an in-plane oriented film by the ion beam assist method, and which has favorable characteristics. Such metal oxides that have a perovskite structure are superior in terms of conductivity and chemical stability. Accordingly, the bottom electrode 13 can also be formed as an electrode that is superior in terms of conductivity and chemical stability.

The bottom electrode 13 with a perovskite structure may have any of the following crystal orientations: e.g., a cubic crystal (100) [orientation], tetragonal crystal (001) [orientation], rhombohedral crystal (100) [orientation], quasi-cubic crystal (100) orientation, quasi-cubic crystal (110) orientation, quasi-cubic crystal (111) orientation or the like. Among these, however, an electrode with a quasi-cubic crystal (100) orientation or quasi-cubic crystal (110) orientation is especially desirable.

Furthermore, there are no particular restrictions on the mean thickness of the bottom electrode 13; however, it is desirable to set this mean thickness at approximately 10 to 300 nm, and a mean thickness of approximately 50 to 150 nm is even more desirable. As a result, the bottom electrode 13 can exhibit a sufficient function as an electrode, and an increase in the size of the ferroelectric device can also be prevented.

<5-2. Ferroelectric Film>

A ferroelectric film 24 is formed on top of this bottom electrode 13. Since the bottom electrode 13 has an in-plane orientation as described above, the ferroelectric film 24 has a uniformly arranged orientation as a result of this ferroelectric film 24 being formed on top of this bottom electrode 13. In particular, it is desirable that the ferroelectric film 24 be formed on top of the bottom electrode by epitaxial growth.

As a result, the capacitor 200 shows (for example) an increase in the residual polarity, a decrease in the counter electric field and the like. In other words, various characteristics of the capacitor 200 are improved. Accordingly, in cases where a ferroelectric memory is manufactured using such a capacitor 200, this ferroelectric memory can be formed as a memory that is superior in terms of the angularity of the hysteresis curve.

The ferroelectric film 24 can be constructed from various types of ferroelectric materials. However, it is desirable that this film contain ferroelectric materials that have a perovskite structure, and a ferroelectric film in which ferroelectric materials that have a perovskite structure are the main materials is even more desirable. Furthermore, such ferroelectric materials that have a perovskite structure may be any of the following materials: i.e., materials that are epitaxially grown with a tetragonal (001) orientation, materials that are epitaxially grown with a rhombohedral crystal (100) orientation, materials that are epitaxially grown with a cubic crystal (100) orientation, or materials that are epitaxially grown with a quasi-cubic crystal (100) orientation. In particular, materials that are epitaxially grown with a tetragonal crystal (001) orientation are especially desirable. As a result, the abovementioned effect is improved.

Examples of ferroelectric materials which have such a perovskite structure include metal oxides with a perovskite structure such as Pb(Zr,Ti)O$_3$ (PZT), (Pb,La)(Zr,Ti)O$_3$ (PLZT), (Ba,Sr)TiO$_3$ (BST), BaTiO$_3$, KNbO$_3$, Pb(Zn,Nb)O$_3$ (PZN), Pb(Mg,Nb)O$_3$ (PMN), PbFeO$_3$ and PbWO$_3$, Bi layer-form compounds such as SrBi$_2$(Ta,Nb)$_2$O$_9$ and (Bi,La)$_4$Ti$_3$O$_{12}$, and solid solutions that contain such compounds (PMN-PT, PZN-PT and the like). Among these materials, PZT, BST, and relaxer materials such as PMN-PT, PZN-PT or the like are especially desirable. Furthermore, it is desirable that this film contain a solid solution of PMN$_y$-PZT$_{1-y}$ consisting of a relaxer material PMN comprising any of the compounds Pb(M$_{1/3}$N$_{2/3}$)O$_3$ (M=Mg, Zn, Co, Ni, Mn; N=Nb, Ta), Pb(M$_{1/2}$N$_{1/2}$)O$_3$ (M=Sc, Fe, In, Yb, Ho, Lu; N=Nb, Ta), Pb(M$_{1/2}$N$_{1/2}$)O$_3$ (M=Mg, Cd, Mn, Co; N=W, Re) or Pb(M$_{2/3}$N$_{1/3}$)O$_3$ (M=Mn, Fe; N=W, Re) or mixed phases of these compounds, and Pb(Zr$_x$Ti$_{1-x}$)O$_3$ (PZT, $0.0 \leq x \leq 1.0$). As a result, the capacitor 200 is superior in terms of various characteristics.

Furthermore, in cases where the bottom electrode 13 is an electrode which contains metal oxides that have a perovskite structure (especially an electrode which contains metal oxides that have a perovskite structure as the main materials [of the electrode]), the metal oxides that have such a perovskite structure show little lattice mismatching with ferroelectric materials that have a perovskite structure. Accordingly, the ferroelectric film 24 can be easily and reliably grown with a tetragonal crystal (001) orientation (by epitaxial growth) on top of the bottom electrode 13. Furthermore, the ferroelectric film 24 thus obtained shows improved bonding characteristics with the bottom electrode 13.

Furthermore, there are no particular restrictions on the mean thickness of the ferroelectric film 24; however, a mean thickness of approximately 50 to 300 nm is desirable, and a mean thickness of approximately 100 to 200 nm is even more desirable. By setting the mean thickness of the ferroelectric film 24 in the abovementioned range, it is possible to form a capacitor that can exhibit various characteristics in a favorable manner while preventing an increase in the size of the capacitor 200.

<6. Ferroelectric Device Manufacturing Method (3)>

Figure 4:
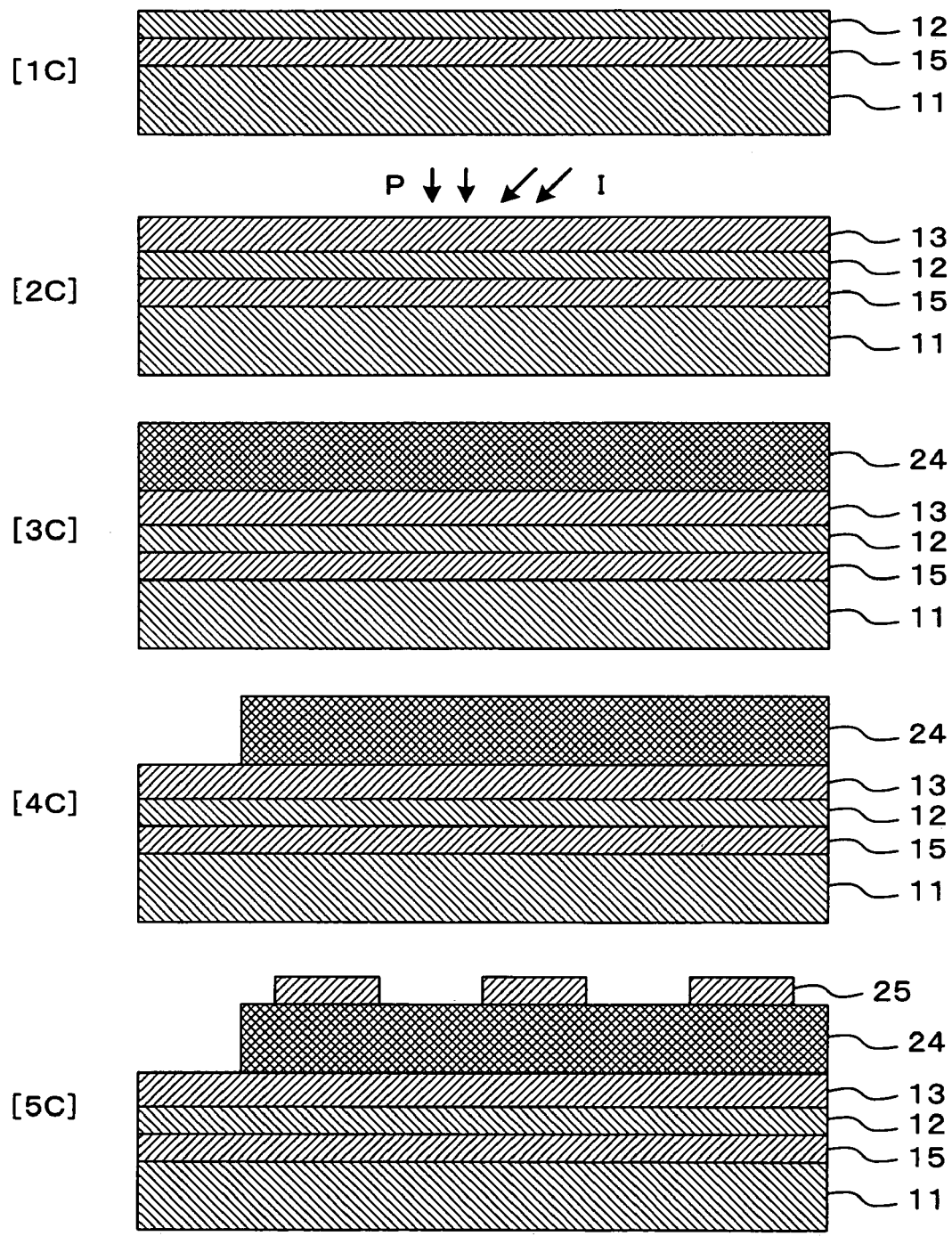
FIG. 4 is a diagram which is used to illustrate the ferroelectric-device manufacturing method of a third embodiment of the present invention.

Next, a manufacturing method for such a capacitor 200 according to a third embodiment [of the present invention] will be described with reference to FIG. 4.

[1C] Buffer Layer Formation Step

This step can be performed in the same manner as the abovementioned step [1A].

[2C] Bottom Electrode Formation Step

Next, a bottom electrode 13 is formed on top of the insulating layer 15 or on top of the buffer layer 12 of the substrate 11. For example, this bottom electrode 13 can be formed as follows:

First, the substrate 11 on which an insulating film 15 (or if necessary a buffer layer 12) has been formed is mounted in a substrate holder and placed inside a vacuum apparatus. A first target containing the constituent elements of the bottom electrode 13 as described above (bottom electrode target) is disposed facing the insulating layer 15 of the substrate 11 in a position that is separated from the substrate 11 by a specified distance inside the vacuum apparatus. Furthermore, a target with a composition that is the same as or similar to the composition of the desired bottom electrode 13 is used as the first target.

Next, when the first target is irradiated with (for example) laser light, atoms including the various types of metal atoms that constitute the bottom electrode (and oxygen atoms in applicable cases) are knocked out of the first target so that a plume P is generated. In other words, this plume P is directed toward the insulating layer 15 or buffer layer 12. Then, this plume P contacts the surface (upper surface) of the insulating layer 15 or buffer layer 12.

Furthermore, at substantially the same time, the surface of the insulating layer 15 is irradiated with an ion beam I that is inclined at a specified angle. As a result, a layer of the bottom electrode 13 that has an in-plane orientation is formed on top of the insulating layer 15.

Furthermore, besides a method in which the surface of the target is irradiated with laser light, a method in which an argon gas (inert gas) plasma, electron beam or the like is caused to be incident on the surface of the target can also be employed as the method that is used to knock the abovementioned atoms out of the target.

Among these methods, a method in which the surface of the target is irradiated with laser light is especially desirable as the method used to knock the abovementioned atoms out of the target. If such a method is used, the atoms can be knocked out of the target easily and reliably using a vacuum apparatus with a simple construction that is equipped with a laser light entry window.

Furthermore, this laser light is preferably pulsed light with a wavelength of approximately 150 to 300 nm and a pulse width of approximately 1 to 100 ns. In concrete terms, examples of laser light that can be used include excimer lasers such as ArF excimer lasers, KrF excimer lasers and XeCl excimer lasers, as well as YAG lasers, $YVO_4$ lasers, $CO_2$ lasers and the like. Among these types of laser light, ArF excimer lasers or KrF excimer lasers are especially desirable as the laser light used. Both ArF excimer lasers and KrF excimer lasers are easy to handle, and can knock atoms out of the target with greater efficiency.

Furthermore, in regard to the respective conditions used in the formation of the bottom electrode 13, it is sufficient if these conditions are such that the respective types of metal atoms can reach the surface of the insulating layer 15 at a specified ratio (e.g., composition ratio of metal oxides that have a perovskite structure), and the bottom electrode 13 has an in-plane orientation. For example, the following conditions may be used.

It is desirable to set the frequency of the laser light at 30 Hz or less, and it is even more desirable to set this frequency at 15 Hz or less.

It is desirable that the energy density of the laser light be set at 0.5 $J/cm^2$ or greater, and it is even more desirable to set this energy density at 2 $J/cm^2$ or greater.

It is desirable that the temperature of the substrate 11 be set at approximately 0 to 100° C., and it is even more desirable to set this temperature at approximately 30 to 70° C.

It is desirable that the distance between the substrate 11 and the target be set at approximately 30 to 100 mm, and it is even more desirable to set this distance at approximately 50 to 80 mm.

Furthermore, it is desirable that the pressure inside the vacuum apparatus be set at $133 \times 10^{-1}$ Pa ($1 \times 10^{-1}$ Torr) or less, and it is even more desirable to set this pressure at $133 \times 10^{-3}$ Pa ($1 \times 10^{-3}$ Torr) or less. In this case, furthermore, it is desirable that the mixture ratio of inert gas to oxygen in the atmosphere inside the vacuum apparatus be set in the range of approximately 300:1 to 10:1 (volume ratio), and it is even more desirable to set this ratio in the range of approximately 150:1 to 50:1.

If the respective conditions used in the formation of the bottom electrode 13 are set in the abovementioned ranges, the bottom electrode 13 can be formed with good efficiency.

In this case, furthermore, the mean thickness of the bottom electrode 13 can be adjusted to the range described above by appropriately setting the laser light irradiation time. This laser light irradiation time varies according to the abovementioned conditions; ordinarily, however, it is desirable to set this time at approximately 3 to 90 minutes, and it is even more desirable to set this time at approximately 15 to 45 minutes.

Meanwhile, there are no particular restrictions on the ion beam that irradiates the surface of the insulating layer 15 or the buffer layer 12; for instance, at least one species of ions selected from ions of inert gases such as argon, helium, neon, xenon or krypton, or mixed ions comprising such ions and oxygen ions, may be cited as examples of ions that can be used.

For example, it is desirable to use a Kauffman ion source or the like as the ion source of this ion beam. An ion beam can be generated relatively easily by using this ion source.

Furthermore, there are no particular restrictions on the irradiation angle of the ion beam I with respect to the normal direction of the surface of the insulating layer 15 (i.e., the abovementioned specified angle); however, it is desirable to set this angle at approximately 35 to 65°. In particular, it is even more desirable to set this angle at approximately 52 to 57°. If the ion beam I is set at such an irradiation angle and directed onto the surface of the insulating layer 15 or buffer layer 12, a bottom electrode 13 which is oriented in an in-plane orientation can be formed.

It is desirable that the ion beam acceleration voltage be set at approximately 100 to 300 V, and it is even more desirable to set this acceleration voltage at approximately 150 to 250 V.

Furthermore, it is desirable that the irradiation dose of the ion beam be set at approximately 1 to 30 mA, and it is even more desirable to set this irradiation dose at approximately 5 to 15 mA.

The bottom electrode 13 is obtained as described above (see FIG. 4).

[3C] Ferroelectric Film Formation Step

Next, a ferroelectric film 24 is formed on top of the bottom electrode 13. For example, this can be accomplished as described below.

Furthermore, prior to the formation of the ferroelectric film 24, a second target (ferroelectric film target) containing the constituent elements of the ferroelectric film 24 as described above is installed facing the substrate 11 in a position that is separated from the substrate 11 by a specified distance, instead of the abovementioned first target (bottom electrode target). Furthermore, a target which has a composition that is the same as or similar to the composition of the desired ferroelectric film 24 may be appropriately used as the second target.

Following the abovementioned step [2C], a plume of atoms including oxygen atoms and various types of metal atoms is directed onto the bottom electrode 13. Furthermore, as a result of the contact of this plume with the surface (upper surface) of the bottom electrode 13, a ferroelectric film 24 containing ferroelectric materials that have a perovskite structure (as described above) is formed in the form of a film with (for example) a tetragonal crystal (001) orientation by epitaxial growth.

It is desirable that this plume be generated by irradiating the surface of the abovementioned second target with laser light in the same manner as in the above-mentioned step [2C] so that atoms including oxygen atoms and various types of metal atoms are knocked out of the second target.

As in the case of the abovementioned step [2C], an ArF excimer laser or KrF excimer laser is appropriate as the abovementioned laser light.

If necessary, furthermore, as in the abovementioned step [2C], the ferroelectric film 24 may be formed while irradiating the surface of the bottom electrode 13 with an ion beam. As a result, the ferroelectric film 24 can be formed more efficiently.

Furthermore, in regard to the respective conditions used in the formation of the ferroelectric film 24, it is sufficient if these conditions are such that the respective types of metal atoms can reach the surface of the bottom electrode 13 at a specified ratio (e.g., composition ratio of metal oxides that have a perovskite structure), and a ferroelectric film 24 can be formed. For example, the following conditions may be used.

It is desirable to set the frequency of the laser light at 30 Hz or less, and it is even more desirable to set this frequency at 15 Hz or less.

It is desirable that the energy density of the laser light be set at 0.5 J/cm$^2$ or greater, and it is even more desirable to set this energy density at 2 J/cm$^2$ or greater.

It is desirable that the temperature of the substrate 11 on which a bottom electrode 13 has been formed be set at approximately 300 to 800° C., and it is even more desirable to set this temperature at approximately 400 to 700° C.

Furthermore, in cases where ion beam irradiation is also used, it is desirable that this temperature be set at approximately 0 to 100° C., and it is even more desirable to set this temperature at approximately 30 to 70° C.

It is desirable that the distance between the substrate 11 on which a bottom electrode 13 has been formed and the second target be set at [approximately] 30 to 100 mm, and it is even more desirable to set this distance at approximately 50 to 80 mm.

Furthermore, it is desirable that the pressure inside the vacuum apparatus be 1 atmosphere or less; in particular, it is desirable to set the oxygen partial pressure at $133\times10^{-3}$ Pa ($1\times10^{-3}$ Torr) or greater when oxygen gas is supplied, and to set this pressure at $133\times10^{-5}$ Pa ($1\times10^{-5}$ Torr) or greater when atomic-form oxygen radicals are supplied.

Furthermore, in cases where ion beam irradiation is used in combination, it is desirable to set the pressure inside the vacuum apparatus at $133\times10^{-1}$ Pa ($1\times10^{-1}$ Torr) or less, and it is even more desirable to set this pressure at $133\times10^{-3}$ Pa ($1\times10^{-3}$ Torr) or less. In this case, furthermore, it is desirable that the mixture ratio of inert gas to oxygen in the atmosphere inside the vacuum apparatus be set in the range of approximately 300:1 to 10:1 (volume ratio), and it is even more desirable to set this ratio in the range of approximately 150:1 to 50:1.

If the respective conditions used in the formation of the ferroelectric film 24 are set in the abovementioned ranges, the ferroelectric film 24 can be formed with good efficiency.

In this case, furthermore, the mean thickness of the ferroelectric film 24 can be adjusted to the above-mentioned range by appropriately setting the laser light irradiation time. This laser light irradiation time varies according to the abovementioned conditions; ordinarily, however, it is desirable to set this time at approximately 3 to 90 minutes, and it is even more desirable to set this time at approximately 15 to 45 minutes.

The ferroelectric film 24 is obtained as described above.

Furthermore, [the method used] is not limited to the abovementioned method; the ferroelectric film 24 may also be formed by epitaxial growth using a method such as a CVD method, laser ablation [method] or the like.

[4C] Bottom Electrode Lead-Out Step

This step can be performed in the same manner as the abovementioned step [4A].

[5C] Top Electrode Formation Step

This step can be performed in the same manner as the abovementioned step [5A].

The capacitor 200 according to a third embodiment [of the present invention] is manufactured by the abovementioned steps [1C] through [5C].

<7. Ferroelectric Device Construction (4)>

Next a capacitor which is a ferroelectric device constituting a fourth embodiment [of the present invention] will be described. The capacitor 200 according to this fourth embodiment has a construction similar to that of the first embodiment shown in FIG. 1. In particular, in the present embodiment, a second layer of the intermediate film (which is the portion of the intermediate film located on the bottom electrode side) is formed by an ion beam assist method.

<7-1. Substrate>

The substrate 11 has the function of supporting the buffer layer 12, bottom electrode 13 and the like, and is constructed from a member that has a flat-plate-form shape. An insulating layer 15 which is in an amorphous state is formed on the surface (upper side in FIG. 1) of this substrate 11. The insulating layer 15 may be formed as an integral part of the substrate 11, or may be fastened to the substrate 11.

For example, an Si substrate, SOI (Si on insulator) or the like can be used as the substrate 11. In this case, a substrate whose surface is covered by an $SiO_2$ film that is a natural oxidation film or thermal oxidation film can be used. Specifically, in such a case, this natural oxidation film or thermal oxidation film forms the insulating layer 15.

Furthermore, besides $SiO_2$, the insulating layer 15 may also be formed using various types of metal materials or the like such as silicon nitride, silicon nitride oxide, zirconium oxide or the like. For example, a two-layer structure comprising 1000 nm of $SiO_2$ and 400 nm of $ZrO_2$ may be used.

For example, such an insulating layer 15 is formed by a chemical vapor deposition method (CVD) such as thermal CVD, plasma CVD, laser CVD or the like, a physical vapor deposition method (PVD) such as vacuum evaporation, sputtering, ion plating or the like, or by sputtering reflow, thermal oxidation of the surface of the Si substrate or the like.

Furthermore, the substrate 11 itself may also be formed by an amorphous substance so that this substrate has insulating properties. In such cases, a substrate constructed from various types of glass materials or various types of resin materials, e.g., polyolefins such as polyethylenes, polypropylenes, ethylene-propylene copolymers, ethylene-vinyl acetate copolymers (EVA) or the like, ring-form polyolefins, modified polyolefins, polyvinyl chlorides, polyvinylidene chlorides, polystyrenes, polyamides, polyimides, polyamidoimides, polycarbonates, poly-(4-methylpentene-1)s, ionomers, acrylic resins, polymethyl methacrylates, acrylonitrile-butadiene-styrene copolymers (ABS resins), acrylonitrile-styrene copolymers (AS resins), butadiene-styrene copolymers, polyoxymethylenes, polyvinyl alcohols (PVA), ethylene-vinyl alcohol copolymers (EVOH), polyester such as polyethylene terephthalates (PET), polybutylene terephthalates (PBT), polycyclohexane terephthalates (PCT) or the like, polyethers, polyether ketones (PEK), polyether ether ketones (PEEK), polyether imides, polyacetals (POM), polyphenylene oxides, modified polyphenylene oxides, polysulfones, polyether sulfones, polyphenylene sulfides, polyallylates, aromatic polyesters (liquid crystal polymers), polytetrafluoroethylenes, polyvinylidene fluorides and other fluororesins, various types of thermoplastic elastomers such as styrene type, polyolefin type, polyvinyl chloride type, polyurethane type, polyester type, polyamide type, polybutadiene type, transpolyisoprene type, fluoro-rubber type, chlorinated polyethylene type elastomers and the like, epoxy resins, phenol resins, urea resins, melamine resins, unsaturated polyesters, silicone resins, polyurethanes and the like, or copolymers, blends, polymer alloys or the like consisting mainly of these polymers, may be used.

Such Si substrates, SOI substrates, various types of resin substrates, various types of glass substrates and the like are all commonly used substrates. Accordingly, the manufacturing cost of the ferroelectric device can be reduced by using such substrates as the substrate 11.

There are no particular restrictions on the mean thickness of the substrate 11; however, it is desirable that this mean thickness be approximately 10 μm to 1 mm, and a mean thickness of approximately 100 to 600 μm is even more desirable. By setting the mean thickness of the substrate 11 within the abovementioned range, it is possible to make the ferroelectric device thinner (i.e., to reduce the size of the ferroelectric device) while ensuring a sufficient strength.

<7-2. Buffer Layer>

A buffer layer 12 comprising a thin film is formed on top of the insulating layer 15 by an ion beam assist method so that this buffer layer 12 is oriented in an in-plane orientation.

By installing such a buffer layer 12, it is possible to obtain superior adhesion (bonding) between the insulating layer 15 and the bottom electrode 13.

For example, it is desirable that the composition of such a buffer layer contain a compound with a fluorite structure such as $RE_x(Zr_{1-y}Ce_y)_{1-x}O_{2-0.5x}$ ($0.0 \leq x \leq 1.0$, $0.0 \leq y \leq 1.0$; RE=La, Ce, Pr, Nd, Pm, Sm, Eu, Gd, Tb, Dy, Ho, Er, Tm, Yb, Lu, Y) (or a solid solution of such compounds), or a compound with a pyrochlore structure such as $RE_2(Zr_{1-y}Ce_y)_2O_7$ ($0.0 \leq y \leq 1.0$; RE=La, Ce, Pr, Nd, Pm, Sm, Eu, Gd, Tb, Dy, Ho, Er, Tm, Yb, Lu, Y) (or a solid solution of such compounds), and that this composition have a cubic crystal (100) orientation. In particular, yttria-stabilized zirconia, $CeO_2$ or $ZrO_2$ is especially suitable. Furthermore, compounds with a fluorite structure such $ThO_2$, $UO_2$, $HfO_2$ or the like, c-type rare earth oxides such as $Y_2O_3$ or the like, materials with a high Young's modulus and high rigidity such as $Si_3N_4$, SiC, diamond, alumina or the like, transition metal oxides such as $Ta_2O_5$, $Cr_2O_3$, $Nb_2O_5$ or the like, insulating compound oxides such as $LiTaO_3$, $MgAl_2O_4$ or the like, conductive compound oxides such as $LaCoO_3$, $LaSrCuO_4$, $LaCaMnO_3$ or the like, or compounds with an NaCl structure such as MgO, CaO, SrO, BaO, MnO, FeO, CoO, NiO or the like, are desirable.

In regard to compounds with a fluorite structure, $CeO_2$, $ZrO_2$, $HfO_2$ and solid solutions of these compounds especially desirable as materials that are suitable for the formation of an in-plane oriented film by the ion beam assist method. Such metal oxides with a fluorite structure show especially little lattice mismatching with metal oxides that have a perovskite structure.

In regard to compounds with an NaCl structure, MgO, CaO, SrO, BaO, NiO and solid solutions of these compounds are especially desirable as materials that are suitable for the formation of an in-plane oriented film by the ion beam assist method. Such metal oxides with an NaCl structure show especially little lattice mismatching with metal oxides that have a perovskite structure.

The buffer layer 12 may have any of the following orientations: e.g., a cubic crystal (100) orientation, a cubic crystal (110) orientation, a cubic crystal (111) orientation or the like. Among these orientations, however, a cubic crystal (100) orientation is especially desirable. By setting the orientation of the buffer layer 12 as a cubic crystal (100) orientation, it is possible to set the mean thickness of the buffer layer 12 at a relatively small value. Accordingly, even in cases where the buffer layer 12 is constructed from a metal oxide with an NaCl structure which shows deliquescence such as MgO, CaO, SrO or BaO, the problem of deterioration caused by moisture in the air during manufacture or during use can be appropriately prevented, so that a ferroelectric device suitable for practical use can be obtained.

From such a standpoint, it is desirable to form the buffer layer 12 with as small a thickness as possible. In concrete terms, it is desirable that the mean thickness be 10 nm or less, and a mean thickness of 5 nm or less is even more desirable. As a result, the abovementioned effect is improved.

Furthermore, if the mean thickness of the buffer layer 12 is thus set at a small value, the following advantage is also obtained: e.g., in cases where a ferroelectric memory is manufactured, thin capacitors (e.g., with a thickness on the order of 10 nm) that are required as the design rule of this ferroelectric memory becomes finer can be manufactured.

<7-3. Bottom Electrode>

A bottom electrode 13 is formed on top of the buffer layer 12. Since the orientation of the buffer layer 12 is uniformly arranged as described above, the bottom electrode 13 also has a uniform orientation as a result of being formed on top of this buffer layer 12. In particular, it is desirable that the bottom electrode 13 be formed by epitaxial growth on top of the buffer layer 12. As a result of the formation of such a bottom electrode 13, various characteristics of the ferroelectric device are improved.

In regard to the composition of this bottom electrode 13, it is desirable that the electrode be constructed from a metal material such as Pt, Ir, Ti, Rh, Ru or the like. A plurality of layers of such metal materials may also be formed. For example, the bottom electrode [may be] constructed with a layer structure of Ti with a thickness of 20 nm/It with a thickness of 20 nm/Pt with a thickness of 140 nm.

Furthermore, the composition of the bottom electrode 13 may include metal oxides that have a perovskite structure. In this case, the composition of the electrode preferably includes metal oxides with a perovskite structure as the main materials.

For example, it is desirable that the composition of the bottom electrode 13 contain the compounds $M_2RuO_4$ (M=Ca, Sr, Ba), $RE_2NiO_4$ (RE=La, Ce, Pr, Nd, Pm, Sm, Eu, Gd, Tb, Dy, Ho, Er, Tm, Yb, Lu, Y), $REBa_2Cu_3O_x$ (RE=La, Ce, Pr, Nd, Pm, Sm, Eu, Gd, Tb, Dy, Ho, Er, Tm, Yb, Lu, Y), $MRuO_3$ (M=Ca, Sr, Ba), $(RE,M)CrO_3$ (RE=La, Ce, Pr, Nd, Pm, Sm, Eu, Gd, Tb, Dy, Ho, Er, Tm, Yb, Lu, Y; M=Ca, Sr, Ba), (RE,M)MnO$_3$ (RE=La, Ce, Pr, Nd, Pm, Sm, Eu, Gd, Tb, Dy, Ho, Er, Tm, Yb, Lu, Y; M=Ca, Sr, Ba), (RE,M)CoO$_3$ (RE=La, Ce, Pr, Nd, Pm, Sm, Eu, Gd, Tb, Dy, Ho, Er, Tm, Yb, Lu, Y; M=Ca, Sr, Ba), RENiO$_3$ (RE=La, Ce, Pr, Nd, Pm, Sm, Eu, Gd, Tb, Dy, Ho, Er, Tm, Yb, Lu, Y), solid solutions containing these compounds or the like. In particular, CaRuO$_3$, SrRuO$_3$, BaRuO$_3$, SrVO$_3$, (La,Sr)MnO$_3$, (La,Sr)CrO$_3$, (La,Sr)CoO$_3$, LaNiO$_x$, YBa$_2$Cu$_3$O$_x$ or solid solutions containing these compounds are desirable, and it is especially desirable to select at least one substance from a set comprising SrRuO$_3$, LaNiO$_x$, YBa$_2$Cu$_3$O$_x$ and solid solutions containing these compounds. Such metal oxides that have a perovskite structure are superior in terms of conductivity and chemical stability. Accordingly, the bottom electrode 13 can also be formed as an electrode that is superior in terms of conductivity and chemical stability. Furthermore, such a bottom electrode 13 is suitable for the formation of a favorable ferroelectric film on top.

The bottom electrode 13 with a perovskite structure may have any of the following crystal orientations: e.g., a cubic crystal (100) [orientation], tetragonal crystal (001) [orientation], rhombohedral crystal (100) [orientation], quasi-cubic crystal (100) orientation, quasi-cubic crystal (110) orientation, quasi-cubic crystal (111) orientation or the like. Among these, however, an electrode that is epitaxially grown with a quasi-cubic crystal (100) orientation or quasi-cubic crystal (110) orientation is especially desirable.

Furthermore, there are no particular restrictions on the mean thickness of the bottom electrode 13; however, it is desirable to set this mean thickness at approximately 10 to 300 nm, and a mean thickness of approximately 50 to 150 nm is even more desirable. As a result, the bottom electrode 13 can exhibit a sufficient function as an electrode, and an increase in the size of the ferroelectric device can also be prevented.

<7-4. Ferroelectric Film>

A ferroelectric film 24 is formed on top of this bottom electrode 13. Since the bottom electrode 13 has an in-plane orientation as described above, the ferroelectric film 24 has a uniformly arranged orientation as a result of this ferroelectric film 24 being formed on top of this bottom electrode 13. In particular, it is desirable that the ferroelectric film 24 be formed on top of the bottom electrode by epitaxial growth.

As a result, the capacitor 200 shows (for example) an increase in the residual polarity, a decrease in the counter electric field and the like. In other words, various characteristics of the capacitor 200 are improved. Accordingly, in cases where a ferroelectric memory is manufactured using such a capacitor 200, this ferroelectric memory can be formed as a memory that is superior in terms of the angularity of the hysteresis curve.

The ferroelectric film 24 can be constructed from various types of ferroelectric materials. However, it is desirable that this film contain ferroelectric materials that have a perovskite structure, and a ferroelectric film in which ferroelectric materials that have a perovskite structure are the main materials is even more desirable. Furthermore, such ferroelectric materials that have a perovskite structure may be any of the following materials: i.e., materials that are epitaxially grown with a tetragonal (001) orientation, materials that are epitaxially grown with a rhombohedral crystal (100) orientation, materials that are epitaxially grown with a cubic crystal (100) orientation, or materials that are epitaxially grown with a quasi-cubic crystal (100) orientation. In particular, materials that are epitaxially grown with a tetragonal crystal (001) orientation are especially desirable. As a result, the abovementioned effect is improved.

Examples of ferroelectric materials which have such a perovskite structure include metal oxides with a perovskite structure such as Pb(Zr,Ti)O$_3$ (PZT), (Pb,La)(Zr,Ti)O$_3$ (PLZT), (Ba,Sr)TiO$_3$ (BST), BaTiO$_3$, KNbO$_3$, Pb(Zn,Nb)O$_3$ (PZN), Pb(Mg,Nb)O$_3$ (PMN), PbFeO$_3$ and PbWO$_3$, Bi layer-form compounds such as SrBi$_2$(Ta,Nb)$_2$O$_9$ and (Bi,La)$_4$Ti$_3$O$_{12}$, and solid solutions that contain such compounds (PMN-PT, PZN-PT and the like). Among these materials, PZT, BST, and relaxer materials such as PMN-PT, PZN-PT or the like are especially desirable. Furthermore, it is desirable that this film contain a solid solution of PMN$_y$-PZT$_{1-y}$ consisting of a relaxer material PMN comprising any of the compounds Pb(M$_{1/3}$N$_{2/3}$)O$_3$ (M=Mg, Zn, Co, Ni, Mn; N=Nb, Ta), Pb(M$_{1/2}$N$_{1/2}$)O$_3$ (M=Sc, Fe, In, Yb, Ho, Lu; N=Nb, Ta), Pb(M$_{1/2}$N$_{1/2}$)O$_3$ (M=Mg, Cd, Mn, Co; N=W, Re) or Pb(M$_{2/3}$N$_{1/3}$)O$_3$ (M=Mn, Fe; N=W, Re) or mixed phases of these compounds, and Pb(Zr$_x$Ti$_{1-x}$)O$_3$ (PZT, $0.0 \leq x \leq 1.0$). As a result, the capacitor 200 is superior in terms of various characteristics.

Furthermore, in cases where the bottom electrode 13 is an electrode which contains metal oxides that have a perovskite structure (especially an electrode which contains metal oxides that have a perovskite structure as the main materials [of the electrode]), the metal oxides that have such a perovskite structure show little lattice mismatching with ferroelectric materials that have a perovskite structure. Accordingly, the ferroelectric film 24 can be easily and reliably grown with a tetragonal crystal (001) orientation (by epitaxial growth) on top of the bottom electrode 13. Furthermore, the ferroelectric film 24 thus obtained shows improved bonding characteristics with the bottom electrode 13.

Furthermore, there are no particular restrictions on the mean thickness of the ferroelectric film 24; however, a mean thickness of approximately 50 to 300 nm is desirable, and a mean thickness of approximately 100 to 200 nm is even more desirable. By setting the mean thickness of the ferroelectric film 24 in the abovementioned range, it is possible to form a capacitor that can exhibit various characteristics in a favorable manner while preventing an increase in the size of the capacitor 200.

<7-5. Top Electrode>

A comb-form (or band-form) top electrode 25 is formed on top of the ferroelectric film 24.

For example, one material or a combination of two or more materials selected from a set comprising Pt, Ir, Au, Ag, Ru or alloys containing these metals and the like can be used as the constituent material of this top electrode 25.

Furthermore, there are no particular restrictions on the mean thickness of the top electrode 25; however, a mean thickness of approximately 10 to 300 nm is desirable, and a mean thickness of approximately 50 to 150 nm is even more desirable.

<8. Ferroelectric Device Manufacturing Method (4)>

Figure 5:
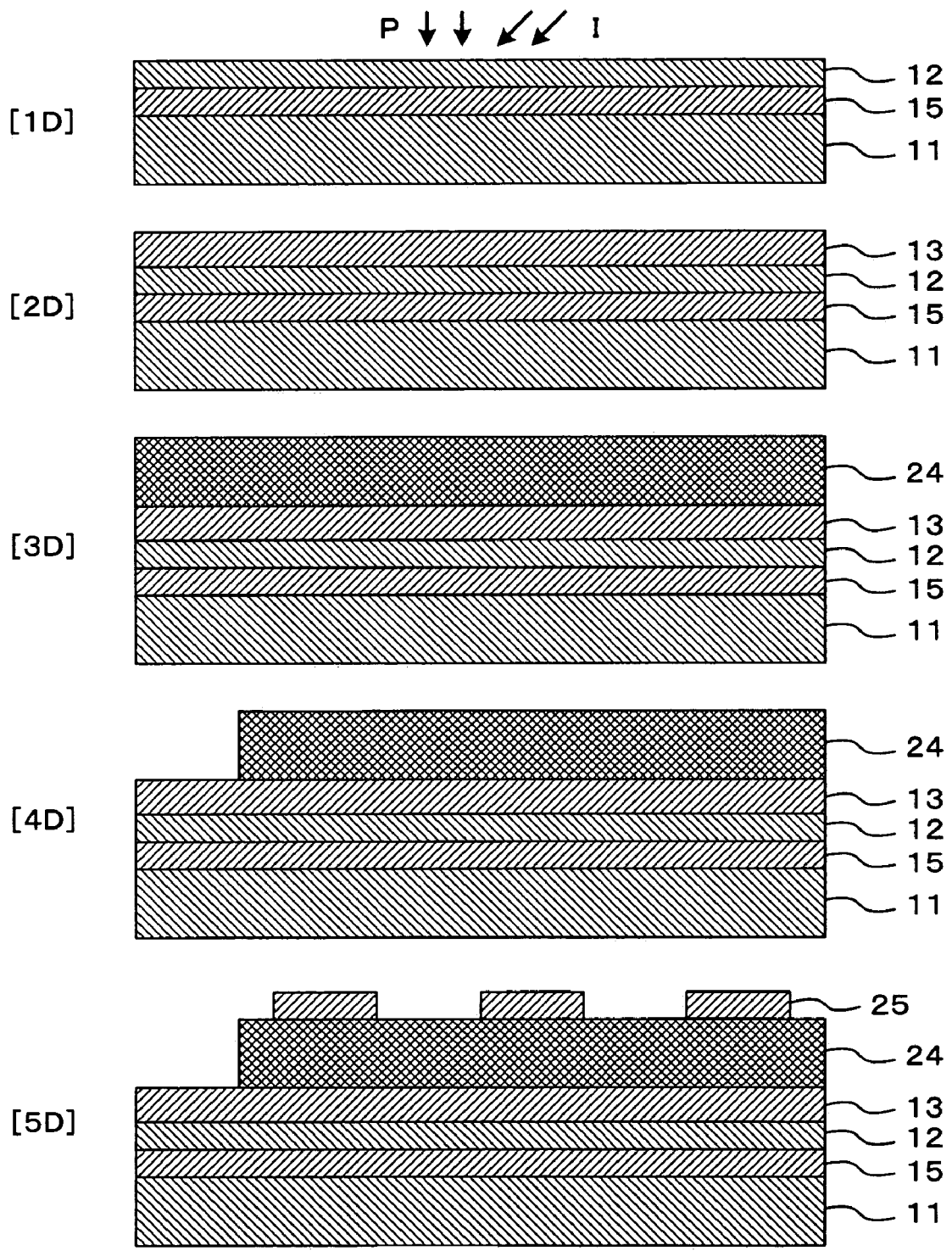
FIG. 5 is a diagram which is used to illustrate the ferroelectric device manufacturing method of a fourth embodiment of the present invention.

Next, a manufacturing method for a capacitor 200 constituting such a ferroelectric device according to a fourth embodiment [of the present invention] will be described with reference to FIG. 5.

The manufacturing method for the capacitor 200 described below comprises a step in which a buffer layer which is an intermediate film is formed on top of the insulating layer 15 (buffer layer formation step), a step in which a bottom electrode 13 is formed on top of the buffer layer 12 (bottom electrode formation step), a step in which a ferroelectric film 24 is formed on top of the bottom electrode (ferroelectric film formation step), a step in which a portion of the ferroelectric film 24 is removed (bottom electrode lead-out step), and a step in which a top electrode 25 is formed on top of the ferroelectric film 24 (top electrode formation step). These respective steps will be described in order below.

First, a substrate 11 which has an insulating layer 15 is prepared. A substrate which has a uniform thickness and which is free of warping or scratches may be appropriately used as this substrate 11. The method used to form the insulating layer 15 is as described above.

[1D] Buffer Layer Formation Step

First, a buffer layer 12 is formed on top of the insulating layer 15 of the substrate 11. For example, this can be accomplished as follows:

First, the substrate 11 is mounted in a substrate holder, and is placed inside a vacuum apparatus.

Furthermore, a first target containing the constituent elements of the buffer layer as described above (buffer layer target) is disposed facing the substrate 11 in a position that is separated from the substrate 11 by a specified distance inside the vacuum apparatus. Furthermore, a target with a composition that is the same as or similar to the composition of the desired buffer layer 12 is used as the first target.

Next, when the first target is irradiated with (for example) laser light, atoms including oxygen atoms and met al atoms are knocked out of the first target so that a plume P is generated. In other words, this plume P is directed toward the insulating layer 15. Then, this plume P contacts the surface of the insulating layer 15 (substrate 11).

Furthermore, at substantially the same time, the surface of the insulating layer 15 is irradiated with an ion beam I that is inclined at a specified angle.

As a result, a buffer layer 12 that has an in-plane orientation is formed on top of the insulating layer 15.

Furthermore, besides a method in which the surface of the first target is irradiated with laser light, a method in which an argon gas (inert gas) plasma, electron beam or the like is caused to be incident on the surface of the first target can also be employed as the method that is used to knock the abovementioned atoms out of the first target.

Among these methods, a method in which the surface of the first target is irradiated with laser light is especially desirable as the method used to knock the abovementioned atoms out of the first target. If such a method is used, the atoms can be knocked out of the first target easily and reliably using a vacuum apparatus with a simple construction that is equipped with a laser light entry window.

Furthermore, this laser light is preferably pulsed light with a wavelength of approximately 150 to 300 nm and a pulse width of approximately 1 to 100 ns. In concrete terms, examples of laser light that can be used include excimer lasers such as ArF excimer lasers, KrF excimer lasers and XeCl excimer lasers, as well as YAG lasers, $YVO_4$ lasers, $CO_2$ lasers and the like. Among these types of laser light, ArF excimer lasers or KrF excimer lasers are especially desirable as the laser light used. Both ArF excimer lasers and KrF excimer lasers are easy to handle, and can knock atoms out of the first target with greater efficiency.

Meanwhile, there are no particular restrictions on the ion beam I that irradiates the surface of the insulating layer 15; for instance, at least one species of ions selected from ions of inert gases such as argon, helium, neon, xenon or krypton, or mixed ions comprising such ions and oxygen ions, may be cited as examples of ions that can be used.

For example, it is desirable to use a Kauffman ion source or the like as the ion source of this ion beam. The ion beam I can be generated relatively easily by using this ion source.

Furthermore, there are no particular restrictions on the irradiation angle of the ion beam I with respect to the normal direction of the surface of the insulating layer 15 (i.e., the abovementioned specified angle); however, it is desirable to set this angle at approximately 35 to 65°. In particular, in cases where a buffer layer 12 comprising metal oxides with an NaCl structure as the main materials is formed, it is even more desirable to set the abovementioned irradiation angle at approximately 42 to 47°, and in cases where a buffer layer 12 comprising metal oxides with a fluorite structure as the main materials is formed, it is even more desirable to set the abovementioned irradiation angle at approximately 52 to 57°. If the ion beam I is set at such an irradiation angle and directed onto the surface of the insulating layer 15, a buffer layer 12 which has a cubic crystal (100) orientation and which is oriented in an in-plane orientation can be formed.

In regard to the respective conditions used in the formation of such a buffer layer 12, it is sufficient if these conditions are such that the buffer layer 12 can be formed with an in-plane orientation; for example, the following conditions may be used.

It is desirable to set the frequency of the laser light at 30 Hz or less, and it is even more desirable to set this frequency at 15 Hz or less.

It is desirable that the energy density of the laser light be set at 0.5 $J/cm^2$ or greater, and it is even more desirable to set this energy density at 2 $J/cm^2$ or greater.

It is desirable that the ion beam acceleration voltage be set at approximately 100 to 300 V, and it is even more desirable to set this acceleration voltage at approximately 150 to 250 V.

Furthermore, it is desirable that the irradiation dose of the ion beam be set at approximately 1 to 30 mA, and it is even more desirable to set this irradiation dose at approximately 5 to 15 mA.

It is desirable that the temperature of the substrate 11 be set at approximately 0 to 100° C., and it is even more desirable to set this temperature at approximately 40 to 70° C.

It is desirable that the distance between the substrate 11 and the first target be set at approximately 30 to 100 mm, and it is even more desirable to set this distance at approximately 50 to 80 mm.

Furthermore, it is desirable that the pressure inside the vacuum apparatus be set at $133 \times 10^{-1}$ Pa ($1 \times 10^{-1}$ Torr) or less, and it is even more desirable to set this pressure at $133 \times 10^{-3}$ Pa ($1 \times 10^{-3}$ Torr) or less.

It is desirable that the mixture ratio of inert gas to oxygen in the atmosphere inside the vacuum apparatus be set in the range of approximately 300:1 to 10:1 (volume ratio), and it is even more desirable to set this ratio in the range of approximately 150:1 to 50:1.

If the respective conditions used in the formation of the buffer layer 12 are set in the abovementioned ranges, the buffer layer 12 can be more efficiently oriented in an in-plane orientation.

In this case, furthermore, the mean thickness of the buffer layer 12 can be adjusted to the range described above by appropriately setting the laser light irradiation time. This laser light irradiation time varies according to the abovementioned conditions; ordinarily, however, it is desirable to set this time at 200 seconds or less, and it is even more desirable to set this time at 100 seconds or less.

If such a method is used to form the buffer layer 12, a uniformly arranged orientation can be adjusted to any desired direction by the simple method of adjusting the irradiation angle of the ion beam. Furthermore, since the orientation of the buffer layer can thus be arranged with good precision, the following advantage is also obtained: namely, the mean thickness of the buffer layer 12 can be reduced to a smaller value.

The buffer layer 12 is obtained as described above (see FIG. 5).

[2D] Bottom Electrode Formation Step

Next, a bottom electrode 13 is formed on top of the buffer layer 12. For example, this bottom electrode 13 can be formed as described below.

Furthermore, prior to the formation of the bottom electrode 13, a second target (bottom electrode target) containing the constituent elements of the bottom electrode 13 as described above is disposed facing the buffer layer 12 (substrate 11) in a position that is separated from the buffer layer 12 by a specified distance, instead of the above-mentioned first target. Furthermore, a target which has a composition that is the same as or similar to the composition of the desired bottom electrode 13 may be appropriately used as the second target.

Following the abovementioned step [1D], a plume of atoms including the various types of metal atoms that constitute the bottom electrode (and oxygen atoms in applicable cases) is directed onto the surface of the buffer layer 12. Then, a bottom electrode 13 is formed in the form of a film as a result of the contact of this plume with the surface (upper surface) of the buffer layer 12.

It is desirable that this plume be generated by irradiating the surface of the abovementioned second target with laser light in the same manner as in the above-mentioned step [1D] so that atoms including various types of metal atoms and the like are knocked out of the second target.

As in the case of the abovementioned step [1D], an ArF excimer laser or KrF excimer laser is suitable for use as such laser light.

If necessary, furthermore, as in the case of the abovementioned step [1D], the bottom electrode 13 can be formed while the surface of the buffer layer 12 is irradiated with an ion beam. As a result, the bottom electrode 13 can be formed more efficiently.

Furthermore, in regard to the respective conditions used in the formation of the bottom electrode 13, it is sufficient if these conditions are such that the respective types of metal atoms can reach the surface of the insulating layer 15 at a specified ratio (e.g., composition ratio of metal oxides that have a perovskite structure), and the bottom electrode 13 can be formed. For example, the following conditions may be used.

It is desirable to set the frequency of the laser light at 30 Hz or less, and it is even more desirable to set this frequency at 15 Hz or less.

It is desirable that the energy density of the laser light be set at 0.5 J/cm$^2$ or greater, and it is even more desirable to set this energy density at 2 J/cm$^2$ or greater.

It is desirable that the temperature of the substrate 11 on which a buffer layer 12 has been formed be set at approximately 300 to 800° C., and it is even more desirable to set this temperature at approximately 400 to 700° C.

Furthermore, in cases where ion beam irradiation is also used, it is desirable that this temperature be set at approximately 0 to 100° C., and it is even more desirable to set this temperature at approximately 30 to 70° C.

It is desirable that the distance between the substrate 11 on which a buffer layer 12 has been formed and the second target be set at [approximately] 30 to 100 mm, and it is even more desirable to set this distance at approximately 50 to 80 mm.

Furthermore, it is desirable that the pressure inside the vacuum apparatus be 1 atmosphere or less; in particular, it is desirable to set the oxygen partial pressure at $133 \times 10^{-3}$ Pa ($1 \times 10^{-3}$ Torr) or greater when oxygen gas is supplied, and to set this pressure at $133 \times 10^{-5}$ Pa ($1 \times 10^{-5}$ Torr) or greater when atomic-form oxygen radicals are supplied.

Furthermore, in cases where ion beam irradiation is used in combination, it is desirable to set the pressure inside the vacuum apparatus at $133 \times 10^{-1}$ Pa ($1 \times 10^{-1}$ Torr) or less, and it is even more desirable to set this pressure at $133 \times 10^{-3}$ Pa ($1 \times 10^{-3}$ Torr) or less. In this case, furthermore, it is desirable that the mixture ratio of inert gas to oxygen in the atmosphere inside the vacuum apparatus be set in the range of approximately 300:1 to 10:1 (volume ratio), and it is even more desirable to set this ratio in the range of approximately 150:1 to 50:1.

If the respective conditions used in the formation of the bottom electrode 13 are set in the abovementioned ranges, the bottom electrode 13 can be formed with good efficiency.

In this case, furthermore, the mean thickness of the bottom electrode 13 can be adjusted to the abovementioned range by appropriately setting the laser light irradiation time. This laser light irradiation time varies according to the abovementioned conditions; ordinarily, however, it is desirable to set this time at approximately 3 to 90 minutes, and it is even more desirable to set this time at approximately 15 to 45 minutes.

The bottom electrode 13 is obtained as described above (see FIG. 5).

Furthermore, [the method used] is not limited to the abovementioned method; the bottom electrode 13 may also be formed by epitaxial growth using a method such as a CVD method, laser ablation [method] or the like.

[3D] Ferroelectric Film Formation Step

Next, a ferroelectric film 24 is formed on top of the bottom electrode 13. For example, this can be accomplished as described below.

Furthermore, prior to the formation of the ferroelectric film 24, a third target (ferroelectric film target) containing the constituent elements of the ferroelectric film 24 as described above is installed facing the substrate 11 in a position that is separated from the substrate 11 by a specified distance, instead of the abovementioned second target (bottom electrode target). Furthermore, a target which has a composition that is the same as or similar to the composition of the desired ferroelectric film 24 may be appropriately used as the third target.

Following the abovementioned step [2D], a plume of atoms including oxygen atoms and various types of metal atoms is directed onto the bottom electrode 13. Furthermore, as a result of the contact of this plume with the surface (upper surface) of the bottom electrode 13, a ferroelectric film 24 containing ferroelectric materials that have a perovskite structure (as described above) is formed in the form of a film with (for example) a tetragonal crystal (001) orientation by epitaxial growth.

It is desirable that this plume be generated by irradiating the surface of the abovementioned third target with laser light in the same manner as in the abovementioned step [1D] so that atoms including oxygen atoms and various types of metal atoms are knocked out of the third target.

As in the case of the abovementioned step [1D], an ArF excimer laser or KrF excimer laser is appropriate as the abovementioned laser light.

If necessary, furthermore, as in the abovementioned step [1D], the ferroelectric film 24 may be formed while irradiating the surface of the bottom electrode 13 with an ion beam. As a result, the ferroelectric film 24 can be formed more efficiently.

Furthermore, in regard to the respective conditions used in the formation of the ferroelectric film 24, it is sufficient if these conditions are such that the respective types of metal atoms can reach the surface of the bottom electrode 13 at a specified ratio (e.g., composition ratio of metal oxides that have a perovskite structure), and a ferroelectric film 24 can be formed. For example, the following conditions may be used.

It is desirable to set the frequency of the laser light at 30 Hz or less, and it is even more desirable to set this frequency at 15 Hz or less.

It is desirable that the energy density of the laser light be set at 0.5 J/cm$^2$ or greater, and it is even more desirable to set this energy density at 2 J/cm$^2$ or greater.

It is desirable that the temperature of the substrate 11 on which a bottom electrode 13 has been formed be set at approximately 300 to 800° C., and it is even more desirable to set this temperature at approximately 400 to 700° C.

Furthermore, in cases where ion beam irradiation is also used, it is desirable that this temperature be set at approximately 0 to 100° C., and it is even more desirable to set this temperature at approximately 30 to 70° C.

It is desirable that the distance between the substrate 11 on which a bottom electrode 13 has been formed and the third target be set at [approximately] 30 to 100 mm, and it is even more desirable to set this distance at approximately 50 to 80 mm.

Furthermore, it is desirable that the pressure inside the vacuum apparatus be 1 atmosphere or less; in particular, it is desirable to set the oxygen partial pressure at $133 \times 10^{-3}$ Pa ($1 \times 10^{-3}$ Torr) or greater when oxygen gas is supplied, and to set this pressure at $133 \times 10^{-5}$ Pa ($1 \times 10^{-5}$ Torr) or greater when atomic-form oxygen radicals are supplied.

Furthermore, in cases where ion beam irradiation is used in combination, it is desirable to set the pressure inside the vacuum apparatus at $133 \times 10^{-1}$ Pa ($1 \times 10^{-1}$ Torr) or less, and it is even more desirable to set this pressure at $133 \times 10^{-3}$ Pa ($1 \times 10^{-3}$ Torr) or less. In this case, furthermore, it is desirable that the mixture ratio of inert gas to oxygen in the atmosphere inside the vacuum apparatus be set in the range of approximately 300:1 to 10:1 (volume ratio), and it is even more desirable to set this ratio in the range of approximately 150:1 to 50:1.

If the respective conditions used in the formation of the ferroelectric film 24 are set in the abovementioned ranges, the ferroelectric film 24 can be formed with good efficiency.

In this case, furthermore, the mean thickness of the ferroelectric film 24 can be adjusted to the above-mentioned range by appropriately setting the laser light irradiation time. This laser light irradiation time varies according to the abovementioned conditions; ordinarily, however, it is desirable to set this time at approximately 3 to 90 minutes, and it is even more desirable to set this time at approximately 15 to 45 minutes.

The ferroelectric film 24 is obtained as described above.

Furthermore, [the method used] is not limited to the abovementioned method; the ferroelectric film 24 may also be formed by epitaxial growth using a method such as a CVD method, laser ablation [method] or the like.

[4D] Bottom Electrode Lead-Out Step

This step can be performed in the same manner as the abovementioned step [4A].

[5D] Top Electrode Formation Step

This step can be performed in the same manner as the abovementioned step [5A].

The capacitor 220 according to a fourth embodiment [of the present invention] is manufactured by the abovementioned steps [1D] through [5D].

<9. Ferroelectric Device Manufacturing Method (5)>

Next, a capacitor which is a ferroelectric device constituting a fifth embodiment [of the present invention] will be described. The capacitor 200 according to this fifth embodiment has a structure similar to that of the first embodiment shown in FIG. 1. In particular, in the present embodiment, an insulating layer 15 which is the first layer of an intermediate film on the substrate 11 is formed by an ion beam assist method, and a buffer layer 12 which is a second layer of this intermediate film is formed on top of the insulating layer 15.

<9-1. Substrate>

The substrate 11 has the function of supporting the bottom electrode 13 and the like, and is constructed from a member that has a flat-plate-form shape.

For example, an SOI (Si on insulator) substrate or the like may be used as the substrate 11. In this case, a substrate whose surface is covered by an SiO$_2$ film which is a natural oxidation film or thermal oxidation film, or by various types of metal materials such as silicon nitride, silicon nitride oxide, zirconium oxide or the like, can be used.

Furthermore, the substrate 11 may also be constructed from various types of resin substrates, various types of glass substrates or the like. In this case, a substrate constructed from various types of glass materials or various types of resin materials, e.g., polyolefins such as polyethylenes, polypropylenes, ethylene-propylene copolymers, ethylene-vinyl acetate copolymers (EVA) or the like, ring-form polyolefins, modified polyolefins, polyvinyl chlorides, polyvinylidene chlorides, polystyrenes, polyamides, polyimides, polyamidoimides, polycarbonates, poly-(4-methylpentene-1)s, ionomers, acrylic resins, polymethyl methacrylates, acrylonitrile-butadiene-styrene copolymers (ABS resins), acrylonitrile-styrene copolymers (AS resins), butadiene-styrene copolymers, polyoxymethylenes, polyvinyl alcohols (PVA), ethylene-vinyl alcohol copolymers (EVOH), polyester such as polyethylene terephthalates (PET), polybutylene terephthalates (PBT), polycyclohexane terephthalates (PCT) or the like, polyethers, polyether ketones (PEK), polyether ether ketones (PEEK), polyether imides, polyacetals (POM), polyphenylene oxides, modified polyphenylene oxides, polysulfones, polyether sulfones, polyphenylene sulfides, polyallylates, aromatic polyesters (liquid crystal polymers), polytetrafluoroethylenes, polyvinylidene fluorides and other fluororesins, various types of thermoplastic elastomers such as styrene type, polyolefin type, polyvinyl chloride type, polyurethane type, polyester type, polyamide type, polybutadiene type, transpolyisoprene type, fluoro-rubber type, chlorinated polyethylene type elastomers and the like, epoxy resins, phenol resins, urea resins, melamine resins, unsaturated polyesters, silicone resins, polyurethanes and the like, or copolymers, blends, polymer alloys or the like consisting mainly of these polymers, may be used as the substrate 11.

Such Si substrates, SOI substrates, various types of resin substrates, various types of glass substrates and the like are all commonly used substrates. Accordingly, the manufacturing cost of the ferroelectric device can be reduced by using such substrates.

There are no particular restrictions on the mean thickness of the substrate 11; however, it is desirable that this mean thickness be approximately 10 µm to 1 mm, and a mean thickness of approximately 100 to 600 µm is even more desirable.

By setting the mean thickness of the substrate 11 within the abovementioned range, it is possible to make the ferroelectric device thinner (i.e., to reduce the size of the ferroelectric device) while ensuring a sufficient strength.

<9-2. Intermediate Film>

An insulating layer 15 which is the first layer of an intermediate film comprising a thin film, and a buffer layer 12 which is the second layer of this intermediate film, are formed on top of the substrate 11.

The insulating layer 15 is formed using an ion beam assist method so that this layer has an in-plane orientation. Since the orientations of the buffer layer 12 and bottom electrode 13 described later depend on the orientation of the insulating layer 15, the buffer layer 12 and bottom electrode 13 are also grown with a uniformly arranged orientation on top of such an insulating layer 15. Specifically, the buffer layer 12 and bottom electrode 13 can be normally grown by epitaxial growth on top of such an insulating layer 15.

There are no particular restrictions on the composition of such an insulating layer 15; however, for example, it is desirable that this composition contain compounds with a fluorite structure expressed by $RE_x(Zr_{1-y}Ce_y)_{1-x}O_{2-0.5x}$ ($0.0 \leq x \leq 1.0$, $0.0 \leq y \leq 1.0$; RE=La, Ce, Pr, Nd, Pm, Sm, Eu, Gd, Tb, Dy, Ho, Er, Tm, Yb, Lu, Y) (or solid solutions of such compounds), or compounds with a pyrochlore structure expressed by $RE_2(Zr_{1-y}Ce_y)_2O_7$ ($0.0 \leq y \leq 1.0$; RE=La, Ce, Pr, Nd, Pm, Sm, Eu, Gd, Tb, Dy, Ho, Er, Tm, Yb, Lu, Y) (or a solid solution of such compounds).

Furthermore, a composition containing compounds with an NaCl structure is also desirable, and a composition in which such compounds are the main materials is even more desirable. These metal oxides can be formed with an in-plane orientation using an ion beam assist method, and are also suitable for the epitaxial growth of the buffer layer 12.

Examples of metal oxides with an NaCl structure include MgO, CaO, SrO, BaO, MnO, FeO, CoO, NiO and solid solutions containing these compounds; in particular, it is desirable to use at least one substance selected from a set comprising MgO, CaO, SrO, BaO, NiO and solid solutions containing these compounds.

Furthermore, the insulating layer 15 may have any of the following orientations: e.g., a cubic crystal (100) orientation, a cubic crystal (110) orientation, a cubic crystal (111) orientation or the like. Among these orientations, however, a cubic crystal (100) orientation is especially desirable. By setting the orientation of the insulating layer 15 as a cubic crystal (100) orientation, it is possible to set the mean thickness of the insulating layer 15 at a relatively small value. Accordingly, even in cases where the insulating layer 15 is constructed from a metal oxide with an NaCl structure which shows deliquescence such as MgO, CaO, SrO or BaO, the problem of deterioration caused by moisture in the air during manufacture or during use can be appropriately prevented, so that a ferroelectric device suitable for practical use can be obtained.

From such a standpoint, it is desirable to form the insulating layer 15 with as small a thickness as possible. In concrete terms, it is desirable that the mean thickness be 10 nm or less, and a mean thickness of 5 nm or less is even more desirable. As a result, the abovementioned effect is improved.

Furthermore, if the mean thickness of the insulating layer 15 is thus set at a small value, the following advantage is also obtained: e.g., in cases where a ferroelectric memory is manufactured, thin capacitors (e.g., with a thickness on the order of 10 nm) can be manufactured.

In regard to the composition of the buffer layer 12, setting this composition as the same composition as that of the insulating layer 15 is suitable for epitaxial growth on the insulating layer 15. Furthermore, this composition may also contain metal oxides with an NaCl structure such as MgO, SrO, NiO or the like, or nitrides such as TiN, AlN, cBN (cubic boron nitride) or the like, and a composition containing these compounds as the main materials is desirable. These oxides and nitrides are suitable for epitaxial growth on the metal oxides constituting the insulating layer 15, and show little lattice mismatching with metal oxides that have a perovskite structure; accordingly, adhesion is improved in cases where the bottom electrode 13 is formed using such materials.

The buffer layer 12 may be epitaxially grown with any of the following orientations: e.g., a cubic crystal (100) orientation, a cubic crystal (110) orientation, a cubic crystal (111) orientation or the like. Among these orientations, however, a layer that is epitaxially grown with a cubic crystal (100) orientation is especially desirable. By epitaxially growing the buffer layer 12 with a cubic crystal (100) orientation, it is possible to reduce the mean thickness of the buffer layer 12 to a relatively small value. Accordingly, even in cases where the buffer layer 12 is constructed from a metal oxide with an NaCl structure which shows deliquescence such as MgO, SrO or the like, the problem of deterioration caused by moisture in the air during manufacture or during use can be appropriately prevented, so that a ferroelectric device suitable for practical use can be obtained.

From such a standpoint, it is desirable to form the buffer layer 12 with as small a thickness as possible. In concrete terms, it is desirable that the mean thickness be 10 nm or less, and a mean thickness of 5 nm or less is even more desirable. As a result, the abovementioned effect is improved.

Furthermore, if the mean thickness of the buffer layer 12 is thus set at a small value, the following advantage is also obtained: e.g., in cases where a ferroelectric memory is manufactured, thin capacitors (e.g., with a thickness on the order of 10 nm) can be manufactured.

<9-3. Bottom Electrode>

Since the bottom electrode 13 is similar to that of the capacitor 200 of the fourth embodiment, a description of this electrode is omitted.

<9-4. Ferroelectric Film>

Since the ferroelectric film 24 is similar to that of the capacitor 200 of the fourth embodiment, a description of this ferroelectric film is omitted.

<9-5. Top Electrode>

Since the top electrode 25 is similar to that of the capacitor 200 of the fourth embodiment, a description of this electrode is omitted.

<10. Ferroelectric Device Manufacturing Method (5)>

Figure 6:
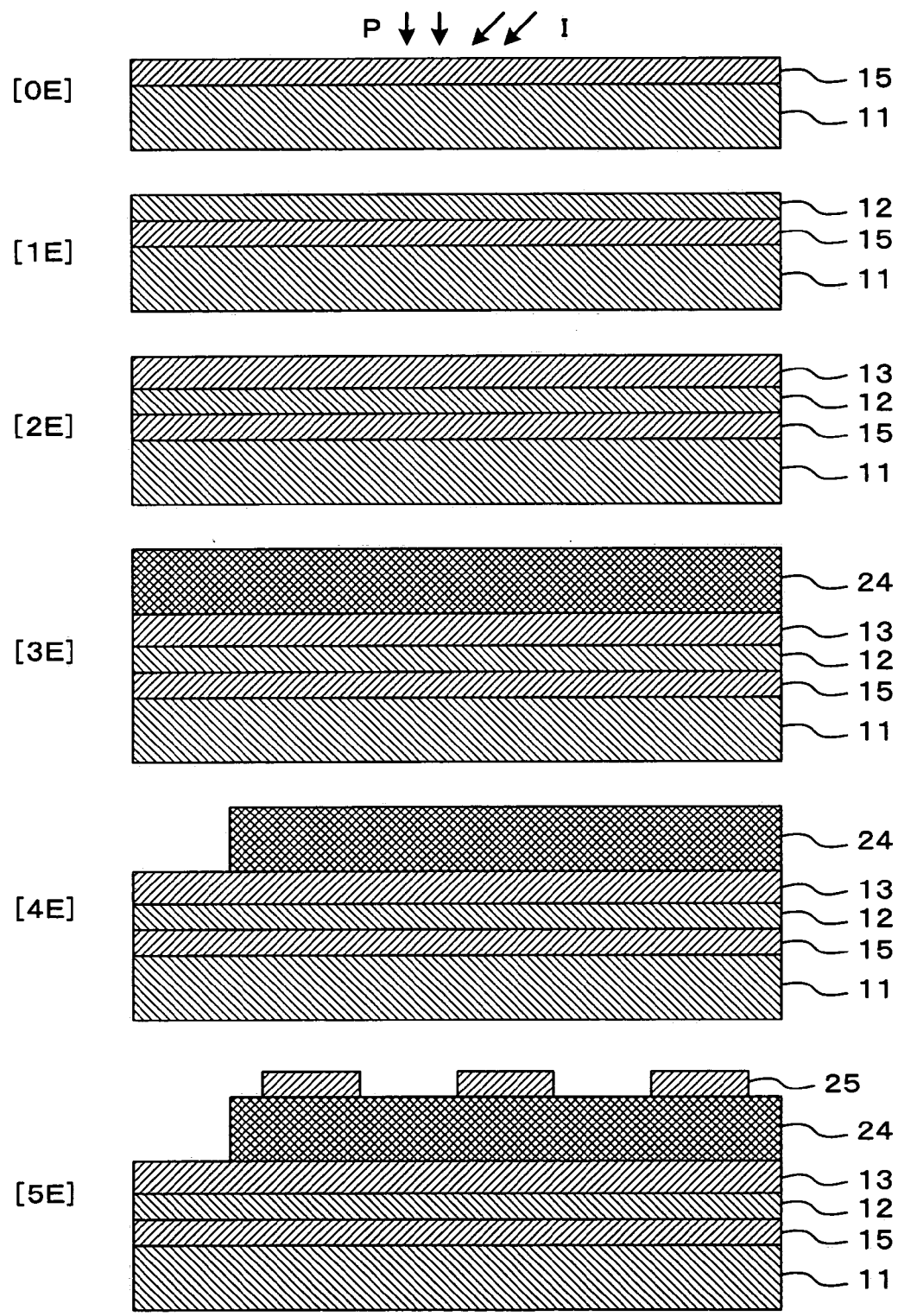
FIG. 6 is a diagram which is used to illustrate the ferroelectric device manufacturing method of a fifth embodiment of the present invention.

Next, a method for manufacturing such a capacitor according to a fifth embodiment [of the present invention] will be described with reference to FIG. 6.

The manufacturing method for the capacitor 200 described below comprises a step in which an insulating layer 15 which is the first layer of an intermediate film is formed on a substrate 11 (intermediate film first layer formation step), a step in which a buffer layer 12 which is the second layer [of this intermediate film] is formed [on the substrate 11] (intermediate film second layer formation step), a step in which a bottom electrode 13 is formed on top of the buffer layer 12 (bottom electrode formation step), a step in which a ferroelectric film 24 is formed on top of the bottom electrode 13 (ferroelectric film formation step), a step in which a portion of the ferroelectric film 24 is removed (bottom electrode lead-out step), and a step in which a top electrode 25 is formed on top of the ferroelectric film 24 (top electrode formation step). These respective steps will be described in order below.

First, a substrate 11 is prepared. A substrate which has a uniform thickness, and which is free of any warping or scratches, may be appropriately used as this substrate 11.

[0E] Intermediate Film First Layer Formation Step

First, an insulating layer 15 is formed on the substrate 11. For example, this can be accomplished as follows:

First, the substrate 11 is mounted in a substrate holder, and is placed inside a vacuum apparatus.

Furthermore, a first target containing the constituent elements of the insulating layer 15 as described above (insulating layer target) is disposed facing the substrate 11 in a position that is separated from the substrate 11 by a specified distance inside the vacuum apparatus. Furthermore, a target which has a composition that is the same as or similar to the composition of the desired insulating layer 15 may be appropriately used as the first target.

Next, when the first target is irradiated with (for example) laser light, atoms including oxygen atoms and metal atoms are knocked out of the first target, so that a plume P is generated. In other words, this plume P is directed toward the substrate 11. Then, this plume P contacts the surface of the substrate 11.

Furthermore, at substantially the same time, the surface of the substrate 11 is irradiated with an ion beam I that is inclined at a specified angle.

As a result, an insulating layer 15 which is oriented in an in-plane orientation is formed on the substrate 11.

Furthermore, besides a method in which the surface of the first target is irradiated with laser light, a method in which an argon gas (inert gas) plasma, electron beam or the like is caused to be incident on the surface of the first target can also be employed as the method that is used to knock the abovementioned atoms out of the first target.

Among these methods, a method in which the surface of the first target is irradiated with laser light is especially desirable as the method used to knock the abovementioned atoms out of the first target. If such a method is used, the atoms can be knocked out of the first target easily and reliably using a vacuum apparatus with a simple construction that is equipped with a laser light entry window.

Furthermore, this laser light is preferably pulsed light with a wavelength of approximately 150 to 300 nm and a pulse width of approximately 1 to 100 ns. In concrete terms, examples of laser light that can be used include excimer lasers such as ArF excimer lasers, KrF excimer lasers and XeCl excimer lasers, as well as YAG lasers, $YVO_4$ lasers, $CO_2$ lasers and the like. Among these types of laser light, ArF excimer lasers or KrF excimer lasers are especially desirable as the laser light used. Both ArF excimer lasers and KrF excimer lasers are easy to handle, and can knock atoms out of the first target with greater efficiency.

Meanwhile, there are no particular restrictions on the ion beam I that irradiates the surface of the substrate 11; for instance, at least one species of ions selected from ions of inert gases such as argon, helium, neon, xenon or krypton, or mixed ions comprising such ions and oxygen ions, may be cited as examples of ions that can be used.

For example, it is desirable to use a Kauffman ion source or the like as the ion source of this ion beam I. The ion beam I can be generated relatively easily by using this ion source.

Furthermore, there are no particular restrictions on the irradiation angle of the ion beam I with respect to the normal direction of the surface of the substrate 11 (i.e., the abovementioned specified angle); however, it is desirable to set this angle at approximately 35 to 65°. In particular, in cases where an insulating layer 15 comprising mainly metal oxides with an NaCl structure is formed, it is even more desirable to set this angle at approximately 42 to 47°. If the ion beam I is set at such an irradiation angle and directed onto the surface of substrate 11, an insulating layer 15 which has a cubic crystal (100) orientation and which is oriented in an in-plane orientation can be formed.

In regard to the respective conditions used in the formation of such an insulating layer 15, it is sufficient if these conditions allow in-plane orientation of the insulating layer 15; for example, the following conditions may be used.

It is desirable to set the frequency of the laser light at 30 Hz or less, and it is even more desirable to set this frequency at 15 Hz or less.

It is desirable that the energy density of the laser light be set at 0.5 $J/cm^2$ or greater, and it is even more desirable to set this energy density at 2 $J/cm^2$ or greater.

It is desirable that the ion beam acceleration voltage be set at approximately 100 to 300 V, and it is even more desirable to set this voltage at approximately 150 to 250 V.

Furthermore, it is desirable that the irradiation dose of the ion beam be set at 30 mA or less, and it is even more desirable to set this dose at 10 mA or less.

It is desirable that the temperature of the substrate 11 be set at 200° C. or less, and it is even more desirable to set this temperature at 100° C. or less.

It is desirable that the distance between the substrate 11 and the first target be set at approximately 30 to 100 mm, and it is even more desirable to set this distance at approximately 50 to 80 mm.

Furthermore, it is desirable that the pressure inside the vacuum apparatus be set at $133 \times 10^{-1}$ Pa ($1 \times 10^{-1}$ Torr) or less, and it is even more desirable to set this pressure at $133 \times 10^{-3}$ Pa ($1 \times 10^{-3}$ Torr) or less.

It is desirable that the mixture ratio of inert gas to oxygen in the atmosphere inside the vacuum apparatus be set in the range of approximately 100:1 to 2:1 (volume ratio), and it is even more desirable to set this ratio in the range of approximately 20:1 to 5:1.

If the respective conditions used in the formation of the insulating layer 15 are set in the abovementioned ranges, the insulating layer 15 can be formed more efficiently with an in plane orientation.

In this case, furthermore, the mean thickness of the insulating layer 15 can be adjusted to the range described above by appropriately setting the laser light irradiation time. This laser light irradiation time varies according to the abovementioned conditions; ordinarily, however, it is desirable to set this time at 200 seconds or less, and it is even more desirable to set this time at 100 seconds or less.

If such a method is used to form the insulating layer 15, the uniformly arranged orientation can be adjusted to any desired direction by the simple method of adjusting the irradiation angle of the ion beam. Furthermore, since the orientation of the insulating layer 15 can thus be adjusted with good precision, the following advantage is also obtained: namely, the mean thickness of the insulating layer 15 can be reduced to smaller value.

The insulating layer 15 is obtained as described above.

[1E] Intermediate Film Second Layer Formation Step

Next, a buffer layer 12 is formed. For example, this buffer layer 12 can be formed as described below.

Furthermore, prior to the formation of the buffer layer 12, a second target containing the constituent elements of the buffer layer 12 as described above (buffer layer target) is disposed facing the insulating layer 15 of the substrate 11 in a position that is separated from the substrate 11 by a specified distance, instead of the abovementioned first target. A target which has a composition that is the same as or similar to the composition of the desired buffer layer 12 may be appropriately used as the second target.

Following the formation of the insulating layer 15, a plume of atoms including various types of metal atoms and the like is directed onto the surface of the insulating layer 15. Furthermore, as a result of the contact of this plume with the surface (upper surface) of the insulating layer 12, a buffer layer 15 is formed in the form of a film by epitaxial growth.

It is desirable that this plume be generated by irradiating the surface of the abovementioned second target with laser light in the same manner as in the formation of the insulating layer 15, so that atoms including various types of metal atoms and the like are knocked out of the second target.

As in the formation of the insulating layer 15, an ArF excimer laser or KrF excimer laser is suitable for use as such laser light.

If necessary, furthermore, as in the formation of the insulating layer 15, the buffer layer 12 may be formed while irradiating the surface of the insulating layer 15 with an ion beam. As a result, the buffer layer 12 can be formed more efficiently.

Furthermore, in regard to the respective conditions used in the formation of the buffer layer 12, it is sufficient if these conditions are such that the respective types of metal atoms can reach the surface of the insulating layer 15 at a specified ratio, and the buffer layer 12 can be formed with an in-plane orientation. For example, conditions similar to those used in the formation of the insulating layer 15 can be used.

Furthermore, the method used is not limited to the abovementioned method; the buffer layer 12 may also be formed by epitaxial growth using a method such as a CVD method, laser ablation [method] or the like.

[2E] Bottom Electrode Formation Step

Next, a bottom electrode 13 is formed on top of the buffer layer 12. This bottom electrode 13 can be formed in the same manner as in step [2D] of the fourth embodiment, except for the fact that a third target containing the constituent elements of the bottom electrode 13 (bottom electrode target) is used.

Figure 7:
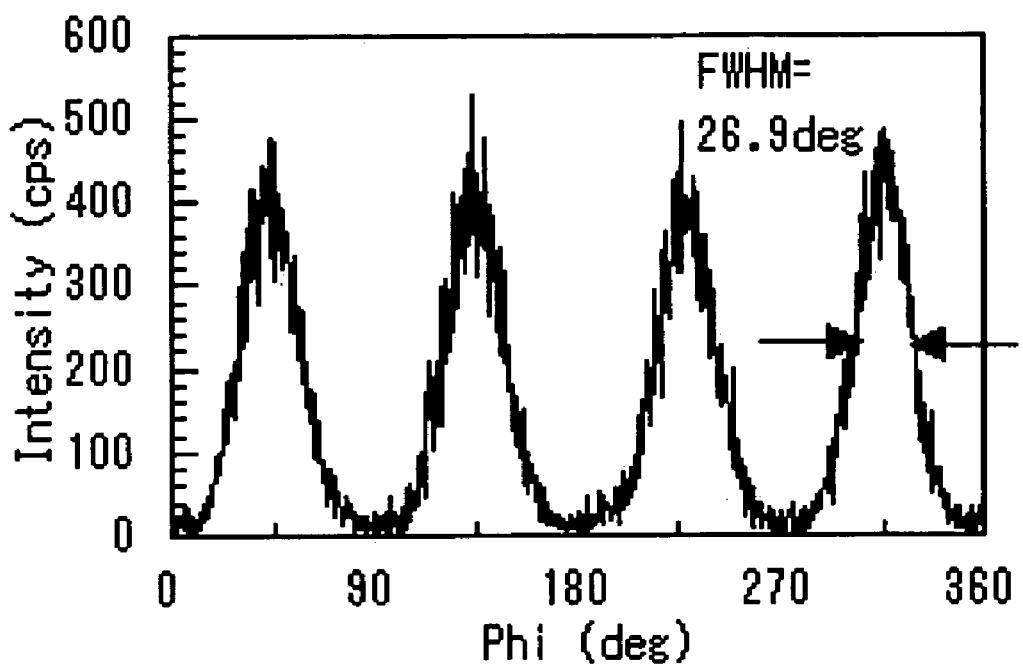
FIG. 7 is a graph which shows the intensity of reflection according to XRD of the bottom electrode ($SrRuO_3$) in a ferroelectric device manufactured according to the fifth embodiment.

Here, in a case where [i] MgO was deposited as an insulating layer 11 with the irradiation angle of the ion beam with respect to the normal direction of the surface of the substrate set at 45°, the frequency of the laser light set at 10 Hz, the energy density of the laser light set at 2 J/cm², the ion beam acceleration voltage set at 200 V, the irradiation dose of the ion beam set at 8 mA, the temperature of the substrate 11 set at 100° C., the distance between the substrate 11 and the first target set at 70 mm, the pressure inside the vacuum apparatus set at $133 \times 10^{-3}$ Pa ($1 \times 10^{-3}$ Torr), the mixture ratio of inert gas to oxygen set at 10:1 (volume ratio), and the irradiation time of the laser light and ion beam set at 90 seconds, [ii] MgO was deposited on top of this as a buffer layer 12 under the same conditions as in the case of the insulating layer 11, and [iii] SrRuO₃ was deposited on top of this as a bottom electrode 13 with the frequency of the laser light set at 10 Hz, the energy density of the laser light set at 2 J/cm², the temperature of the substrate 11 set at 600° C., the distance between the substrate 11 and the third target set at 70 mm, and the oxygen partial pressure in the case of oxygen gas supply set at $133 \times 10^{-2}$ Pa ($1 \times 10^{-2}$ Torr), the half-value width in an XRD φ scan of the quasi-cubic crystal (101) plane of SrRuO₃ with a quasi-cubic crystal (100) orientation was 27°, as is shown in FIG. 7. This is smaller than the half-value width of 41° obtained in a case where an ion beam was not used in the formation of the insulator 11, and indicates that the degree of in-plane orientation is high.

[3E] Ferroelectric Film Formation Step

Next, a ferroelectric film 24 is formed on top of the bottom electrode 13. This ferroelectric film 24 can be formed in the same manner as in step [3D] of the fourth embodiment, except for the fact that a fourth target containing the constituent elements of the ferroelectric film 24 (ferroelectric film target) is used.

Figure 8:
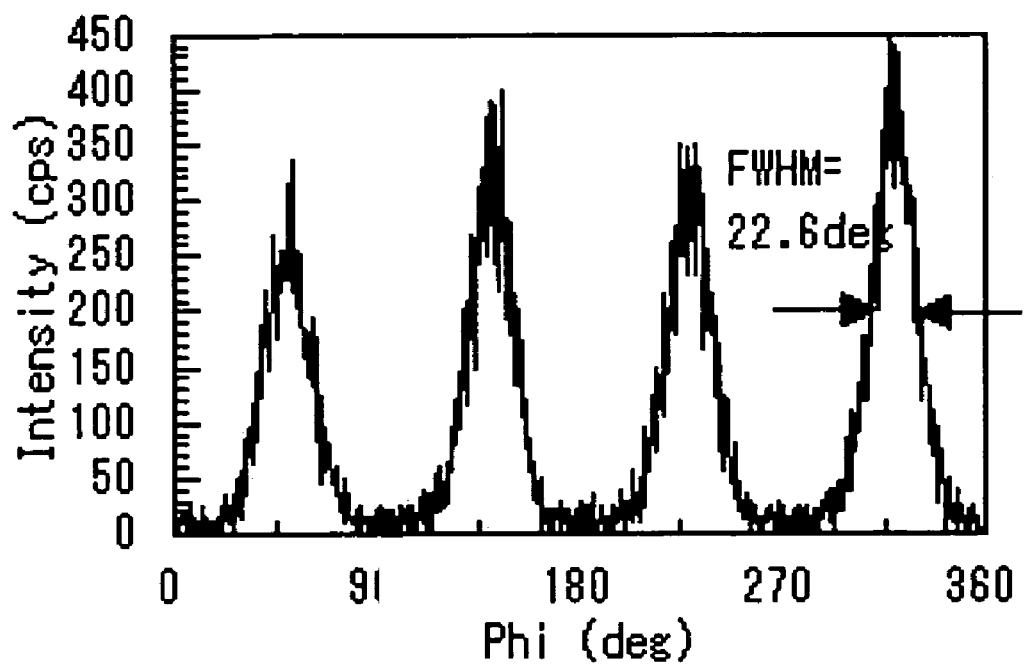
FIG. 8 is a graph which shows the intensity of reflection according to XRD of the ferroelectric film (PZT) in a ferroelectric device manufactured according to the fifth embodiment.

Here, in a case where Pb(Zr,Ti)O₃ (PZT) was deposited as a ferroelectric film 24 (on a substrate 11 on which the preceding layers up to the SrRuO₃ bottom electrode had been formed) with the frequency of the laser light set at 10 Hz, the energy density of the laser light set at 2 J/cm², the temperature of the substrate 11 set at 600° C., the distance between the substrate 11 and the fourth target set at 70 mm, and the oxygen partial pressure in the case of oxygen gas supply set at $133 \times 10^{-1}$ Pa ($1 \times 10^{-1}$ Torr), the half-value width in an XRD φ scan of the (101) plane of PZT with a (001) orientation was 23°, as is shown in FIG. 8. This is smaller than the half-value width of 46° obtained in a case where an ion beam was not used in the formation of the insulator 11, and indicates that the degree of in-plane orientation is high.

[4E] Bottom Electrode Lead-Out Step

Next, the bottom electrode 13 is led out by removing a portion of the ferroelectric film 24. This step can be performed in the same manner as step [4D] of the fourth embodiment.

[5E] Top Electrode Formation Step

Next, a top electrode 25 is formed on top of the ferroelectric film 24. This top electrode 25 can be formed in the same manner as in step [5D] of the first embodiment.

The capacitor 200 of the fifth embodiment is manufactured by the abovementioned steps [0E] through [5E].

<11. Ferroelectric Device Constructions (6 Through 8)>

Next, capacitors which are ferroelectric devices according to sixth through eighth embodiments [of the present invention] will be described. These capacitors 200 according to the sixth through eighth embodiments have a construction similar to that of the first embodiment shown in FIG. 1.

In particular, in the sixth embodiment, the buffer layer 12 which is an intermediate layer includes a layer formed with an in-plane orientation by an ion beam assist method. In the seventh embodiment, the bottom electrode 13 includes a layer formed with an in-plane orientation by an ion beam assist method. Furthermore, in the eighth embodiment, the ferroelectric film 24 includes a layer formed with an in-plane orientation by an ion beam assist method.

The buffer layer 12 in the sixth embodiment, the bottom electrode 13 in the seventh embodiment and the ferroelectric film 24 in the eighth embodiment all include a second layer, which is formed by continuing deposition with the ion beam assist stopped, on top of a first layer which is formed with an in-plane orientation by an ion beam assist method. Furthermore, these layers may also include a layer which is further formed with an in-plane orientation by an ion beam assist method on top of the abovementioned first layer and second layer, by repeating the performance and stopping of the ion beam assist. Furthermore, these layers may also include a layer which is further deposited with the ion beam assist stopped on top of the abovementioned layers. Furthermore, the above-mentioned layers may further repeatedly include layers similar to those described above on top of these layers.

In the ferroelectric devices constructed according to these sixth through eighth embodiments, since the second layer that is deposited with the ion beam assist stopped is grown as a crystal while being influenced by the first layer that is oriented in an in-plane orientation, the second layer has a good orientation. Accordingly, a film with a good orientation can be formed while reducing the amount of energy that is consumed by the generation of the ion beam. Furthermore, since the thin film is not etched by the ion beam during deposition in the case of deposition with the ion beam stopped, the advantage of a high deposition speed is obtained in these embodiments.

<11-1. Substrate>

The substrate 11 has the function of supporting the buffer layer 12, bottom electrode 13 and the like, and is constructed from a member that has a flat-plate-form shape. An insulating layer 15 is formed on the surface (upper side in FIG. 1) of this substrate 11. The insulating layer 15 is a part that is formed by a substance in an amorphous state, and may be formed as an integral part of the substrate 11, or may be fastened to the substrate 11.

For example, an Si substrate, SOI (Si on insulator) substrate or the like can be used as the substrate 11. In this case, a substrate whose surface is covered by an $SiO_2$ film which is a natural oxidation film or thermal oxidation film may be used. Specifically, in such a case, this natural oxidation film or thermal oxidation film constitutes the insulating layer 15.

Furthermore, besides $SiO_2$, the insulating layer 15 may also be formed using various types of metal materials or the like such as silicon nitride, silicon nitride oxide, zirconium oxide or the like. For example, a two-layer structure comprising 1000 nm of $SiO_2$ and 400 nm of $ZrO_2$ may be used.

For example, such an insulating layer 15 is formed by a chemical vapor deposition method (CVD) such as thermal CVD, plasma CVD, laser CVD or the like, a physical vapor deposition method (PVD) such as vacuum evaporation, sputtering, ion plating or the like, or by sputtering reflow, thermal oxidation of the surface of the Si substrate or the like.

Furthermore, the substrate 11 itself may also be formed by an amorphous substance so that this substrate has insulating properties. In such cases, a substrate constructed from various types of glass materials or various types of resin materials, e.g., polyolefins such as polyethylenes, polypropylenes, ethylene-propylene copolymers, ethylene-vinyl acetate copolymers (EVA) or the like, ring-form polyolefins, modified polyolefins, polyvinyl chlorides, polyvinylidene chlorides, polystyrenes, polyamides, polyimides, polyamidoimides, polycarbonates, poly-(4-methylpentene-1)s, ionomers, acrylic resins, polymethyl methacrylates, acrylonitrile-butadiene-styrene copolymers (ABS resins), acrylonitrile-styrene copolymers (AS resins), butadiene-styrene copolymers, polyoxymethylenes, polyvinyl alcohols (PVA), ethylene-vinyl alcohol copolymers (EVOH), polyester such as polyethylene terephthalates (PET), polybutylene terephthalates (PBT), polycyclohexane terephthalates (PCT) or the like, polyethers, polyether ketones (PEK), polyether ether ketones (PEEK), polyether imides, polyacetals (POM), polyphenylene oxides, modified polyphenylene oxides, polysulfones, polyether sulfones, polyphenylene sulfides, polyallylates, aromatic polyesters (liquid crystal polymers), polytetrafluoroethylenes, polyvinylidene fluorides and other fluororesins, various types of thermoplastic elastomers such as styrene type, polyolefin type, polyvinyl chloride type, polyurethane type, polyester type, polyamide type, polybutadiene type, transpolyisoprene type, fluoro-rubber type, chlorinated polyethylene type elastomers and the like, epoxy resins, phenol resins, urea resins, melamine resins, unsaturated polyesters, silicone resins, polyurethanes and the like, or copolymers, blends, polymer alloys or the like consisting mainly of these polymers, may be used as the substrate 11.

Such Si substrates, SOI substrates, various types of resin substrates, various types of glass substrates and the like are all commonly used substrates. Accordingly, the manufacturing cost of the ferroelectric device can be reduced by using such substrates as the substrate 11.

There are no particular restrictions on the mean thickness of the substrate 11; however, it is desirable that this mean thickness be approximately 10 μm to 1 mm, and a mean thickness of approximately 100 to 600 μm is even more desirable. By setting the mean thickness of the substrate 11 within the abovementioned range, it is possible to make the ferroelectric device thinner (i.e., to reduce the size of the ferroelectric device) while ensuring a sufficient strength.

<11-2. Buffer Layer>

A buffer layer 12 comprising a thin film is formed on top of the insulating layer 15.

By installing such a buffer layer 12, it is possible to obtain superior adhesion (bonding) between the insulating layer 15 and the bottom electrode 13.

In regard to the composition of such a buffer layer 12, for example, a compound with a fluorite structure such as yttria-stabilized zirconia, $CeO_2$, $ZrO_2$, $ThO_2$, $UO_2$, $HfO_2$ or the like, a c-type rare earth oxide such as $Y_2O_3$ or the like, a material with a high Young's modulus and high rigidity such as $Si_3N_4$, SiC, diamond, alumina or the like, a transition metal oxide such as $Ta_2O_5$, $Cr_2O_3$, $Nb_2O_5$ or the like, an insulating compound oxide such as $LiTaO_3$, $MgAl_2O_4$ or the like, a conductive compound oxide such as $LaCoO_3$, $LaSrCuO_4$, $LaCaMnO_3$ or the like, or a compound with an NaCl structure such as MgO, CaO, SrO, BaO, MnO, FeO, CoO, NiO or the like is desirable.

In particular, in the case of the first embodiment which includes a layer with an in-plane orientation formed by an ion beam assist method, $CeO_2$, $ZrO_2$, $HfO_2$ and solid solutions of these compounds are desirable as compounds with a fluorite structure. Such metal oxides with a fluorite structure show especially little lattice mismatching with metal oxides that have a perovskite structure.

Furthermore, especially in the case of the sixth embodiment which includes a layer with an in-plane orientation formed by an ion beam assist method, MgO, CaO, SrO, BaO, NiO and solid solutions of these compounds are desirable as compounds that have an NaCl structure. Such metal oxides with an NaCl structure show especially little lattice mismatching with metal oxides that have a perovskite structure.

The buffer layer 12 may have any of the following orientations: e.g., a cubic crystal (100) orientation, a cubic crystal (110) orientation, a cubic crystal (111) orientation or the like. Among these orientations, however, a cubic crystal (100) orientation is especially desirable. By setting the orientation of the buffer layer 12 as a cubic crystal (100) orientation; it is possible to set the mean thickness of the buffer layer 12 at a relatively small value. Accordingly, even in cases where the buffer layer 12 is constructed from a metal oxide with an NaCl structure which shows deliquescence such as MgO, CaO, SrO or BaO, the problem of deterioration caused by moisture in the air during manufacture or during use can be appropriately prevented, so that a ferroelectric device suitable for practical use can be obtained.

From such a standpoint, it is desirable to form the buffer layer 12 with as small a thickness as possible. In concrete terms, it is desirable that the mean thickness be 10 nm or less, and a mean thickness of 5 nm or less is even more desirable. As a result, the abovementioned effect is improved.

Furthermore, if the mean thickness of the buffer layer 12 is thus set at a small value, the following advantage is also obtained: e.g., in cases where a ferroelectric memory is manufactured, thin capacitors (e.g., with a thickness on the order of 10 nm) that are required as the design rule of this ferroelectric memory becomes finer can be manufactured.

<11-3. Bottom Electrode>

A bottom electrode 13 is formed on top of the buffer layer 12. In regard to the composition of this bottom electrode 13, it is desirable that the electrode be constructed from a metal material such as Pt, Ir, Ti, Rh, Ru or the like. A plurality of layers of such metal materials may also be formed. For example, the bottom electrode [may be] constructed with a layer structure of Ti with a thickness of 20 nm/Ir with a thickness of 20 nm/Pt with a thickness of 140 nm.

Furthermore, the composition of the bottom electrode 13 may include metal oxides that have a perovskite structure. In this case, the composition of the electrode preferably includes metal oxides with a perovskite structure as the main materials.

Examples of metal oxides that have a perovskite structure include $CaRuO_3$, $SrRuO_3$, $BaRuO_3$, $SrVO_3$, $(La,Sr)MnO_3$, $(La,Sr)CrO_3$, $(La,Sr)CoO_3$, $LaNiO_x$, $YBa_2Cu_3O_x$ and solid solutions that contain these oxides. These metal oxides that have a perovskite structure are superior in terms of conductivity and chemical stability. Accordingly, the bottom electrode 13 can also be formed as an electrode that is superior in terms of conductivity and chemical stability.

The bottom electrode 13 with a perovskite structure may have any of the following crystal orientations: e.g., a quasi-cubic crystal (100) orientation, quasi-cubic crystal (110) orientation, quasi-cubic crystal (111) orientation or the like. Among these, however, an electrode with a quasi-cubic crystal (100) orientation or quasi-cubic crystal (110) orientation is especially desirable.

Furthermore, there are no particular restrictions on the mean thickness of the bottom electrode 13; however, it is desirable to set this mean thickness at approximately 10 to 300 nm, and a mean thickness of approximately 50 to 150 nm is even more desirable. As a result, the bottom electrode 13 can exhibit a sufficient function as an electrode, and an increase in the size of the ferroelectric device can also be prevented.

Furthermore, in the sixth embodiment which includes a layer with an in-plane orientation formed by an ion beam assist method as a buffer layer 12, since the orientation of the buffer layer 12 is uniformly arranged as described above, the orientation of the bottom electrode 13 is also uniformly arranged as a result of the bottom electrode 13 being formed on top of this buffer layer 12. In particular, it is desirable that the bottom electrode 13 be formed by epitaxial growth on top of the buffer layer 12.

Furthermore, in the seventh embodiment which includes a layer with an in-plane orientation formed by an ion beam assist method as a bottom electrode 13, it is especially desirable that the composition of the bottom electrode 13 comprise at least one substance (among the abovementioned substances) selected from a set comprising $SrRuO_3$, $LaNiO_x$, $YBa_2Cu_3O_x$ and solid solutions containing these compounds.

<11-4. Ferroelectric Film>

A ferroelectric film 24 is formed on top of this bottom electrode 13.

In the sixth embodiment which includes a layer with an in-plane orientation formed by an ion beam assist method as a buffer layer 12, and the seventh embodiment which includes a layer with an in-plane orientation formed by an ion beam assist method as a bottom electrode 13, since the orientation of the bottom electrode 13 is uniformly arranged as described above, the orientation of the ferroelectric film 24 is also uniformly arranged as a result of the ferroelectric film 24 being formed on top of this bottom electrode 13. In particular, it is desirable that the ferroelectric film 24 be formed by epitaxial growth on top of the bottom electrode.

Furthermore, in the eighth embodiment, the ferroelectric film 24 includes a layer with an in-plane orientation formed by an ion beam assist method; accordingly, the ferroelectric film 24 as a whole shows a good orientation as described above.

Accordingly, in all of the sixth through eighth embodiments, the capacitor 200 shows (for example) an increase in the residual polarization, a decrease in the counter electric field and the like. Specifically, various characteristics of the capacitor 200 are improved. Accordingly, in cases where a ferroelectric memory is manufactured using such a capacitor 200, this ferroelectric memory can be formed as a memory that is superior in terms of the angularity of the hysteresis curve.

The ferroelectric film 24 can be constructed from various types of ferroelectric materials. However, it is desirable that this film contain ferroelectric materials that have a perovskite structure, and a ferroelectric film in which ferroelectric materials that have a perovskite structure are the main materials is even more desirable. Furthermore, such ferroelectric materials that have a perovskite structure may be any of the following materials: i.e., materials with a tetragonal crystal (001) orientation, materials with a rhombohedral crystal (100) orientation or the like. In particular, however, materials with a tetragonal crystal (001) orientation are especially desirable. As a result, the abovementioned effect is improved.

Examples of ferroelectric materials which have such a perovskite structure include metal oxides with a perovskite structure such as $Pb(Zr,Ti)O_3$ (PZT), $(Pb,La)(Zr,Ti)O_3$ (PLZT), $(Ba,Sr)TiO_3$ (BST), $BaTiO_3$, $KNbO_3$, $Pb(Zn,Nb)O_3$ (PZN), $Pb(Mg,Nb)O_3$ (PMN), $PbFeO_3$ and $PbWO_3$, Bi layer-form compounds such as $SrBi_2(Ta,Nb)_2O_9$ and $(Bi,La)_4Ti_3O_{12}$, and solid solutions that contain such compounds (PMN-PT, PZN-PT and the like). In the third embodiment which includes a layer with an in-plane orientation formed by an ion beam assist method, PZT, BST, or a relaxer material such as PMN-PT, PZN-PT or the like is especially desirable. As a result, various characteristics of the capacitor 200 are especially superior.

Furthermore, in the sixth and seventh embodiments, in cases where the bottom electrode 13 is an electrode which contains metal oxides that have a perovskite structure (especially an electrode which contains metal oxides that have a perovskite structure as the main materials), such metal oxides that have a perovskite structure show little lattice mismatching with ferroelectric materials that have a perovskite structure. Accordingly, the ferroelectric film 24 can be epitaxially grown on top of the bottom electrode 13 easily and reliably with a tetragonal crystal (001) orientation. Furthermore, the bonding of the ferroelectric film 24 that is obtained to the bottom electrode 13 is improved.

Furthermore, there are no particular restrictions on the mean thickness of the ferroelectric film 24; however, a mean thickness of approximately 50 to 300 nm is desirable, and a mean thickness of approximately 100 to 200 nm is even more desirable. By setting the mean thickness of the ferroelectric film 24 in the abovementioned range, it is possible to form a capacitor that can exhibit various characteristics in a favorable manner while preventing an increase in the size of the capacitor 200.

<11-5. Top Electrode>

A comb-form (or band-form) top electrode 25 is formed on top of the ferroelectric film 24.

A single material or a combination of two or more materials selected from a set comprising (e.g.) Pt, Ir, Au, Ag, Ru, alloys containing these metals and the like can be used as the constituent material of this top electrode 25.

Furthermore, there are no particular restrictions on the mean thickness of the top electrode 25; however, it is desirable that this thickness be approximately 10 to 300 nm, and a thickness of approximately 50 to 150 nm is even more desirable.

<12. Ferroelectric Device Manufacturing Methods (6 Through 8)>

Figure 9:
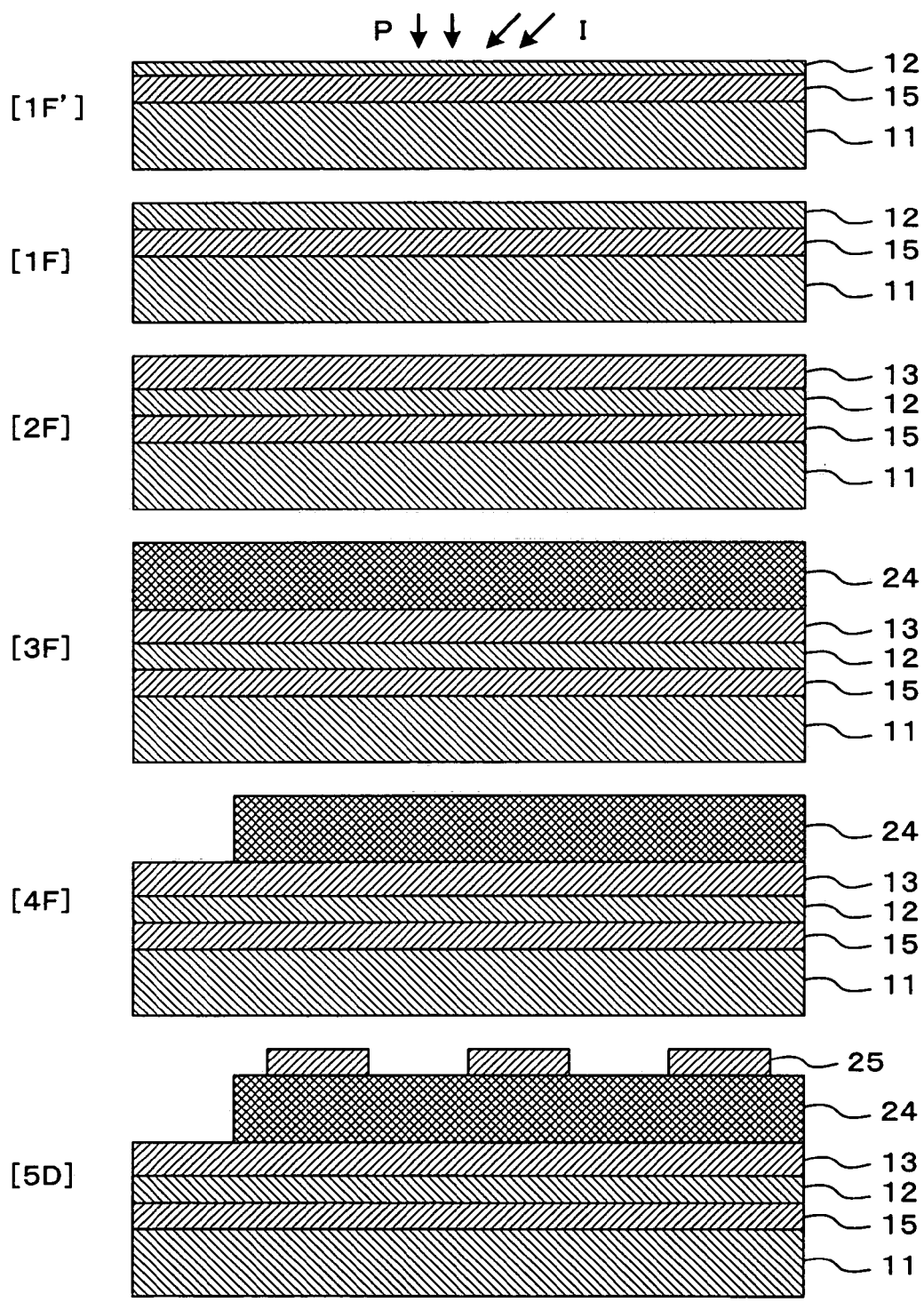
FIG. 9 is a diagram which is used to illustrate a ferroelectric device manufacturing method according to a sixth embodiment of the present invention.
Figure 10:
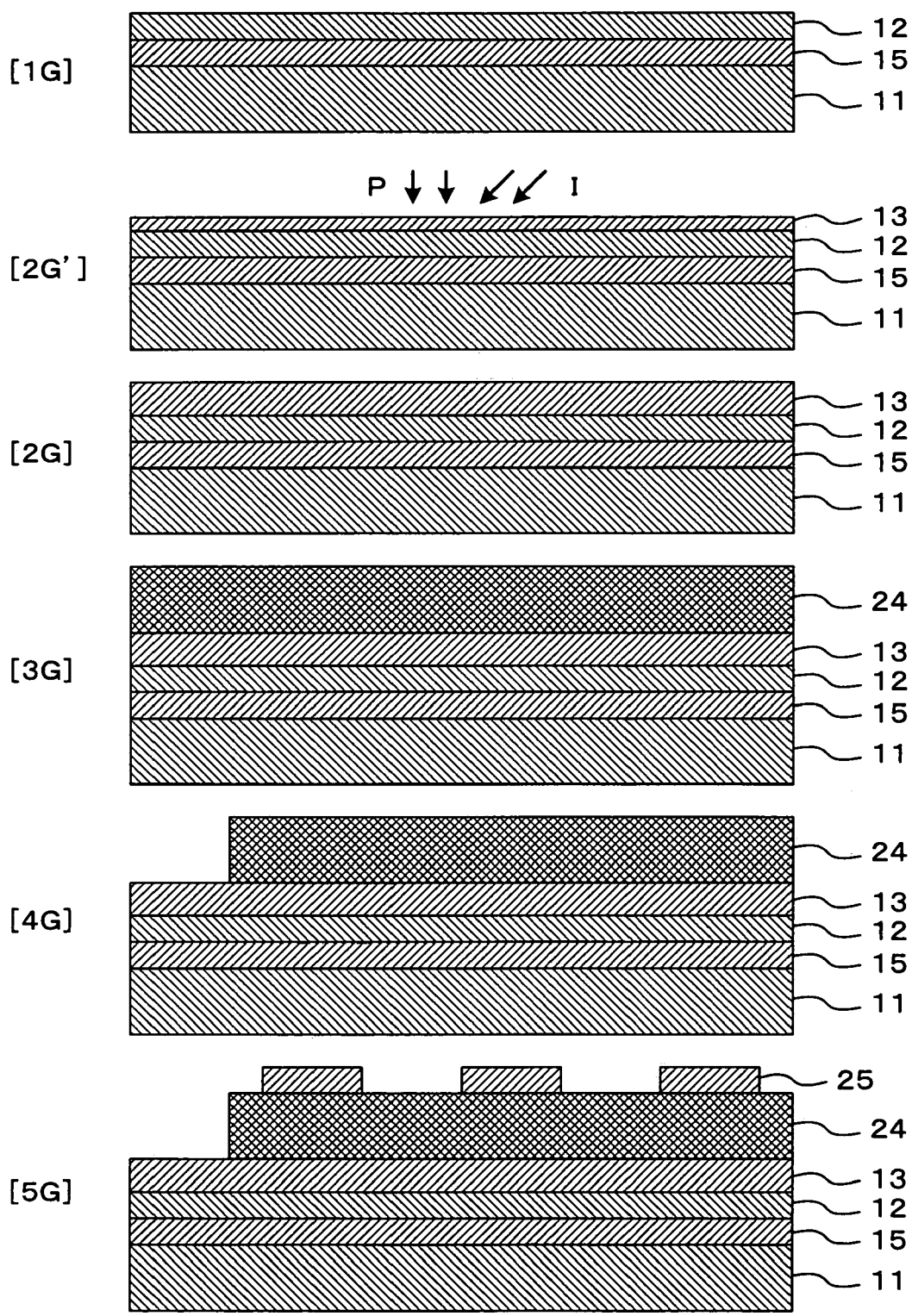
FIG. 10 is a diagram which is used to illustrate a ferroelectric device manufacturing method according to a seventh embodiment of the present invention.
Figure 11:
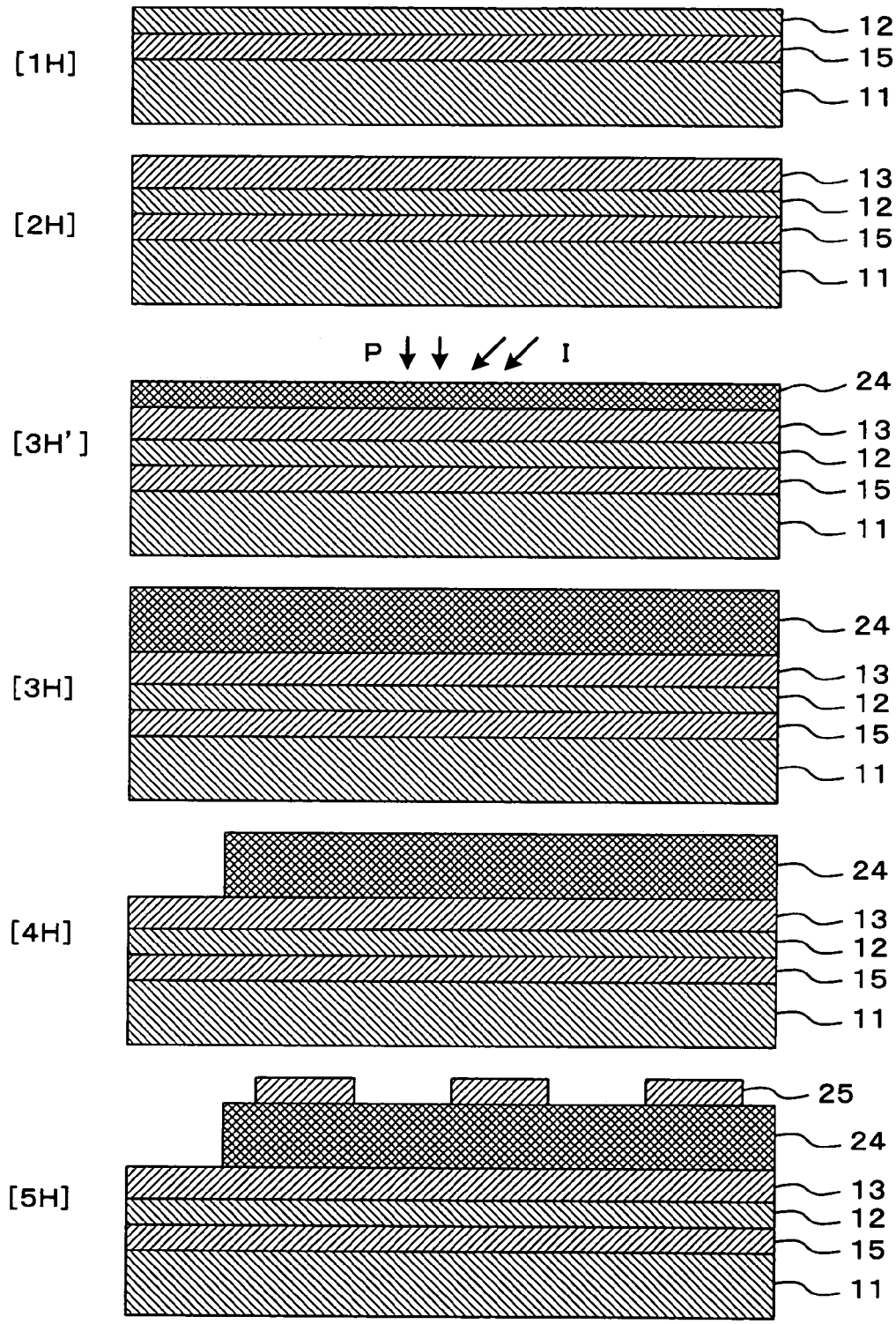
FIG. 11 is a diagram which is used to illustrate a ferroelectric device manufacturing method according to an eighth embodiment of the present invention.

Next, methods for manufacturing capacitors 200 that constitute such ferroelectric devices according to the sixth through eighth embodiments [of the present invention] will be described with reference to FIGS. 9 through 11. FIG. 9 corresponds to the sixth embodiment, FIG. 10 corresponds to the seventh embodiment, and FIG. 11 corresponds to the eighth embodiment.

The manufacturing methods for the capacitors 200 described below [each] comprise a step in which a buffer layer 12 which is an intermediate film is formed on top of the insulating layer 15 (buffer layer formation step), a step in which a bottom electrode 13 is formed on top of the buffer layer 12 (bottom electrode formation step), a step in which a ferroelectric film 24 is formed on top of the bottom electrode 13 (ferroelectric film formation step), a step in which a portion of the ferroelectric film 24 is removed (bottom electrode lead-out step), and a step in which a top electrode 25 is formed on top of the ferroelectric film 24 (top electrode formation step). These respective steps will be described in order below.

First, a substrate 11 which has an insulating layer 15 is prepared. A substrate which has a uniform thickness, and which is free of any warping or scratches, may be appropriately used as this substrate 11. The method used to form the insulating layer 15 is as described above.

[1F'] [1F] [1G] [1H] Buffer Layer Formation Step

First, a buffer layer 12 is formed on top of the insulating layer 15 of the substrate 11. For example, this buffer layer 12 may be formed using a universally known thin film formation method such as a sputtering method, CVD method, MOCVD method, laser ablation method or the like. In particular, in the sixth embodiment which includes a layer with an in-plane orientation formed by an ion beam assist method as a buffer layer 12, this layer can be formed as follows (as shown for example in FIG. 9 [1F'] [1F]).

First, the substrate 11 is mounted in a substrate holder, and is placed inside a vacuum apparatus.

Furthermore, a first target containing the constituent elements of the buffer layer 12 as described above (buffer layer target) is disposed facing the substrate 11 in a position that is separated from the substrate 11 by a specified distance inside the vacuum apparatus. Furthermore, a target which has a composition that is the same as or similar to the composition of the desired buffer layer 12 may be appropriately used as the first target.

Next, when the first target is irradiated with (for example) laser light, atoms including oxygen atoms and metal atoms are knocked out of first the target so that a plume P is generated. In other words, this plume P is directed toward the insulating layer 15. Then, this plume P contacts the surface of the insulating layer 15 (substrate 11).

Furthermore, at substantially the same time, the surface of the insulating layer 15 is irradiated with an ion beam I that is inclined at a specified angle.

As a result, the first layer of a buffer layer 12 which has an in-plane orientation is formed on top of the insulating layer 15 (FIG. 9 [1F']).

Next, while the irradiation of the first target with laser light (i.e., generation of the plume P) is continued, the irradiation with the ion beam (ion beam assist) is stopped for a fixed period of time. As a result, a second layer of the buffer layer 12 is formed by epitaxial growth on top of the abovementioned first layer (FIG. 9 [1F]).

Furthermore, after the irradiation with the ion beam has been stopped, this ion beam irradiation may be re-started, and such re-starting and stopping of the ion beam irradiation may be repeated a multiple number of times.

Furthermore, besides a method in which the surface of the first target is irradiated with laser light, a method in which an argon gas (inert gas) plasma, electron beam or the like is caused to be incident on the surface of the first target can also be employed as the method that is used to knock the abovementioned atoms out of the first target.

Among these methods, a method in which the surface of the first target is irradiated with laser light is especially desirable as the method used to knock the abovementioned atoms out of the first target. If such a method is used, the atoms can be knocked out of the first target easily and reliably using a vacuum apparatus with a simple construction that is equipped with a laser light entry window.

Furthermore, this laser light is preferably pulsed light with a wavelength of approximately 150 to 300 nm and a pulse width of approximately 1 to 100 ns. In concrete terms, examples of laser light that can be used include excimer lasers such as ArF excimer lasers, KrF excimer lasers and XeCl excimer lasers, as well as YAG lasers, $YVO_4$ lasers, $CO_2$ lasers and the like. Among these types of laser light, ArF excimer lasers or KrF excimer lasers are especially desirable as the laser light used. Both ArF excimer lasers and KrF excimer lasers are easy to handle, and can knock atoms out of the first target with greater efficiency.

Meanwhile, there are no particular restrictions on the ion beam that irradiates the surface of the insulating layer 15; for instance, at least one species of ions selected from ions of inert gases such as argon, helium, neon, xenon or krypton, or mixed ions comprising such ions and oxygen ions, may be cited as examples of ions that can be used.

For example, it is desirable to use a Kauffman ion source or the like as the ion source of this ion beam. An ion beam can be generated relatively easily by using this ion source.

Furthermore, there are no particular restrictions on the irradiation angle of the ion beam with respect to the normal direction of the surface of the insulating layer 15 (i.e., the abovementioned specified angle); however, it is desirable to set this angle at approximately 35 to 65°. In particular, in cases where a buffer layer 12 comprising metal oxides with an NaCl structure as the main materials is formed, it is even more desirable to set the abovementioned irradiation angle at approximately 42 to 47°, and in cases where a buffer layer 12 comprising metal oxides with a fluorite structure as the main materials is formed, it is even more desirable to set the abovementioned irradiation angle at approximately 52 to 57°. If the ion beam is set at such an irradiation angle and directed onto the surface of the insulating layer 15, a buffer layer 12 which has a cubic crystal (100) orientation and which is oriented in an in-plane orientation can be formed.

In regard to the respective conditions used in the formation of such a buffer layer 12, it is sufficient if these conditions are such that the buffer layer 12 can be formed with an in-plane orientation; for example, the following conditions may be used.

It is desirable to set the frequency of the laser light at 30 Hz or less, and it is even more desirable to set this frequency at 15 Hz or less.

It is desirable that the energy density of the laser light be set at 0.5 J/cm$^2$ or greater, and it is even more desirable to set this energy density at 2 J/cm$^2$ or greater.

It is desirable that the ion beam acceleration voltage be set at approximately 100 to 300 V, and it is even more desirable to set this acceleration voltage at approximately 150 to 250 V.

Furthermore, it is desirable that the irradiation dose of the ion beam be set at approximately 1 to 30 mA, and it is even more desirable to set this irradiation dose at approximately 5 to 15 mA.

It is desirable that the temperature of the substrate 11 be set at approximately 0 to 100° C., and it is even more desirable to set this temperature at approximately 40 to 70° C.

It is desirable that the distance between the substrate 11 and the first target be set at approximately 30 to 100 mm, and it is even more desirable to set this distance at approximately 50 to 80 mm.

Furthermore, it is desirable that the pressure inside the vacuum apparatus be set at $133 \times 10^{-1}$ Pa ($1 \times 10^{-1}$ Torr) or less, and it is even more desirable to set this pressure at $133 \times 10^{-3}$ Pa ($1 \times 10^{-3}$ Torr) or less.

It is desirable that the mixture ratio of inert gas to oxygen in the atmosphere inside the vacuum apparatus be set in the range of approximately 300:1 to 10:1 (volume ratio), and it is even more desirable to set this ratio in the range of approximately 150:1 to 50:1.

If the respective conditions used in the formation of the buffer layer 12 are set in the abovementioned ranges, the buffer layer 12 can be more efficiently oriented in an in-plane orientation.

In this case, furthermore, the mean thickness of the buffer layer 12 can be adjusted to the abovementioned range by appropriately setting the irradiation time of the laser light and ion beam. This laser light irradiation time varies according to the abovementioned conditions; ordinarily, however, it is desirable to set this time at 200 seconds or less, and it is even more desirable to set this time at 100 seconds or less. In regard to the ion beam irradiation time, a time that is approximately 20 to 80% of the total laser light irradiation time is desirable. It is possible to adjust the thickness of the layer with an in-plane orientation that is formed by the ion beam assist method, and the thickness of the layer whose deposition is continued with the ion beam assist stopped, by adjusting the ion beam irradiation time.

If such a method is used to form the buffer layer 12, a uniformly arranged orientation can be adjusted to any desired direction by the simple method of adjusting the irradiation angle of the ion beam. Furthermore, since the orientation of the buffer layer 12 can thus be arranged with good precision, the following advantage is also obtained: namely, the mean thickness of the buffer layer 12 can be reduced to a smaller value.

The buffer layer 12 is obtained as described above.

[2F] [2G'] [2G] [2H] Bottom Electrode Formation Step

Next, a bottom electrode 13 is formed on top of the buffer layer 12. For example, this bottom electrode 13 can be formed as follows:

First, in the same manner as in the method used to form the buffer layer 12 by an ion beam assist method as described in detail in the abovementioned step [1F'], a second target containing the constituent elements of the bottom electrode 13 described above (bottom electrode target) is disposed facing the buffer layer 12 (substrate 11) in a position that is separated from the substrate 11 by a specified distance. Furthermore, a target which has a composition that is the same as or similar to the composition of the desired bottom electrode 13 may be appropriately used as the second target.

Following the abovementioned step [1F'], [1F] [1G] or [1H], a plume of atoms including the various types of metal atoms (and oxygen atoms in applicable cases) that constitute the bottom electrode is directed onto the surface of the buffer layer 12. Then, a bottom electrode 13 is formed in the form of a film as a result of the contact of this plume with the surface (upper surface) of the buffer layer 12.

It is desirable that this plume be generated by irradiating the surface of the abovementioned second target with laser light in the same manner as in the above-mentioned step [1F'] so that atoms including various types of metal atoms and the like are knocked out of the second target.

As in the case of the abovementioned step [1F'], an ArF excimer laser or KrF excimer laser is suitable for use as this laser light.

Furthermore, particularly in the seventh embodiment which includes a layer with an in-plane orientation formed by an ion beam assist method as the bottom electrode 13, the bottom electrode 13 is formed while the surface of the buffer layer 12 is irradiated with an ion beam I in the same manner as in the abovementioned step [1F']. As a result, the first layer of the bottom electrode 13, which has an in-plane orientation, is formed. Then, while the irradiation of the second target with laser light (generation of the plume P) is continued, the ion beam irradiation (ion beam assist) is stopped for a fixed period of time. As a result, the second layer of the bottom electrode 13 is formed by epitaxial growth on the surface of the abovementioned first layer.

Furthermore, after the ion beam irradiation has been stopped, this ion beam irradiation may be re-started, and the re-starting and stopping of this ion beam irradiation may be repeated a multiple number of times.

Furthermore, in regard to the respective conditions used in the formation of the bottom electrode 13, it is sufficient if these conditions are such that the respective types of metal atoms can reach the surface of the buffer layer 12 at a specified ratio (e.g., composition ratio of metal oxides that have a perovskite structure), and the bottom electrode 13 can be formed. For example, the following conditions may be used.

It is desirable to set the frequency of the laser light at 30 Hz or less, and it is even more desirable to set this frequency at 15 Hz or less.

It is desirable that the energy density of the laser light be set at 0.5 J/cm$^2$ or greater, and it is even more desirable to set this energy density at 2 J/cm$^2$ or greater.

In cases where a step using ion beam irradiation in combination is included, it is desirable that the temperature of the substrate 11 on which a buffer layer 12 has been formed be set at approximately 0 to 100° C., and it is even more desirable to set this temperature at approximately 30 to 70° C.

It is desirable that the distance between the substrate 11 on which a buffer layer 12 has been formed and the second target be set at 30 to 100 mm, and it is even more desirable to set this distance at approximately 50 to 80 mm.

Furthermore, in cases where a step using ion beam irradiation in combination is included, it is desirable that the pressure inside the vacuum apparatus be set at $133 \times 10^{-1}$ Pa ($1 \times 10^{-1}$ Torr) or less, and it is even more desirable to set this pressure at $133 \times 10^{-3}$ Pa ($1 \times 10^{-3}$ Torr) or less. In this case, furthermore, it is desirable that the mixture ratio of inert gas to oxygen in the atmosphere inside the vacuum apparatus be set in the range of approximately 300:1 to 10:1 (volume ratio), and it is even more desirable to set this ratio in the range of approximately 150:1 to 50:1.

If the respective conditions used in the formation of the bottom electrode 13 are set in the abovementioned ranges, the bottom electrode 13 can be formed with good efficiency.

In this case, furthermore, the mean thickness of the bottom electrode 13 can be adjusted to the abovementioned range by appropriately setting the irradiation time of the laser light. This laser light irradiation time varies according to the abovementioned conditions; ordinarily, however, it is desirable to set this time at approximately 3 to 90 minutes, and it is even more desirable to set this time at approximately 15 to 45 minutes. In regard to the ion beam irradiation time, a time that is approximately 20 to 80% of the total laser light irradiation time is desirable. It is possible to adjust the thickness of the layer with an in-plane orientation that is formed by the ion beam assist method, and the thickness of the layer whose deposition is continued with the ion beam assist stopped, by adjusting the ion beam irradiation time.

Furthermore, especially in the first embodiment which includes a layer with an in-plane orientation that is formed by an ion beam assist method as a buffer layer 12, as a result of this bottom electrode formation step, a bottom electrode 13 is epitaxially grown on top of the buffer layer 12 even if ion beam irradiation is not used in combination. In this case, it is desirable that the temperature of the substrate 11 during film formation be set at approximately 300 to 800° C., and it is even more desirable to set this temperature at approximately 400 to 700° C. Furthermore, it is desirable to set the pressure inside the vacuum apparatus in this case at 1 atmosphere or less, and it is desirable to set the oxygen partial pressure at $133 \times 10^{-3}$ Pa ($1 \times 10^{-3}$ Torr) or greater when oxygen gas is supplied, and to set this pressure at $133 \times 10^{-5}$ Pa ($1 \times 10^{-5}$ Torr) or greater when atomic-form oxygen radicals are supplied. Furthermore, the method used to form the bottom electrode 13 in the first embodiment is not limited to this method; a method such as a CVD method, laser ablation [method] or the like may also be used.

Furthermore, especially in the third embodiment which includes a layer with an in-plane orientation formed by an ion beam assist method as a ferroelectric film 24, the [method used to form the] bottom electrode 13 is not limited to the abovementioned method; this electrode can also be formed by a universally known thin film formation method such as a sputtering method, CVD method, MOCVD method, laser ablation method or the like.

The bottom electrode 13 is obtained as described above.

[3F] [3G] [3H'] [3H] Ferroelectric Film Formation Step
Next, a ferroelectric film 24 is formed on top of the bottom electrode 13. For example, this can be accomplished as follows:

First, in the same manner as in method used to form the buffer layer 12 by an ion beam assist method as described in detail in the abovementioned step [1F'], a third target containing the constituent elements of the ferroelectric film 24 as described above (ferroelectric film target) is disposed facing the substrate 11 in a position that is separated from the substrate 11 by a specified distance. Furthermore, a target which has a composition that is the same as or similar to the composition of the desired ferroelectric film 24 may be appropriately used as the third target.

Following the abovementioned step [2F], [2G'], [2G] or [2H], a plume of atoms including oxygen atoms and various types of metal atoms is directed onto the surface of the bottom electrode 13. Then, as a result of the contact of this plume with the surface (upper surface) of the bottom electrode 13, a ferroelectric film 24 which contains ferroelectric materials that have a perovskite structure (as described above) is formed in the form of a film with (for example) a tetragonal crystal (001) orientation.

It is desirable that this plume be generated by irradiating the surface of the abovementioned third target with laser light in the same manner as in the abovementioned step [1F'] so that atoms including oxygen atoms and various types of metal atoms are knocked out of the third target.

As in the case of the abovementioned step [1F'], an ArF excimer laser or KrF excimer laser is suitable for use as this laser light.

Furthermore, especially in the eighth embodiment which includes a layer with an in-plane orientation formed by an ion beam assist method as a ferroelectric film 24, the ferroelectric film 24 is formed while the surface of the bottom electrode 13 is irradiated with an ion beam I in the same manner as in the abovementioned step [1F']. As a result, the first layer of the ferroelectric film 24, which has an in-plane orientation, is formed. Then, while the irradiation of the third target with laser light (i.e., the generation of the plume P) is continued, the ion beam irradiation (ion beam assist) is stopped for a fixed period of time. As a result, the second layer of the ferroelectric film 24 is formed by epitaxial growth on top of the abovementioned first layer. Furthermore, after the ion beam irradiation has been stopped, the ion beam irradiation may be re-started, and such re-starting and stopping of the ion beam irradiation may be repeated a multiple number of times.

Furthermore, in regard to the respective conditions used in the formation of the ferroelectric film 24, it is sufficient if these conditions are such that the respective types of metal atoms can reach the surface of the bottom electrode 13 at a specified ratio (e.g., composition ratio of metal oxides that have a perovskite structure), and the ferroelectric film 24 can be formed. For example, the following conditions may be used.

It is desirable to set the frequency of the laser light at 30 Hz or less, and it is even more desirable to set this frequency at 15 Hz or less.

It is desirable that the energy density of the laser light be set at 0.5 J/cm$^2$ or greater, and it is even more desirable to set this energy density at 2 J/cm$^2$ or greater.

In cases where a step using ion beam irradiation in combination is included, it is desirable that the temperature of the substrate 11 on which a bottom electrode 13 has been formed be set at approximately 0 to 100° C., and it is even more desirable to set this temperature at approximately 30 to 70° C.

It is desirable that the distance between the substrate 11 on which a bottom electrode 13 has been formed and the third target be set at approximately 30 to 100 mm, and it is even more desirable to set this distance at approximately 50 to 80 mm.

Furthermore, in cases where a step using ion beam irradiation in combination is included, it is desirable that the pressure inside the vacuum apparatus be set at $133 \times 10^{-1}$ Pa ($1 \times 10^{-1}$ Torr) or less, and it is even more desirable to set this pressure at $133 \times 10^{-3}$ Pa ($1 \times 10^{-3}$ Torr) or less. In this case, furthermore, it is desirable that the mixture ratio of inert gas to oxygen in the atmosphere inside the vacuum apparatus be set in the range of approximately 300:1 to 10:1 (volume ratio), and it is even more desirable to set this ratio in the range of approximately 150:1 to 50:1.

If the respective conditions used in the formation of the ferroelectric film 24 are set in the abovementioned ranges, the ferroelectric film 24 can be formed with good efficiency.

In this case, furthermore, the mean thickness of the ferroelectric film 24 can be adjusted to the above-mentioned range by appropriately setting the irradiation time of the laser light. This laser light irradiation time varies according to the abovementioned conditions; ordinarily, however, it is desirable to set this time at approximately 3 to 90 minutes, and it is even more desirable to set this time at approximately 15 to 45 minutes. In regard to the ion beam irradiation time, a time that is approximately 20 to 80% of the total laser light irradiation time is desirable. It is possible to adjust the thickness of the layer with an in-plane orientation that is formed by the ion beam assist method, and the thickness of the layer whose deposition is continued with the ion beam assist stopped, by adjusting the ion beam irradiation time.

Furthermore, especially in the first embodiment which includes a layer with an in-plane orientation that is formed by an ion beam assist method as a buffer layer 12, and the second embodiment which includes a layer with an in-plane orientation that is formed by an ion beam assist method as a bottom electrode 13, as a result of this ferroelectric film formation step, a ferroelectric film 24 is epitaxially grown on top of the bottom electrode 13 even if ion beam irradiation is not used in combination. In this case, it is desirable that the temperature of the substrate 11 during film formation be set at approximately 300 to 800° C., and it is even more desirable to set this temperature at approximately 400 to 700° C. Furthermore, it is desirable to set the pressure inside the vacuum apparatus in this case at 1 atmosphere or less, and it is desirable to set the oxygen partial pressure at $133 \times 10^{-3}$ Pa ($1 \times 10^{-3}$ Torr) or greater when oxygen gas is supplied, and to set this pressure at $133 \times 10^{-5}$ Pa ($1 \times 10^{-5}$ Torr) or greater when atomic-form oxygen radicals are supplied. Furthermore, the method used to form the ferroelectric film 24 in the first and second embodiments is not limited to this method; a method such as a CVD method, laser ablation [method] or the like may also be used.

The ferroelectric film 24 is obtained as described above.

[4F] [4G] [4H] Bottom Electrode Lead-Out Step

These steps can be performed in the same manner as the abovementioned step [4A].

[5F] [5G] [5H] Top Electrode Formation Step

These steps can be performed in the same manner as the abovementioned step [5A].

The capacitors 200 according to the abovementioned sixth, seventh or eighth embodiments are respectively manufactured by the abovementioned steps [1F'] through [5F], [1G] through [5G], or [1H] through [5H].

<13. Ferroelectric Device Constructions (9 Through 11)>

Next capacitors which are ferroelectric devices constituting ninth through eleventh embodiments [of the present invention] will be described. The capacitors 200 according to the ninth through eleventh embodiments [of the present invention] have a construction similar to that of the first embodiment shown in FIG. 1.

In particular, the ninth embodiment is an embodiment in which the surface on which the buffer layer 12 constituting an intermediate film is to be formed is irradiated with an ion beam, the tenth embodiment is an embodiment in which the surface on which the bottom electrode 13 is to be formed is irradiated with an ion beam, and the eleventh embodiment is an embodiment in which the surface on which the ferroelectric film 24 is to be formed is irradiated with an ion beam.

Since the surface on which the buffer layer 12 is to be formed in the ninth embodiment, the surface on which the bottom electrode 13 is to be formed in the tenth embodiment and the surface on which the surface on which the ferroelectric film 24 is to be formed in the eleventh embodiment are all surface-treated by irradiation with an ion beam, [crystals] in which the crystal planes are oriented in a specified direction remain on these surfaces, while other [crystals] are etched away. Accordingly, the buffer layer 12 in the ninth embodiment, the bottom electrode 13 in the ninth and tenth embodiments and the ferroelectric film 24 in the ninth, tenth and eleventh embodiments respectively undergo crystal growth while being influenced by the underlayers, so that all of these layers are formed as layers with a good orientation. In cases where these layers are epitaxially grown on the respective underlayers, layers with a better orientation are obtained.

<13-1. Substrate>

The substrate 11 has the function of supporting the buffer layer 12, bottom electrode 13 and the like, and is constructed from a flat-plate-form member.

For example, an Si substrate, an SOI (Si on insulator) substrate or the like may be used as the substrate 11. In this case, a substrate whose surface is covered by an SiO$_2$ film which is a natural oxidation film or thermal oxidation film may, or by various types of metal materials or the like such as silicon nitride, silicon nitride oxide, zirconium oxide or the like, may be used.

Furthermore, the substrate 11 may also be constructed from various types of resin substrates, various types of glass substrates or the like. In such cases, a substrate constructed from various types of glass materials or various types of resin materials, e.g., polyolefins such as polyethylenes, polypropylenes, ethylene-propylene copolymers, ethylene-vinyl acetate copolymers (EVA) or the like, ring-form polyolefins, modified polyolefins, polyvinyl chlorides, polyvinylidene chlorides, polystyrenes, polyamides, polyimides, polyamidoimides, polycarbonates, poly-(4-methylpentene-1)s, ionomers, acrylic resins, polymethyl methacrylates, acrylonitrile-butadiene-styrene copolymers (ABS resins), acrylonitrile-styrene copolymers (AS resins), butadiene-styrene copolymers, polyoxymethylenes, polyvinyl alcohols (PVA), ethylene-vinyl alcohol copolymers (EVOH), polyester such as polyethylene terephthalates (PET), polybutylene terephthalates (PBT), polycyclohexane terephthalates (PCT) or the like, polyethers, polyether ketones (PEK), polyether ether ketones (PEEK), polyether imides, polyacetals (POM), polyphenylene oxides, modified polyphenylene oxides, polysulfones, polyether sulfones, polyphenylene sulfides, polyallylates, aromatic polyesters (liquid crystal polymers), polytetrafluoroethylenes, polyvinylidene fluorides and other fluororesins, various types of thermoplastic elastomers such as styrene type, polyolefin type, polyvinyl chloride type, polyurethane type, polyester type, polyamide type, polybutadiene type, transpolyisoprene type, fluoro-rubber type, chlorinated polyethylene type elastomers and the like, epoxy resins, phenol resins, urea resins, melamine resins, unsaturated polyesters, silicone resins, polyurethanes and the like, or copolymers, blends, polymer alloys or the like consisting mainly of these polymers, may be used as the substrate 11.

Such Si substrates, SOI substrates, various types of resin substrates, various types of glass substrates and the like are all commonly used substrates. Accordingly, the manufacturing cost of the ferroelectric device can be reduced by using such substrates as the substrate 11.

There are no particular restrictions on the mean thickness of the substrate 11; however, it is desirable that this mean thickness be approximately 10 μm to 1 mm, and a mean thickness of approximately 100 to 600 μm is even more desirable. By setting the mean thickness of the substrate 11 within the abovementioned range, it is possible to make the ferroelectric device thinner (i.e., to reduce the size of the ferroelectric device) while ensuring a sufficient strength.

An insulating layer 15 comprising a thin film is formed on top of the substrate 11. There are no particular restrictions on the composition of this insulating layer 15; however, for example, a composition that contains metal oxides with an NaCl structure is desirable, and a composition that contains such metal oxides as the main materials is even more desirable.

Examples of metal oxides with an NaCl structure include MgO, CaO, SrO, BaO, MnO, FeO, CoO, NiO and solid solutions containing these compounds; in particular, it is desirable to use at least one substance selected from a set comprising MgO, CaO, SrO, BaO, NiO and solid solutions containing these compounds.

Furthermore, the insulating layer 15 may have any of the following orientations: e.g., a cubic crystal (100) orientation, a cubic crystal (110) orientation, a cubic crystal (111) orientation or the like. Among these orientations, however, a cubic crystal (100) orientation is especially desirable. By setting the orientation of the insulating layer 15 as a cubic crystal (100) orientation, it is possible to set the mean thickness of the insulating layer 15 at a relatively small value. Accordingly, even in cases where the insulating layer 15 is constructed from a metal oxide with an NaCl structure which shows deliquescence such as MgO, CaO, SrO or BaO, the problem of deterioration caused by moisture in the air during manufacture or during use can be appropriately prevented, so that a ferroelectric device suitable for practical use can be obtained.

From such a standpoint, it is desirable to form the insulating layer 15 with as small a thickness as possible. In concrete terms, it is desirable that the mean thickness be 10 nm or less, and a mean thickness of 5 nm or less is even more desirable. As a result, the abovementioned effect is improved.

Furthermore, if the mean thickness of the insulating layer 15 is thus set at a small value, the following advantage is also obtained: e.g., in cases where a ferroelectric memory is manufactured, thin capacitors (e.g., with a thickness on the order of 10 nm) can be manufactured.

<13-2. Buffer Layer>

A buffer layer 12 comprising a thin film is formed on top of the insulating layer 15.

By installing such a buffer layer 12, it is possible to obtain superior adhesion (bonding) between the insulating layer 15 and the bottom electrode 13.

In regard to the composition of such a buffer layer 12, for example, a compound with a fluorite structure such as yttria-stabilized zirconia, $CeO^2$, $ZrO_2$, $ThO_2$, $UO_2$, $HfO_2$ or the like, a c-type rare earth oxide such as $Y_2O_3$ or the like, a material with a high Young's modulus and high rigidity such as $Si_3N_4$, SiC, diamond, alumina or the like, a transition metal oxide such as $Ta_2O_5$, $Cr_2O_3$, $Nb_2O_5$ or the like, an insulating compound oxide such as $LiTaO_3$, $MgAl_2O_4$ or the like, a conductive compound oxide such as $LaCoO_3$, $LaSrCuO_4$, $LaCaMnO_3$ or the like, or a compound with an NaCl structure such as MgO, CaO, SrO, BaO, MnO, FeO, CoO, NiO or the like is desirable.

In particular, $CeO_2$, $ZrO_2$, $HfO_2$ and solid solutions of these compounds are desirable as compounds with a fluorite structure. Such metal oxides with a fluorite structure show especially little lattice mismatching with metal oxides that have a perovskite structure.

In particular, MgO, CaO, SrO, BaO, NiO and solid solutions of these compounds are desirable as compounds that have an NaCl structure. Such metal oxides with an NaCl structure show especially little lattice mismatching with metal oxides that have a perovskite structure.

The buffer layer 12 may have any of the following orientations: e.g., a cubic crystal (100) orientation, a cubic crystal (110) orientation, a cubic crystal (111) orientation or the like. Among these orientations, however, a cubic crystal (100) orientation is especially desirable. By setting the orientation of the buffer layer 12 as a cubic crystal (100) orientation, it is possible to set the mean thickness of the buffer layer 12 at a relatively small value. Accordingly, even in cases where the buffer layer 12 is constructed from a metal oxide with an NaCl structure which shows deliquescence such as MgO, CaO, SrO or BaO, the problem of deterioration caused by moisture in the air during manufacture or during use can be appropriately prevented, so that a ferroelectric device suitable for practical use can be obtained.

From such a standpoint, it is desirable to form the buffer layer 12 with as small a thickness as possible. In concrete terms, it is desirable that the mean thickness be 10 nm or less, and a mean thickness of 5 nm or less is even more desirable. As a result, the abovementioned effect is improved.

Furthermore, if the mean thickness of the buffer layer 12 is thus set at a small value, the following advantage is also obtained: e.g., in cases where a ferroelectric memory is manufactured, thin capacitors (e.g., with a thickness on the order of 10 nm) that are required as the design rule of this ferroelectric memory becomes finer can be manufactured.

Furthermore, in the ninth embodiment, in which the surface on which the buffer layer 12 is to be formed is oriented in an in-plane orientation by irradiation with an ion beam, the buffer layer 12 undergoes crystal growth while being influenced by the underlayer, so that the orientation is uniformly arranged.

<13-3. Bottom Electrode>

A bottom electrode 13 is formed on top of the buffer layer 12. In regard to the composition of this bottom electrode 13, it is desirable that the electrode be constructed from a metal material such as Pt, Ir, Ti, Rh, Ru or the like. A plurality of layers of such metal materials may also be formed. For example, the bottom electrode [may be] constructed with a layer structure of Ti with a thickness of 20 nm/Ir with a thickness of 20 nm/Pt with a thickness of 140 nm.

Furthermore, the composition of the bottom electrode 13 may include metal oxides that have a perovskite structure. In this case, the composition of the electrode preferably includes metal oxides with a perovskite structure as the main materials.

Examples of metal oxides that have a perovskite structure include $CaRuO_3$, $SrRuO_3$, $BaRuO_3$, $SrVO_3$, $(La,Sr)MnO_3$, $(La,Sr)CrO_3$, $(La,Sr)CoO_3$, $LaNiO_x$, $YBa_2Cu_3O_x$ and solid solutions that contain these oxides. These metal oxides that have a perovskite structure are superior in terms of conductivity and chemical stability. Accordingly, the bottom electrode 13 can also be formed as an electrode that is superior in terms of conductivity and chemical stability.

The bottom electrode 13 with a perovskite structure may have any of the following crystal orientations: e.g., a quasi-cubic crystal (100) orientation, quasi-cubic crystal (110) orientation, quasi-cubic crystal (111) orientation or the like. Among these, however, an electrode with a quasi-cubic crystal (100) orientation or quasi-cubic crystal (110) orientation is especially desirable.

Furthermore, there are no particular restrictions on the mean thickness of the bottom electrode 13; however, it is desirable to set this mean thickness at approximately 10 to 300 nm, and a mean thickness of approximately 50 to 150 nm is even more desirable. As a result, the bottom electrode 13 can exhibit a sufficient function as an electrode, and an increase in the size of the ferroelectric device can also be prevented.

Furthermore, in the ninth embodiment, in which the surface on which the buffer layer 12 is to be formed is oriented in an in-plane orientation by irradiation with an ion beam, since the orientation of the buffer layer 12 is uniformly arranged as described above, the bottom electrode 13 undergoes crystal growth while being influenced by the underlayer, so that the orientation [of this bottom electrode 13] is uniformly arranged.

Furthermore, in the tenth embodiment, in which the surface on which the bottom electrode 13 is to be formed is oriented in an in-plane orientation by irradiation with an ion beam, the bottom electrode 13 undergoes crystal growth while being influenced by the underlayer, so that the orientation [of this bottom electrode 13] is uniformly arranged.

<13-4. Ferroelectric Film>

A ferroelectric film 24 is formed on top of this bottom electrode 13.

In the ninth embodiment in which the surface on which the buffer layer 12 is to be formed is oriented in an in-plane orientation by irradiation with an ion beam, and the tenth embodiment in which the surface on which the bottom electrode 13 is to be formed is oriented in an in-plane orientation by irradiation with an ion beam, since the orientation of the bottom electrode 13 is uniformly arranged as described above, the ferroelectric film 24 has a uniformly arranged orientation as a result of the formation of this ferroelectric film 24 on top of such a bottom electrode 13. In particular, it is desirable that the ferroelectric film 24 be formed on top of the bottom electrode 13 by epitaxial growth.

Furthermore, in the eleventh embodiment, in which the surface on which the ferroelectric film 24 is to be formed is oriented in an in-plane orientation by irradiation with an ion beam, the orientation of the ferroelectric film 24 is uniformly arranged.

Accordingly, in all of the ninth through eleventh embodiments, the capacitor 200 shows (for example) an increase in residual polarization, a decrease in the counter electric field and the like. In other words, various characteristics of the capacitor 200 are improved. Accordingly, in cases where a ferroelectric memory is manufactured using such a capacitor 200, this ferroelectric memory can be formed as a memory that is superior in terms of the angularity of the hysteresis curve.

The ferroelectric film 24 can be constructed from various types of ferroelectric materials. However, it is desirable that this film contain ferroelectric materials that have a perovskite structure, and a ferroelectric film in which ferroelectric materials that have a perovskite structure are the main materials is even more desirable. Furthermore, such ferroelectric materials that have a perovskite structure may be either materials that have a tetragonal (001) orientation or materials that have a rhombohedral crystal (100) orientation. In particular, materials that have a tetragonal crystal (001) orientation are especially desirable. As a result, the above-mentioned effect is improved.

Examples of ferroelectric materials which have such a perovskite structure include metal oxides with a perovskite structure such as $Pb(Zr,Ti)O_3$ (PZT), $(Pb,La)(Zr,Ti)O_3$ (PLZT), $(Ba,Sr)TiO_3$ (BST), $BaTiO_3$, $KNbO_3$, $Pb(Zn,Nb)O_3$ (PZN), $Pb(Mg,Nb)O_3$ (PMN), $PbFeO_3$ and $PbWO_3$, Bi layer-form compounds such as $SrBi_2(Ta,Nb)_2O_9$ and $(Bi,La)_4Ti_3O_{12}$, and solid solutions that contain such compounds (PMN-PT, PZN-PT and the like).

Furthermore, in cases where the bottom electrode 13 is an electrode which contains metal oxides that have a perovskite structure (especially an electrode which contains metal oxides that have a perovskite structure as the main materials [of the electrode]), the metal oxides that have such a perovskite structure show little lattice mismatching with ferroelectric materials that have a perovskite structure. Accordingly, the ferroelectric film 24 can be easily and reliably grown with a tetragonal crystal (001) orientation (by epitaxial growth) on top of the bottom electrode 13. Furthermore, the ferroelectric film 24 thus obtained shows improved bonding characteristics with the bottom electrode 13.

Furthermore, there are no particular restrictions on the mean thickness of the ferroelectric film 24; however, a mean thickness of approximately 50 to 300 nm is desirable, and a mean thickness of approximately 100 to 200 nm is even more desirable. By setting the mean thickness of the ferroelectric film 24 in the abovementioned range, it is possible to form a capacitor 200 that can exhibit various characteristics in a favorable manner while preventing an increase in the size of the capacitor 200.

<13-5. Top Electrode>

A comb-form (or band-form) top electrode 25 is formed on top of the ferroelectric film 24.

A single material or a combination of two or more materials selected from a set comprising (e.g.) Pt, Ir, Au, Ag, Ru, alloys containing these metals and the like can be used as the constituent material of this top electrode 25.

Furthermore, there are no particular restrictions on the mean thickness of the top electrode 25; however, it is desirable that this thickness be approximately 10 to 300 nm, and a thickness of approximately 50 to 150 nm is even more desirable.

<14. Ferroelectric Device Manufacturing Methods (9 Through 11)>

Figure 12:
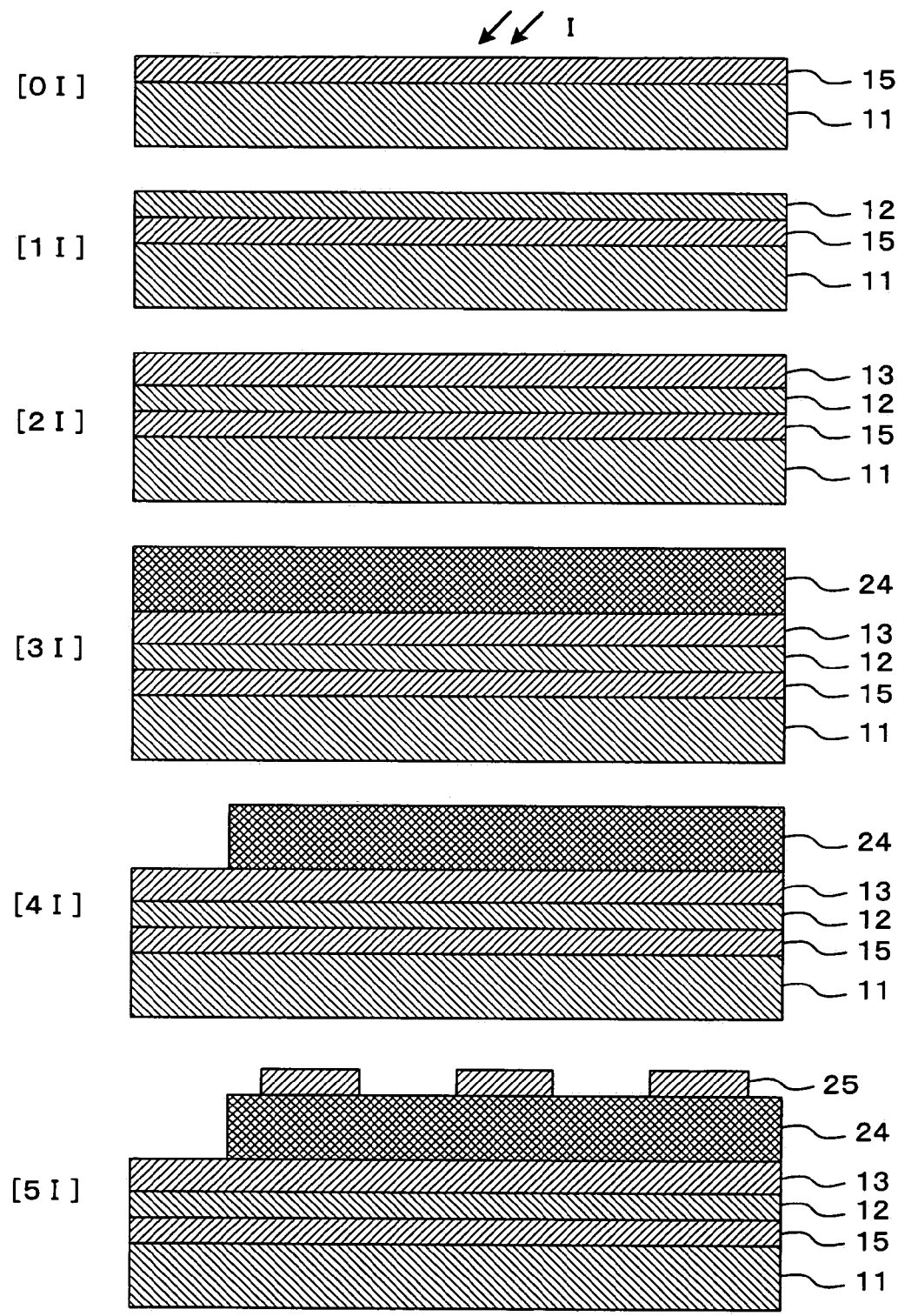
FIG. 12 is a diagram which is used to illustrate a ferroelectric device manufacturing method according to a ninth embodiment of the present invention.
Figure 13:
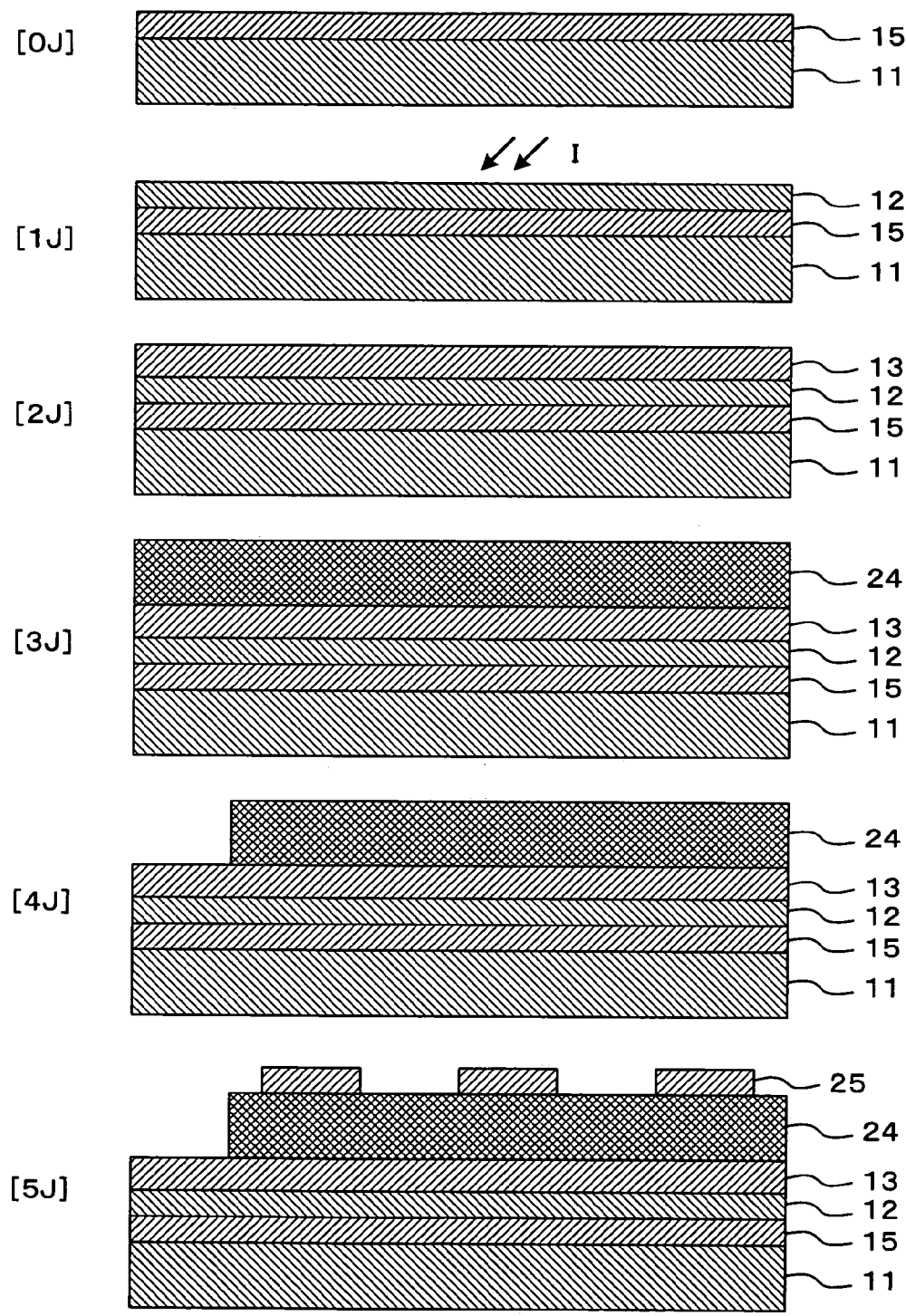
FIG. 13 is a diagram which is used to illustrate a ferroelectric device manufacturing method according to a tenth embodiment of the present invention.
Figure 14:
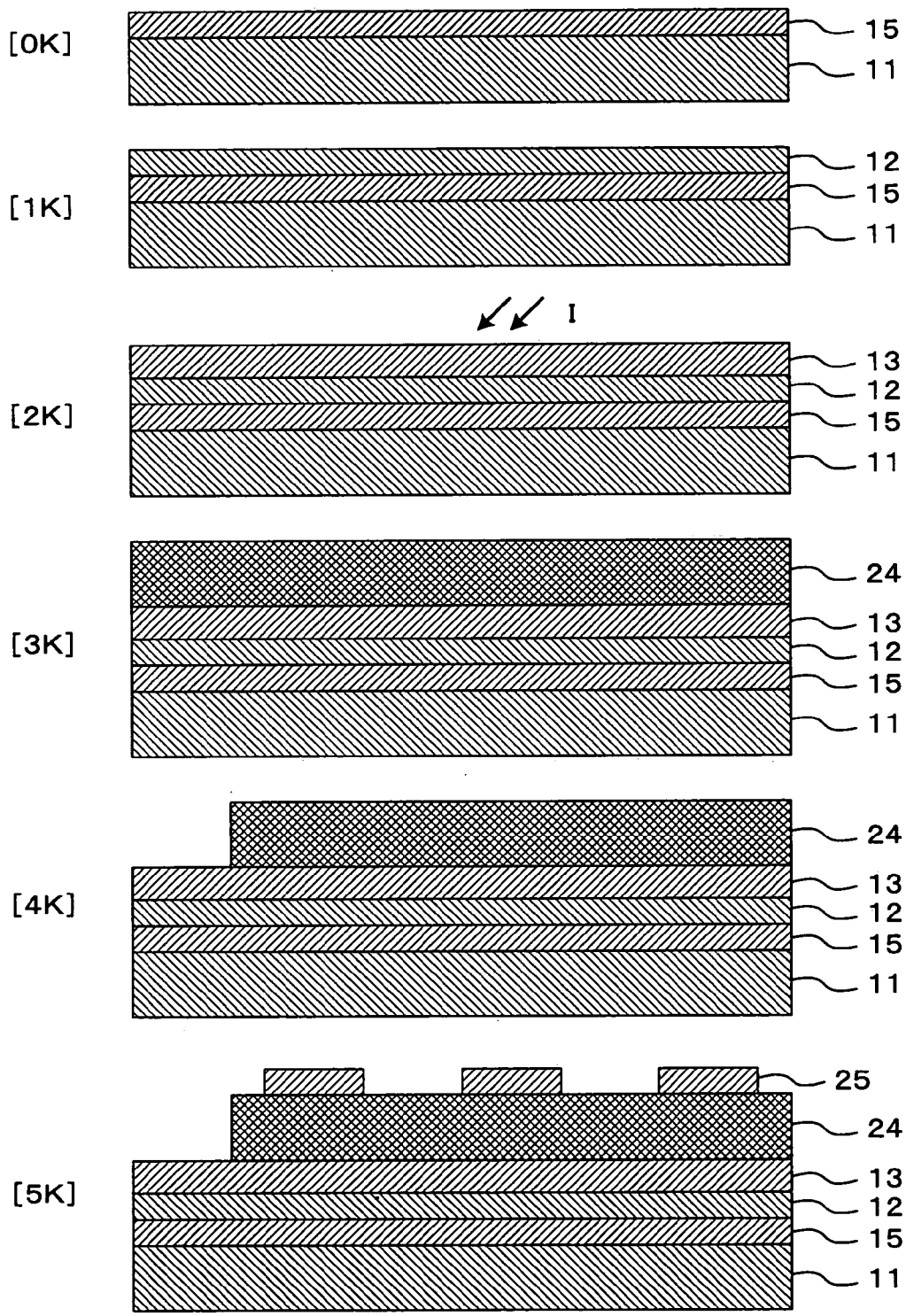
FIG. 14 is a diagram which is used to illustrate a ferroelectric device manufacturing method according to an eleventh embodiment of the present invention.

Next, manufacturing methods for capacitors 200 constituting such ferroelectric devices according to ninth through eleventh embodiments [of the present invention] will be described with reference to FIGS. 12 through 14. FIG. 12 corresponds to the ninth embodiment, FIG. 13 corresponds to the tenth embodiment, and FIG. 14 corresponds to the eleventh embodiment.

The methods for manufacturing the capacitors 200 described below [each] comprise a step in which an insulating layer 15 is formed on top of the substrate 11 (insulating layer formation step), a step in which a buffer layer 12 which is an intermediated film is formed [on top of the substrate 11] (buffer layer 12 formation step), a step in which a bottom electrode 13 is formed on top of the buffer layer 12 (bottom electrode formation step), a step in which a ferroelectric film 24 is formed on top of the bottom electrode 13 (ferroelectric film formation step), a step in which a portion of the ferroelectric film 24 is removed (bottom electrode lead-out step), and a step in which a top electrode 25 is formed on top of the ferroelectric film 24 (top electrode formation step). These respective steps will be described in order below.

First, a substrate 11 is prepared. A substrate which has a uniform thickness, and which is free of any warping or scratches, may be appropriately used as this substrate 11.

[0I] [0J] [0K] Insulating Layer Formation Step

First, an insulating layer 15 is formed on the substrate 11. For example, this insulating layer 15 can be formed by a universally known thin film formation method such as a sputtering method, CVD method, MOCVD method, laser ablation method or the like.

[1I] [1J] [1K] Buffer Layer Formation Step

Next, a buffer layer 12 is formed on top of the insulating layer 15. For example, this buffer layer 12 can be formed as follows:

First, the substrate 11 is mounted in a substrate holder, and is placed inside a vacuum apparatus.

Furthermore, a first target containing the constituent elements of the buffer layer 12 as described above (buffer layer target) is disposed facing the substrate 11 in a position that is separated from the substrate 11 by a specified distance inside the vacuum apparatus. Furthermore, a target with a composition that is the same as or similar to the composition of the desired buffer layer 12 may be appropriately used as the first target.

In the ninth embodiment, in which the surface on which the buffer layer 12 is to be formed is irradiated with an ion beam, the surface of the insulating layer 15 is irradiated with an ion beam I that is inclined at a specified angle prior to the formation of the buffer layer 12 (FIG. 12 [0I]).

There are no particular restrictions on the ion beam that irradiates the surface of the insulating layer 15; for instance, at least one species of ions selected from ions of inert gases such as argon, helium, neon, xenon or krypton, or mixed ions comprising such ions and oxygen ions, may be cited as examples of ions that can be used.

For example, it is desirable to use a Kauffman ion source or the like as the ion source of this ion beam. An ion beam can be generated relatively easily by using this ion source.

Furthermore, there are no particular restrictions on the irradiation angle of the ion beam with respect to the normal direction of the surface of the insulating layer 15 (i.e., the abovementioned specified angle); however, it is desirable to set this angle at approximately 35 to 65°. In particular, in cases where the insulating layer 15 comprises metal oxides with an NaCl structure as the main materials, it is even more desirable to set the abovementioned irradiation angle at approximately 42 to 47°, and in cases where the insulating layer 15 comprises metal oxides with a fluorite structure as the main materials, it is even more desirable to set the abovementioned irradiation angle at approximately 52 to 57°. If the ion beam is set at such an irradiation angle and directed onto the surface of the insulating layer 15, the surface of the insulating layer 15 can be oriented in an in-plane orientation.

It is desirable that the ion beam acceleration voltage be set at approximately 100 to 300 V, and it is even more desirable to set this acceleration voltage at approximately 150 to 250 V.

Furthermore, it is desirable that the irradiation dose of the ion beam be set at approximately 1 to 30 mA, and it is even more desirable to set this irradiation dose at approximately 5 to 15 mA.

Next, when the first target is irradiated with (for example) laser light, atoms including oxygen atoms and metal atoms are knocked out of the first target so that a plume is generated. In other words, this plume is directed toward the insulating layer 15. Then, this plume contacts the surface of the insulating layer 15 (substrate 11), so that a buffer layer 12 is formed ([1I] [1J] [1K]). Such formation of a buffer layer 12 by target irradiation can be used as a common method in the ninth through eleventh embodiments.

Furthermore, besides a method in which the surface of the first target is irradiated with laser light, a method in which an argon gas (inert gas) plasma, electron beam or the like is caused to be incident on the surface of the first target can also be employed as the method that is used to knock the abovementioned atoms out of the first target.

Among these methods, a method in which the surface of the first target is irradiated with laser light is especially desirable as the method used to knock the abovementioned atoms out of the first target. If such a method is used, the atoms can be knocked out of the first target easily and reliably using a vacuum apparatus with a simple construction that is equipped with a laser light entry window.

Furthermore, this laser light is preferably pulsed light with a wavelength of approximately 150 to 300 nm and a pulse width of approximately 1 to 100 ns. In concrete terms, examples of laser light that can be used include excimer lasers such as ArF excimer lasers, KrF excimer lasers and XeCl excimer lasers, as well as YAG lasers, YVO$_4$ lasers, CO$_2$ lasers and the like. Among these types of laser light, ArF excimer lasers or KrF excimer lasers are especially desirable as the laser light used. Both ArF excimer lasers and KrF excimer lasers are easy to handle, and can knock atoms out of the first target with greater efficiency.

In regard to the respective conditions used in the formation of such a buffer layer 12, for example, these conditions may be set as follows:

It is desirable that the frequency of the laser light be set at 30 Hz or less, and it is even more desirable to set this frequency at 15 Hz or less.

It is desirable that the energy density of the laser light be set at 0.5 J/cm$^2$ or greater, and it is even more desirable to set this energy density at 2 J/cm$^2$ or greater.

It is desirable that the temperature of the substrate 11 be set at approximately 0 to 100° C., and it is even more desirable to set this temperature at approximately 40 to 70° C.

It is desirable that the distance between the substrate 11 and the first target be set at approximately 30 to 100 mm, and it is even more desirable to set this distance at approximately 50 to 80 mm.

Furthermore, it is desirable that the pressure inside the vacuum apparatus be set at $133\times10^{-1}$ Pa ($1\times10^{-1}$ Torr) or less, and it is even more desirable to set this pressure at $133\times10^{-3}$ Pa ($1\times10^{-3}$ Torr) or less.

It is desirable that the mixture ratio of inert gas to oxygen in the atmosphere inside the vacuum apparatus be set in the range of approximately 300:1 to 10:1 (volume ratio), and it is even more desirable to set this ratio in the range of approximately 150:1 to 50:1.

If the respective conditions used in the formation of the buffer layer 12 are set in the abovementioned ranges, the buffer layer 12 can be formed more efficiently by epitaxial growth.

In this case, furthermore, the mean thickness of the buffer layer 12 can be adjusted to the abovementioned range by appropriately adjusting the irradiation time of the laser light. This laser light irradiation time varies according to the abovementioned conditions; ordinarily, however, it is desirable to set this time at 200 seconds or less, and it is even more desirable to set this time at 100 seconds or less.

The buffer layer 12 is obtained as described above.

[2I] [2J] [2K] Bottom Electrode Formation Step

Next, a bottom electrode 13 is formed on top of the buffer layer 12. For example, this bottom electrode 13 can be formed as follows:

First, in the same manner as in the method used to form the insulating layer 15 and buffer layer 12 described in detail in the abovementioned step [1I], a second target containing the constituent elements of the bottom electrode 13 as described above (bottom electrode target) is disposed facing the buffer layer 12 (substrate 11) in a position that is separated from the substrate 11 by a specified distance inside the vacuum apparatus. Furthermore, a target which has a composition that is the same as or similar to the composition of the desired bottom electrode 13 may be appropriately used as the second target.

Following the abovementioned step [1I], [1J] or [1K], a plume of atoms including the various types of metal atoms that constitute the bottom electrode (and oxygen atoms in applicable cases) is directed onto the surface of the buffer layer 12. Then, a bottom electrode 13 is formed in the form of a film as a result of the contact of this plume with the surface (upper surface) of the buffer layer 12.

It is desirable that this plume be generated by irradiating the surface of the abovementioned second target with laser light in the same manner as in the above-mentioned step [1I] so that atoms including various types of metal atoms and the like are knocked out of the second target.

As in the case of the abovementioned step [1I], an ArF excimer laser or KrF excimer laser is suitable for use as such laser light.

Furthermore, especially in the tenth embodiment in which the surface on which the bottom electrode 13 is to be formed is irradiated with an ion beam, the surface of the buffer layer 12 is irradiated with an ion beam I in the same manner as in the abovementioned step [0I] or [1I] prior to the formation of the bottom electrode 13, and the bottom electrode 13 is then form. As a result, the bottom electrode 13 is formed by epitaxial growth on the buffer layer 12 which is oriented in an in-plane orientation.

Furthermore, in regard to the respective conditions used in the formation of the bottom electrode 13, it is sufficient if these conditions are such that the respective types of metal atoms can reach the surface of the buffer layer 12 at a specified ratio (e.g., composition ratio of metal oxides that have a perovskite structure), and the bottom electrode 13 has an in-plane orientation. For example, the following conditions may be used.

It is desirable to set the frequency of the laser light at 30 Hz or less, and it is even more-desirable to set this frequency at 15 Hz or less.

It is desirable that the energy density of the laser light be set at 0.5 J/cm$^2$ or greater, and it is even more desirable to set this energy density at 2 J/cm$^2$ or greater.

It is desirable that the distance between the substrate 11 on which a buffer layer 12 has been formed and the second target be set at approximately 30 to 100 mm, and it is even more desirable to set this distance at approximately 50 to 80 mm. It is desirable that the mixture ratio of inert gas to oxygen in the atmosphere inside the vacuum apparatus be set in the range of approximately 300:1 to 10:1 (volume ratio), and it is even more desirable to set this ratio in the range of approximately 150:1 to 50:1.

If the respective conditions used in the formation of the bottom electrode 13 are set in the abovementioned ranges, the bottom electrode 13 can be formed with good efficiency.

In this case, furthermore, the mean thickness of the bottom electrode 13 can be adjusted to the range described above by appropriately setting the laser light irradiation time. This laser light irradiation time varies according to the abovementioned conditions; ordinarily, however, it is desirable to set this time at approximately 3 to 90 minutes, and it is even more desirable to set this time at approximately 15 to 45 minutes.

Furthermore, it is desirable that the temperature of the substrate 11 on which a bottom electrode 13 has been formed be set at approximately 300 to 800° C., and it is even more desirable to set this temperature at approximately 400 to 700° C. Furthermore, it is desirable that the pressure inside the vacuum apparatus in this case be 1 atmosphere or less; in particular, it is desirable to set the oxygen partial pressure at $133\times10^{-3}$ Pa ($1\times10^{-3}$ Torr) or greater when oxygen gas is supplied, and to set this pressure at $133\times10^{-5}$ Pa ($1\times10^{-5}$ Torr) or greater when atomic-form oxygen radicals are supplied.

Furthermore, especially in the third embodiment in which the surface on which the ferroelectric film 24 is to be formed is irradiated with an ion beam, [the method used to form] the bottom electrode 13 is not limited to the above-mentioned method; for example, this electrode can be formed by a universally known thin film formation method such as a sputtering method, CVD method, MOCVD method, laser ablation method or the like.

The bottom electrode 13 is obtained as described above.

[3I] [3J] [3K] Ferroelectric Film Formation Step

Next, a ferroelectric film 24 is formed on top of the bottom electrode 13. For example, this can be accomplished as follows:

First, in the same manner as in method used to form the buffer layer 12 as described in detail in the above-mentioned step [1I], a third target containing the constituent elements of the ferroelectric film 24 as described above (ferroelectric film target) is disposed facing the substrate 11 in a position that is separated from the substrate 11 by a specified distance. Furthermore, a target which has a composition that is the same as or similar to the composition of the desired ferroelectric film 24 may be appropriately used as the third target.

Following the abovementioned step [2I], [2J] or [2K], a plume of atoms including oxygen atoms and various types of metal atoms is directed onto the surface of the bottom electrode 13. Then, as a result of the contact of this plume with the surface (upper surface) of the bottom electrode 13, a ferroelectric film 24 which contains ferroelectric materials that have a perovskite structure (as described above) is formed in the form of a film with (for example) a tetragonal crystal (001) orientation.

It is desirable that this plume be generated by irradiating the surface of the abovementioned third target with laser light in the same manner as in the abovementioned step [1I] so that atoms including oxygen atoms and various types of metal atoms are knocked out of the third target.

As in the case of the abovementioned step [1I], an ArF excimer laser or KrF excimer laser is suitable for use as this laser light.

Furthermore, in regard to the respective conditions used in the formation of the ferroelectric film 24, it is sufficient if these conditions are such that the respective types of metal atoms can reach the surface of the bottom electrode 13 at a specified ratio (e.g., composition ratio of metal oxides that have a perovskite structure), and the ferroelectric film 24 can be formed. For example, the following conditions may be used.

It is desirable to set the frequency of the laser light at 30 Hz or less, and it is even more desirable to set this frequency at 15 Hz or less.

It is desirable that the energy density of the laser light be set at 0.5 J/cm$^2$ or greater, and it is even more desirable to set this energy density at 2 J/cm$^2$ or greater.

It is desirable that the temperature of the substrate 11 on which a bottom electrode 13 has been formed be set at approximately 300 to 800° C., and it is even more desirable to set this temperature at approximately 400 to 700° C. It is desirable that the distance between the substrate 11 on which a bottom electrode 13 has been formed and the third target be set at approximately 30 to 100 mm, and it is even more desirable to set this distance at approximately 50 to 80 mm.

Furthermore, it is desirable to set the pressure inside the vacuum apparatus in this case at 1 atmosphere or less, and it is desirable to set the oxygen partial pressure at $133 \times 10^{-3}$ Pa ($1 \times 10^{-3}$ Torr) or greater when oxygen gas is supplied, and to set this pressure at $133 \times 10^{-5}$ Pa ($1 \times 10^{-5}$ Torr) or greater when atomic-form oxygen radicals are supplied.

If the respective conditions used in the formation of the ferroelectric film 24 are set in the abovementioned ranges, the ferroelectric film 24 can be formed with good efficiency.

In this case, furthermore, the mean thickness of the ferroelectric film 24 can be-adjusted to the above-mentioned range by appropriately setting the laser light irradiation time. This laser light irradiation time varies according to the abovementioned conditions; ordinarily, however, it is desirable to set this time at approximately 3 to 90 minutes, and it is even more desirable to set this time at approximately 15 to 45 minutes.

Furthermore, especially in the ninth embodiment in which the surface on which the buffer layer 12 is to be formed is oriented in an in-plane orientation by irradiation with an ion beam, and the tenth embodiment in which the surface on which the bottom electrode 13 is to be formed is oriented in an in-plane orientation by irradiation with an ion beam, the ferroelectric film 24 is epitaxially grown on top of the bottom electrode 13 by this ferroelectric film formation step. Furthermore, the method used to form the ferroelectric film 24 in the ninth or tenth embodiment is not limited to this method; a method such as a CVD method, laser ablation [method] or the like may also be used.

Furthermore, especially in the eleventh embodiment which includes a layer with an in-plane orientation that is formed by irradiating the surface on which the ferroelectric film 24 is to be formed with an ion beam, the surface of the bottom electrode 13 is irradiated with an ion beam prior to the formation of the ferroelectric film 24 in the same manner as in the abovementioned steps [0I] and [1I], and the ferroelectric film 24 is then formed by epitaxial growth using the abovementioned method.

The ferroelectric film 24 is obtained as described above.

[4I] [4J] [4K] Bottom Electrode Lead-Out Step

These steps can be performed in the same manner as the abovementioned step [4A].

[5I] [5J] [5K] Top Electrode Formation Step

These steps can be performed in the same manner as the abovementioned step [5A].

The capacitor 200 according to the ninth, tenth or eleventh embodiment is manufactured by the abovementioned steps [0I] through [5I], [0J] through [5J] or [0K] through [5K].

<15. Piezoelectric Device Construction (1)>

Figure 15:
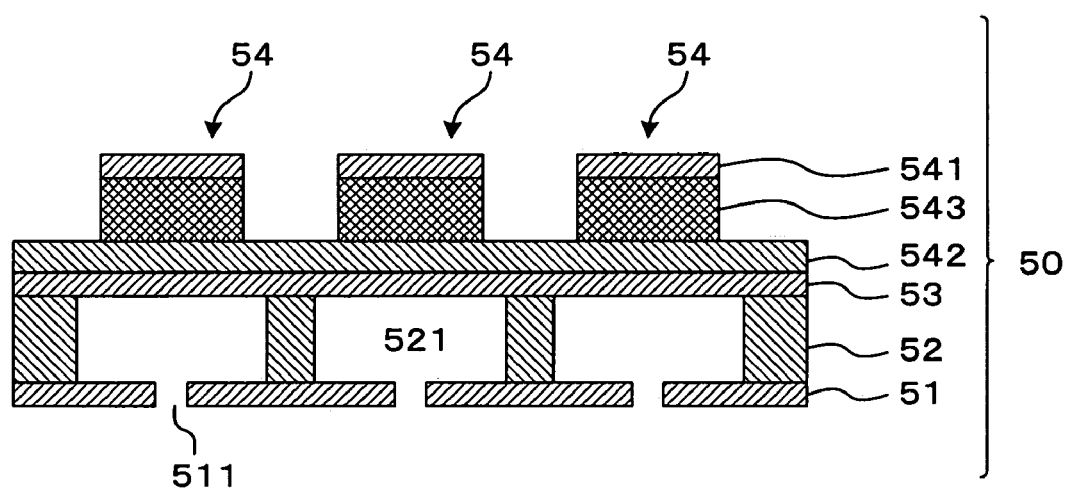
FIG. 15 is a sectional view of a piezoelectric device according to a first embodiment of the present invention, and an embodiment of a liquid jetting head using this piezoelectric device.

FIG. 15 is a sectional view which shows a piezoelectric device according to a first embodiment of the present invention, and a liquid jetting head using this piezoelectric device.

First, the piezoelectric device 54 shown in FIG. 15 will be described with an emphasis on the differences between this piezoelectric device and the capacitor 200 according to the abovementioned first embodiment [of the present invention]. The piezoelectric device 54 comprises a substrate 52, a diaphragm 53 on top of the substrate 52, a bottom electrode 542 on top of the diaphragm 53, a piezoelectric film 543 on top of the bottom electrode 542, and a top electrode 541 on top of the piezoelectric film 543.

The piezoelectric film 543 is formed in an in-plane orientation on top of this bottom electrode 542 by an ion beam assist method. As a result, various characteristics of the piezoelectric device 54 such as electrostriction characteristics and the like are improved. Furthermore, the piezoelectric film 543 can be constructed from various types of ferroelectric materials. However, it is desirable that this film contain ferroelectric materials that have a perovskite structure, and a piezoelectric film in which ferroelectric materials that have a perovskite structure are the main materials is even more desirable. Furthermore, such ferroelectric materials that have a perovskite structure may be any of the following materials: i.e., materials with a rhombohedral crystal (100) orientation, materials with a tetragonal crystal (001) orientation, materials that are epitaxially grown with a cubic crystal (100) orientation, or materials that are epitaxially grown with a quasi-cubic crystal (100) orientation. In particular, materials with a rhombohedral crystal (100) orientation are especially desirable. As a result, the abovementioned effect is improved.

Materials similar to those cited for the capacitor 200 according to the abovementioned first embodiment can be used as such ferroelectric materials that have a perovskite structure. In particular, it is desirable that this film contain a solid solution of $PMN_y$-$PZT_{1-y}$ consisting of a relaxer material PMN comprising any of the compounds $Pb(M_{1/3}N_{2/3})O_3$ (M=Mg, Zn, Co, Ni, Mn; N=Nb, Ta), $Pb(M_{1/2}N_{1/2})O_3$ (M=Sc, Fe, In, Yb, Ho, Lu; N=Nb, Ta), $Pb(M_{1/2}N_{1/2})O_3$ (M=Mg, Cd, Mn, Co; N=W, Re) or $Pb(M_{2/3}N_{1/3})O_3$ (M=Mn, Fe; N=W, Re) or mixed phases of these compounds, and $Pb(Zr_xTi_{1-x})O_3$ (PZT, $0.0 \leq x \leq 1.0$). A solid solution of $Pb(Mn_{1/3}Nb_{2/3})O_3$ and PZT or a solid solution of $Pb(Zn_{1/3}Nb_{2/3})O_3$ and PZT is especially desirable. As a result, the piezoelectric device 54 is especially superior in terms of piezoelectric characteristics and various other characteristics.

Furthermore, there are no particular restrictions on the mean thickness of the piezoelectric film 543; however, for example, it is desirable that this mean thickness be approximately 100 to 3000 nm, and a mean thickness of approximately 500 to 2000 nm is even more desirable. By setting the mean thickness of the piezoelectric film 543 in the abovementioned range, it is possible to form a piezoelectric device which appropriately manifests various characteristics while preventing an increase in the size of the piezoelectric device 54.

A top electrode 541 is formed on top of the piezoelectric film 543. The constituent materials and mean thickness of this top electrode 541 may be the same as those of the top electrode 25 described in the capacitor 200 according to the abovementioned first embodiment.

<16. Piezoelectric Device Manufacturing Method (1)>

Next, a method for manufacturing the piezoelectric device according to a first embodiment [of the present invention] will be described with reference to FIG. 16.

The manufacturing method for the piezoelectric device 54 described below comprises a step in which a diaphragm 53 is formed on the substrate 52 (diaphragm formation step), a step in which a bottom electrode 542 is formed on top of the diaphragm 53 (bottom electrode formation step), a step in which a piezoelectric film 543 is formed on top of the bottom electrode 542 (piezoelectric film formation step), a step in which a top electrode 541 is formed on top of the piezoelectric film 543 (top electrode formation step), and a step in which the piezoelectric film and top electrode are patterned (patterning step). These respective steps will be described in order below.

[1a] Diaphragm Formation Step

This step is performed in the same manner as the buffer layer formation step of manufacturing step [1A] of the capacitor 200 of the abovementioned first embodiment.

[2a] Bottom Electrode Formation Step

This step is performed in the same manner as manufacturing step [2A] of the capacitor 200 of the abovementioned first embodiment.

[3a] Piezoelectric Film Formation Step

Next, a piezoelectric film 543 is formed on top of the bottom electrode 542. This step can be performed using an ion beam assist method in the same manner as in the above-mentioned step [3A]; a piezoelectric film with an in-plane orientation can thus be formed.

[4a] Top Electrode Formation Step

Figure 16:
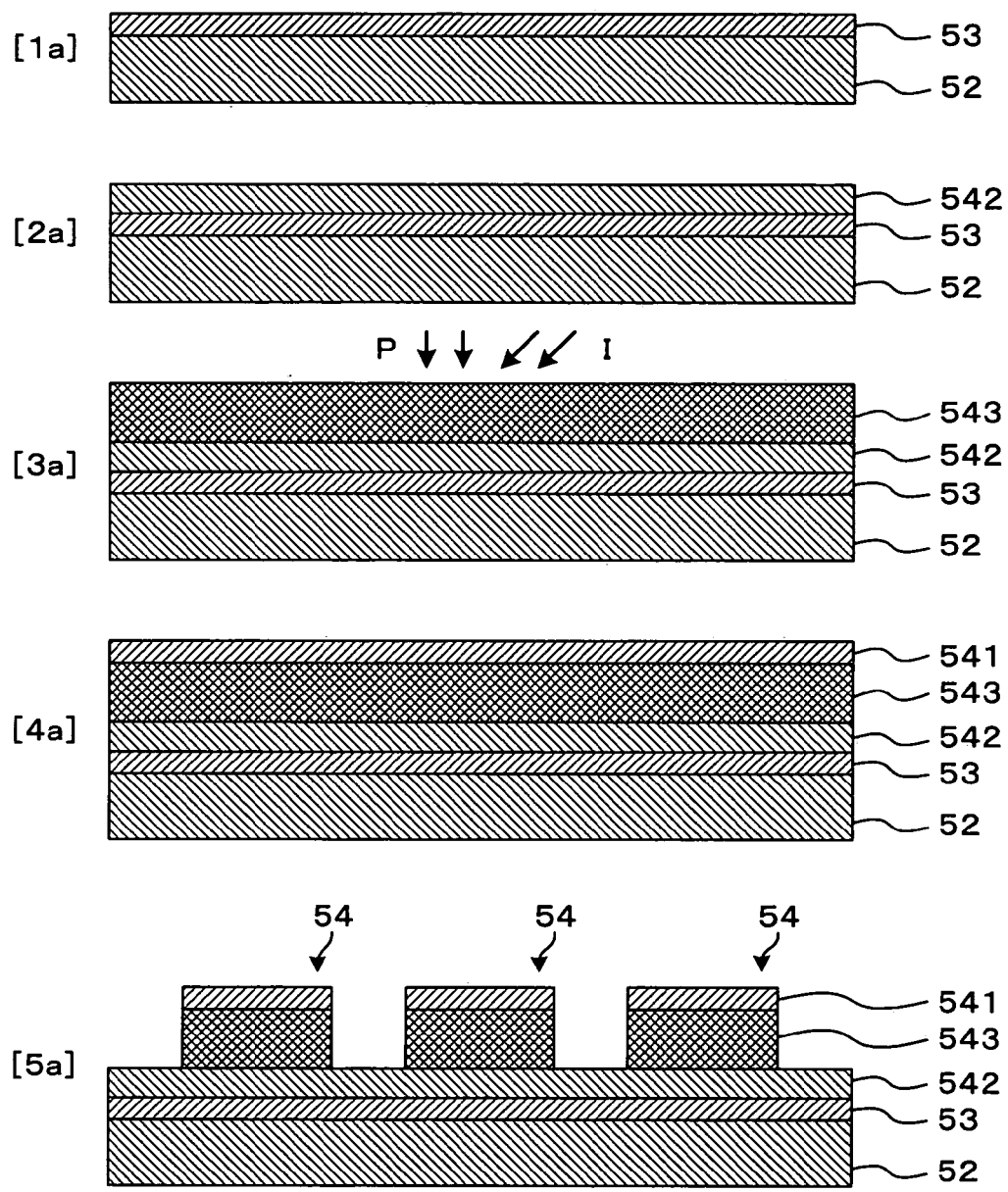
FIG. 16 is a diagram which is used to illustrate a piezoelectric device manufacturing method according to a first embodiment [of the present invention]

Next, as is shown in FIG. 16 [4a], a top electrode 541 is formed on top of the piezoelectric thin film 543. In concrete terms, platinum (Pt) or the like is formed into a film with a film thickness of 100 nm as the top electrode 541 by a direct-current sputtering method.

[5a] Patterning Step

As is shown in FIG. 16 [5a], a piezoelectric device is formed by working the piezoelectric thin film 543 and top electrode 541 into specified shapes. In concrete terms, the surface of the top electrode 541 is spin-coated with a resist, and is then patterned into a specified shape by exposure and development. The top electrode 541 and piezoelectric thin film 543 are then etched by ion milling or the like using the remaining resist as a mask.

The piezoelectric device 54 of the first embodiment is manufactured by the abovementioned steps [1a] through [5a].

<17. Piezoelectric Device Construction (2)>

Next, a piezoelectric device constituting a second embodiment [of the present invention] and a liquid jetting head using this piezoelectric device will be described. The piezoelectric device 54 and liquid jetting head 50 of this second embodiment have constructions similar to those in the first embodiment shown in FIG. 15. In particular, in the present embodiment, the piezoelectric film 543 is formed by performing a process in which a sol containing the material of the piezoelectric film is applied as a coated, dried and degreased so that a precursor 543' is formed, and [this precursor 543'] is then fired. In this step, the piezoelectric film 543 is formed by irradiating the abovementioned precursor at least once following the abovementioned degreasing.

Since the piezoelectric film 543 is thus formed by a sol-gel method in which an ion beam assist method is introduced, the piezoelectric film 543 has a uniformly arranged orientation. As a result, various characteristics of the piezoelectric device 54 such as electrostriction characteristics and the like are improved.

The remaining construction of the piezoelectric film 543 is similar to that in the piezoelectric device of the abovementioned first embodiment.

<18. Piezoelectric Device Manufacturing Method (2)>

Figure 17:
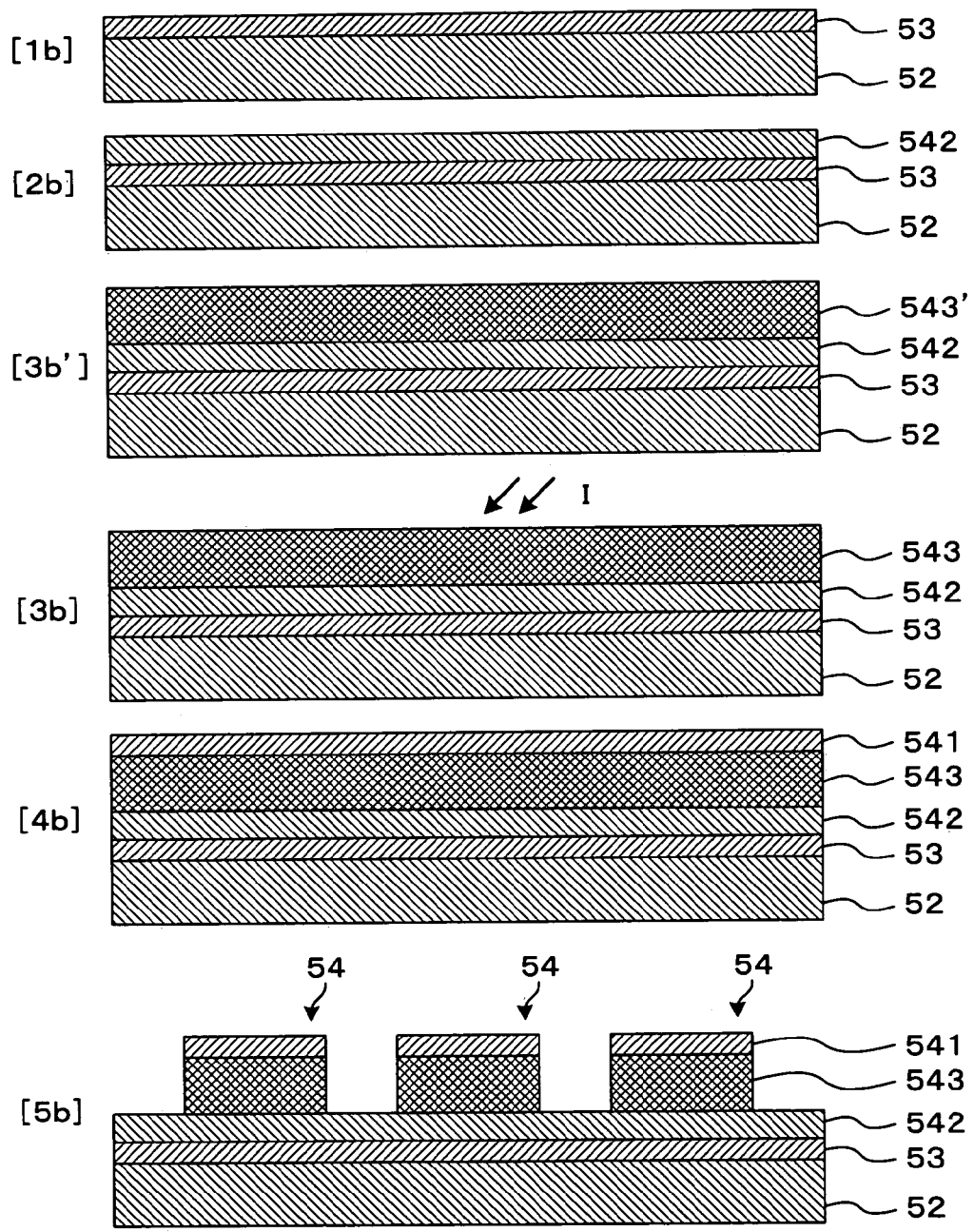
FIG. 17 is a diagram which is used to illustrate a piezoelectric device manufacturing method according to a second embodiment.

Next, a method for manufacturing the piezoelectric device 54 according to such a second embodiment [of the present invention] will be described with reference to FIG. 17. This piezoelectric device 54 can be manufactured by the following steps:

[1b] Diaphragm Formation Step

This step is performed in the same manner as manufacturing step [1a] of the piezoelectric device of the first embodiment.

[2b] Bottom Electrode Formation Step

This step is performed in the same manner as manufacturing step [2a] of the piezoelectric device of the first embodiment.

[3b'] [3b] Piezoelectric Film Formation Step

Next, a piezoelectric film 543 is formed on top of the bottom electrode 542. This step can be performed by a sol-gel method in which an ion beam assist method is introduced in the same manner as manufacturing steps [3B'] and [3B] of the capacitor of the abovementioned second embodiment.

In cases where the piezoelectric film 543 is to be formed as a thick film, the abovementioned process from the formation of a precursor to firing is repeated a multiple number of times. For example, the thickness of the precursor film applied as a coating for a single firing can be set at 200 nm, and a piezoelectric film 543 with a thickness of 1200 nm can be formed by repeating this process six times.

[4b] Top Electrode Formation Step

This step is performed in the same manner as manufacturing step [4a] of the piezoelectric device of the first embodiment.

[5b] Patterning Step

This step is performed in the same manner as manufacturing step [5a] of the piezoelectric device of the first embodiment.

The piezoelectric device 54 according to a second embodiment [of the present invention] is manufactured by the abovementioned steps [1b] through [5b].

<19. Piezoelectric Device Construction (3)>

Next, a piezoelectric device constituting a third embodiment [of the present invention] and a liquid jetting head using this piezoelectric device will be described. The piezoelectric device 54 and liquid jetting head 50 of this third embodiment have constructions similar to those in the first embodiment shown in FIG. 15. In particular, in the present embodiment, the bottom electrode 542 is formed with an in-plane orientation on top of the diaphragm 53 by an ion beam assist method. A piezoelectric film 543 is formed on top of this bottom electrode 542. As a result, the piezoelectric film 543 has a uniformly arranged orientation.

Consequently, various characteristics of the piezoelectric device 54 such as the electrostriction characteristics and the like are improved. Furthermore, the piezoelectric film 543 can be constructed from various types of ferroelectric materials. However, it is desirable that this film contain ferroelectric materials that have a perovskite structure, and a piezoelectric film in which ferroelectric materials that have a perovskite structure are the main materials is even more desirable. Furthermore, such ferroelectric materials that have a perovskite structure may be any of the following materials: i.e., materials with a rhombohedral crystal (100) orientation, materials with a tetragonal crystal (001) orientation, materials that are epitaxially grown with a cubic crystal (100) orientation, or materials that are epitaxially grown with a quasi-cubic crystal (100) orientation. In particular, materials with a rhombohedral crystal (100) orientation are especially desirable. Furthermore, it is desirable that the piezoelectric film 543 be epitaxially grown on top of the bottom electrode 542. As a result, the abovementioned effect is improved.

Materials similar to those cited for the capacitor 200 according to the abovementioned third embodiment can be used as such ferroelectric materials that have a perovskite structure. In particular, it is desirable that this film contain a solid solution of $PMN_y\text{-}PZT_{1-y}$ consisting of a relaxer material PMN comprising any of the compounds $Pb(M_{1/3}N_{2/3})O_3$ (M=Mg, Zn, Co, Ni, Mn; N=Nb, Ta), $Pb(M_{1/2}N_{1/2})O_3$ (M=Sc, Fe, In, Yb, Ho, Lu; N=Nb, Ta), $Pb(M_{1/2}N_{1/2})O_3$ (M=Mg, Cd, Mn, Co; N=W, Re) or $Pb(M_{2/3}N_{1/3})O_3$ (M=Mn, Fe; N=W, Re) or mixed phases of these compounds, and $Pb(Zr_xTi_{1-x})O_3$ (PZT, $0.0 \leq x \leq 1.0$). A solid solution of $Pb(Mn_{1/3}Nb_{2/3})O_3$ and PZT or a solid solution of $Pb(Zn_{1/3}Nb_{2/3})O_3$ and PZT is especially desirable. As a result, the piezoelectric device 54 is especially superior in terms of piezoelectric characteristics and various other characteristics.

Furthermore, in cases where the bottom electrode 542 is a metal oxide that has a perovskite structure, there is little lattice mismatching with ferroelectric materials that have a perovskite structure. Accordingly, the piezoelectric film 543 can be easily and reliably grown by epitaxial growth with a rhombohedral crystal (100) orientation on top of the bottom electrode 542. Furthermore, the bonding of the piezoelectric film 543 with the bottom electrode 542 is improved.

Furthermore, there are no particular restrictions on the mean thickness of the piezoelectric film 543; however, for example, it is desirable that this mean thickness be approximately 100 to 3000 nm, and a mean thickness of approximately 500 to 2000 nm is even more desirable. By setting the mean thickness of the piezoelectric film 543 in the abovementioned range, it is possible to form a piezoelectric device which appropriately manifests various characteristics while preventing an increase in the size of the piezoelectric device 54.

A top electrode 541 is formed on top of the piezoelectric film 543. The constituent materials and mean thickness of this top electrode 541 may be the same as those of the top electrode 25 described in the abovementioned capacitor 200.

<20. Piezoelectric Device Manufacturing Method (3)>

Figure 18:
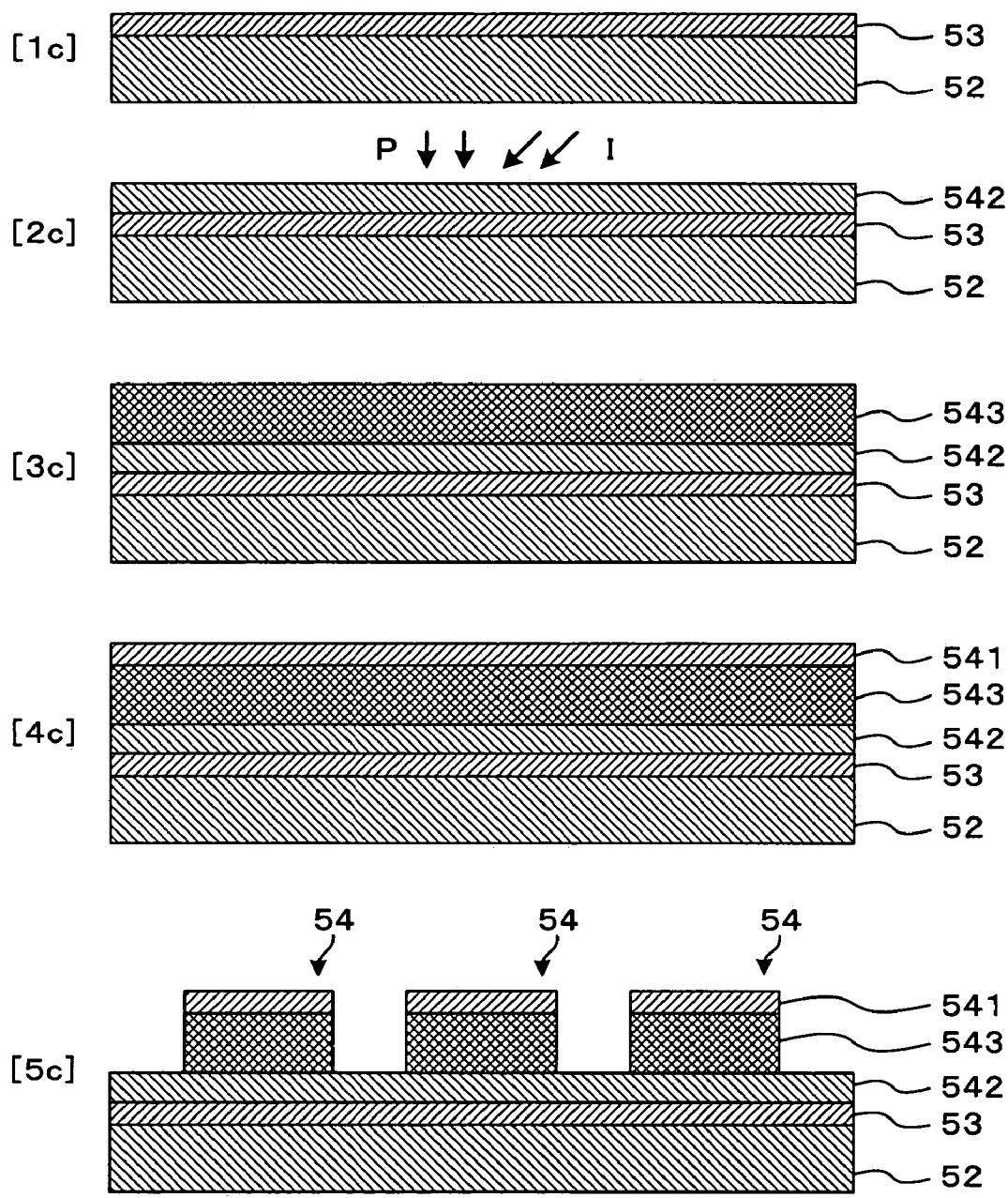
FIG. 18 is a diagram which is used to illustrate a piezoelectric device manufacturing method according to a third embodiment.

Next, a method for manufacturing the [abovementioned] piezoelectric device will be described with reference to FIG. 18. This piezoelectric device 54 can be manufactured by the following steps:

[1c] Diaphragm Formation Step

This step is performed in the same manner as the buffer layer formation step of manufacturing step [1C] of the capacitor 200 of the abovementioned third embodiment.

[2c] Bottom Electrode Formation Step

This step is performed in the same manner as the buffer layer formation step of manufacturing step [2C] of the capacitor 200 of the abovementioned third embodiment.

[3c] Piezoelectric Film Formation Step

Next, a piezoelectric film 543 is formed on top of the bottom electrode 542. This can be accomplished in the same manner as in the abovementioned step [3C].

[4c] Top Electrode Formation Step

Next, a top electrode 541 is formed on top of the piezoelectric thin film 543. In concrete terms, platinum (Pt) or the like is formed into a film with a film thickness of 100 nm as the top electrode 541 by a direct-current sputtering method.

[5c] Patterning Step

A piezoelectric device is formed by working the piezoelectric thin film 543 and top electrode 541 into specified shapes. In concrete terms, the surface of the top electrode 541 is spin-coated with a resist, and is then patterned into a specified shape by exposure and development. The top electrode 541 and piezoelectric thin film 543 are then etched by ion milling or the like using the remaining resist as a mask.

The [abovementioned] piezoelectric device 54 is manufactured by the abovementioned steps [1c] through [5c].

<21. Piezoelectric Device Construction (4)>

Next, a piezoelectric device constituting a fourth embodiment [of the present invention] and a liquid jetting head using this piezoelectric device will be described. The piezoelectric device 54 and liquid jetting head 50 according to this fourth embodiment have constructions similar to those of the first embodiment shown in FIG. 15. In particular, in the present embodiment, the diaphragm 53 is formed on top of the substrate 52 with an in-plane orientation by an ion beam assist method. In the present embodiment, as a result of the provision of this diaphragm 53, the intermediate film functions as a diaphragm. In regard to the composition of the diaphragm 53, a compound with an NaCl structure such as MgO, CaO, SrO, BaO, NiO or the like is desirable. A buffer layer (not shown in the figures) may also be installed as the underlayer of the diaphragm 53.

A bottom electrode 542 is formed on top of this diaphragm 53. A piezoelectric film 543 is formed on top of this bottom electrode 542. As a result, the bottom electrode 542 and piezoelectric film 543 have a uniformly arranged orientation, and various characteristics of the piezoelectric device 54 such as the electrostriction characteristics and the like are improved.

Furthermore, the bottom electrode 542 can be constructed from the same materials as in the capacitor 200 according to the abovementioned fourth embodiment; in particular, it is desirable that this bottom electrode 542 be epitaxially grown on top of the diaphragm 53.

Furthermore, in cases where the bottom electrode 542 is a metal oxide that has a perovskite structure, there is little lattice mismatching with ferroelectric materials that have a perovskite structure. Accordingly, the piezoelectric film 543 can be easily and reliably grown by epitaxial growth with a rhombohedral crystal (100) orientation on top of the bottom electrode 542. Furthermore, the bonding of the piezoelectric film 543 with the bottom electrode 542 is improved.

The piezoelectric film 543 can be constructed from various types of ferroelectric materials. However, it is desirable that this film contain ferroelectric materials that have a perovskite structure, and a piezoelectric film in which ferroelectric materials that have a perovskite structure are the main materials is even more desirable. Furthermore, such ferroelectric materials that have a perovskite structure may be any of the following materials: i.e., materials with a rhombohedral crystal (100) orientation, materials with a tetragonal crystal (001) orientation, materials that are epitaxially grown with a cubic crystal (100) orientation, or materials that are epitaxially grown with a quasi-cubic crystal (100) orientation. In particular, materials with a rhombohedral crystal (100) orientation are especially desirable. Furthermore, it is desirable that the piezoelectric film 543 be epitaxially grown on top of the bottom electrode 542.

Materials similar to those cited for the capacitor 200 according to the abovementioned fourth embodiment can be used as such ferroelectric materials that have a perovskite structure. In particular, it is desirable that this film contain a solid solution of $PMN_y$-$PZT_{1-y}$ consisting of a relaxer material PMN comprising any of the compounds $Pb(M_{1/3}N_{2/3})O_3$ (M=Mg, Zn, Co, Ni, Mn; N=Nb, Ta), $Pb(M_{1/2}N_{1/2})O_3$ (M=Sc, Fe, In, Yb, Ho, Lu; N=Nb, Ta), $Pb(M_{1/2}N_{1/2})O_3$ (M=Mg, Cd, Mn, Co; N=W, Re) or $Pb(M_{2/3}N_{1/3})O_3$ (M=Mn, Fe; N=W, Re) or mixed phases of these compounds, and $Pb(Zr_xTi_{1-x})O_3$ (PZT, $0.0 \leq x \leq 1.0$). A solid solution of $Pb(Mn_{1/3}Nb_{2/3})O_3$ and PZT or a solid solution of $Pb(Zn_{1/3}Nb_{2/3})O_3$ and PZT is especially desirable. As a result, the piezoelectric device 54 is especially superior in terms of piezoelectric characteristics and various other characteristics.

Furthermore, there are no particular restrictions on the mean thickness of the piezoelectric film 543; however, for example, it is desirable that this mean thickness be approximately 100 to 3000 nm, and a mean thickness of approximately 500 to 2000 nm is even more desirable. By setting the mean thickness of the piezoelectric film 543 in the abovementioned range, it is possible to form a piezoelectric device which appropriately manifests various characteristics while preventing an increase in the size of the piezoelectric device 54.

A top electrode 541 is formed on top of the piezoelectric film 543. The constituent materials and mean thickness of this top electrode 541 may be the same as those of the top electrode 25 described in the capacitor 200 according to the abovementioned fourth embodiment.

<22. Piezoelectric Device Manufacturing Method (4)>

Figure 19:
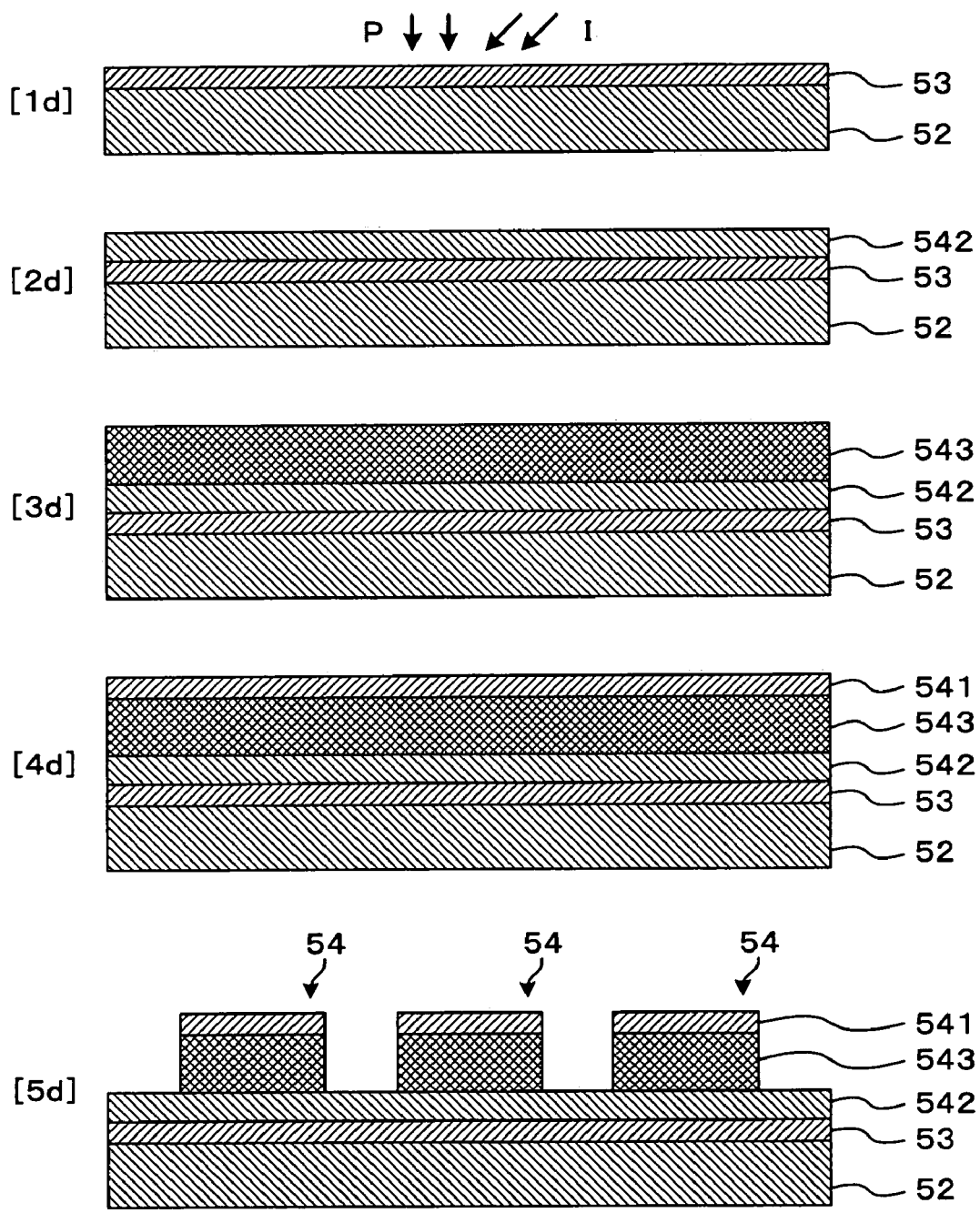
FIG. 19 is a diagram which is used to illustrate a piezoelectric device manufacturing method according to fourth embodiment.

Next, a method for manufacturing the piezoelectric device according to a fourth embodiment [of the present invention] will be described with reference to FIG. 19. This piezoelectric device 54 can be manufactured by the following steps:

[1*d*] Diaphragm Formation Step

This step is performed in the same manner as the buffer layer formation step of manufacturing step [1D] of the capacitor 200 of the abovementioned fourth embodiment.

[2*d*] Bottom Electrode Formation Step

This step is performed in the same manner as the buffer layer formation step of manufacturing step [2D] of the capacitor 200 of the abovementioned fourth embodiment.

[3*d*] Piezoelectric Film Formation Step

Next, a piezoelectric film 543 is formed on top of the bottom electrode 542. This can be accomplished in the same manner as in the abovementioned step [3D].

[4*d*] Top Electrode Formation Step

Next, a top electrode 541 is formed on top of the piezoelectric thin film 543. In concrete terms, platinum (Pt) or the like is formed into a film with a film thickness of 100 nm as the top electrode 541 by a direct-current sputtering method.

[5*d*] Patterning Step

A piezoelectric device is formed by working the piezoelectric thin film 543 and top electrode 541 into specified shapes. In concrete terms, the surface of the top electrode 541 is spin-coated with a resist, and is then patterned into a specified shape by exposure and development. The top electrode 541 and piezoelectric thin film 543 are then etched by ion milling or the like using the remaining resist as a mask.

The [abovementioned] piezoelectric device 54 is manufactured by the abovementioned steps [1*d*] through [5*d*].

<23. Piezoelectric Device Construction (5)>

Figure 20:
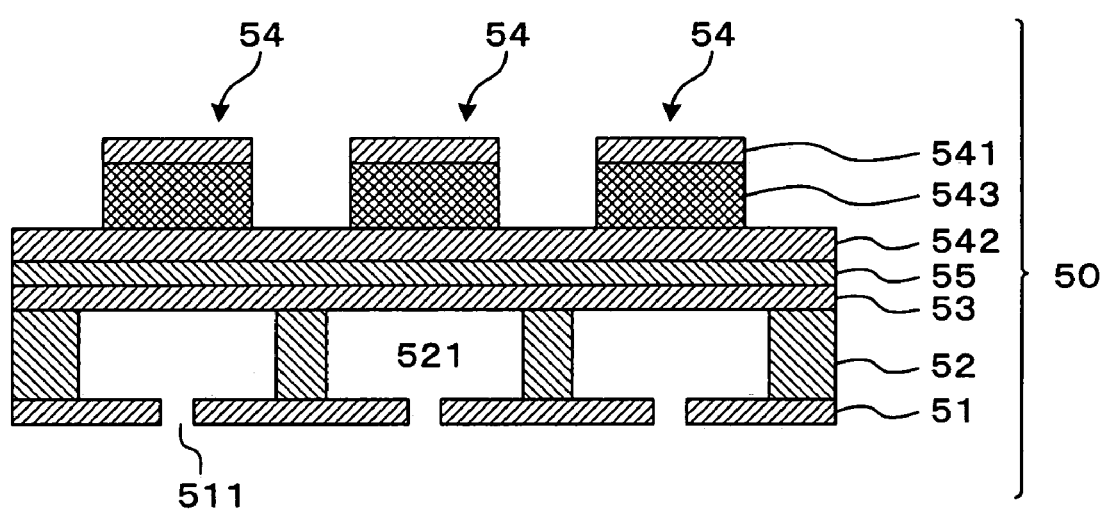
FIG. 20 is a sectional view showing a piezoelectric device according to a fifth embodiment of the present invention, and an embodiment of a liquid jetting head using this piezoelectric device.

FIG. 20 is a sectional view showing a piezoelectric device according to a fifth embodiment of the present invention, and an embodiment of a liquid jetting head using this piezoelectric device.

The piezoelectric device 54 comprises a substrate 52, a diaphragm 53 constituting the first layer of an intermediate film on the substrate 52, a buffer layer 55 constituting the second layer of this intermediate film, a bottom electrode 542 on top of the buffer layer 55, a piezoelectric film 543 on top of the bottom electrode 542, and a top electrode 541 on top of the piezoelectric film 543. In the present embodiment, the first layer of the intermediate film functions as a diaphragm, ad the second layer of the intermediate film functions as a buffer layer. However, the present invention is not limited to this; it would also be possible for the first layer of the intermediate film to function as a buffer layer, and for the second layer of the intermediate film to function as a diaphragm.

The diaphragm 53 is formed with an in-plane orientation on top of the substrate 52 by an ion beam assist method. A buffer layer 55 is formed on top of the diaphragm 53, a bottom electrode 542 is formed on top of the buffer layer 55, and a piezoelectric film 543 is formed on top of this bottom electrode 542. As a result, the bottom electrode 542 and piezo-electric film 543 have a uniformly arranged orientation. It is desirable that the buffer layer 55, bottom electrode 542 and piezoelectric film 543 each be formed by epitaxial growth.

As a result, various characteristics of the piezoelectric device 54 such as the electrostriction characteristics and the like are improved. In regard to the composition of the diaphragm 53 constituting the first layer of the intermediate film, a compound with an NaCl structure or the like is desirable (as in the insulating film 15 constituting the first layer of the intermediate film of the capacitor 200 according to the abovementioned fifth embodiment). In regard to the buffer layer 55 constituting the second layer of the intermediate film, a compound with an NaCl structure, a nitride or the like is desirable (as in the buffer layer 12 constituting the second layer of the intermediate film of the capacitor 200 according to the abovementioned fifth embodiment). Furthermore, as in the case of the bottom electrode 13 of the capacitor 200 according to the abovementioned fifth embodiment, the bottom electrode 542 may be a metal material or a metal oxide with a perovskite structure.

Furthermore, the piezoelectric film 543 can be constructed from various types of ferroelectric materials. However, it is desirable that this film contain ferroelectric materials that have a perovskite structure, and a piezoelectric film in which ferroelectric materials that have a perovskite structure are the main materials is even more desirable. Furthermore, such ferroelectric materials that have a perovskite structure may be either materials that are epitaxially grown with a rhombohedral crystal (100) orientation or materials that are epitaxially grown with a tetragonal crystal (001) orientation. In particular, materials that are epitaxially grown with a rhombohedral crystal (100) orientation are especially desirable. As a result, the abovementioned effect is improved.

Materials similar to those cited for the capacitor 200 according to the abovementioned fifth embodiment can be used as such ferroelectric materials that have a perovskite structure. As a result, the piezoelectric device 54 is superior in terms of various characteristics.

Furthermore, there are no particular restrictions on the mean thickness of the piezoelectric film 543; however, for example, it is desirable that this mean thickness be approximately 100 to 3000 nm, and a mean thickness of approximately 500 to 2000 nm is even more desirable. By setting the mean thickness of the piezoelectric film 543 in the abovementioned range, it is possible to form a piezoelectric device which appropriately manifests various characteristics while preventing an increase in the size of the piezoelectric device 54.

A top electrode 541 is formed on top of the piezoelectric film 543. The constituent materials and mean thickness of this top electrode 541 may be the same as those of the top electrode 25 described in the capacitor 200 according to the abovementioned second embodiment.

<24. Piezoelectric Device Manufacturing Method (5)>

Figure 21:
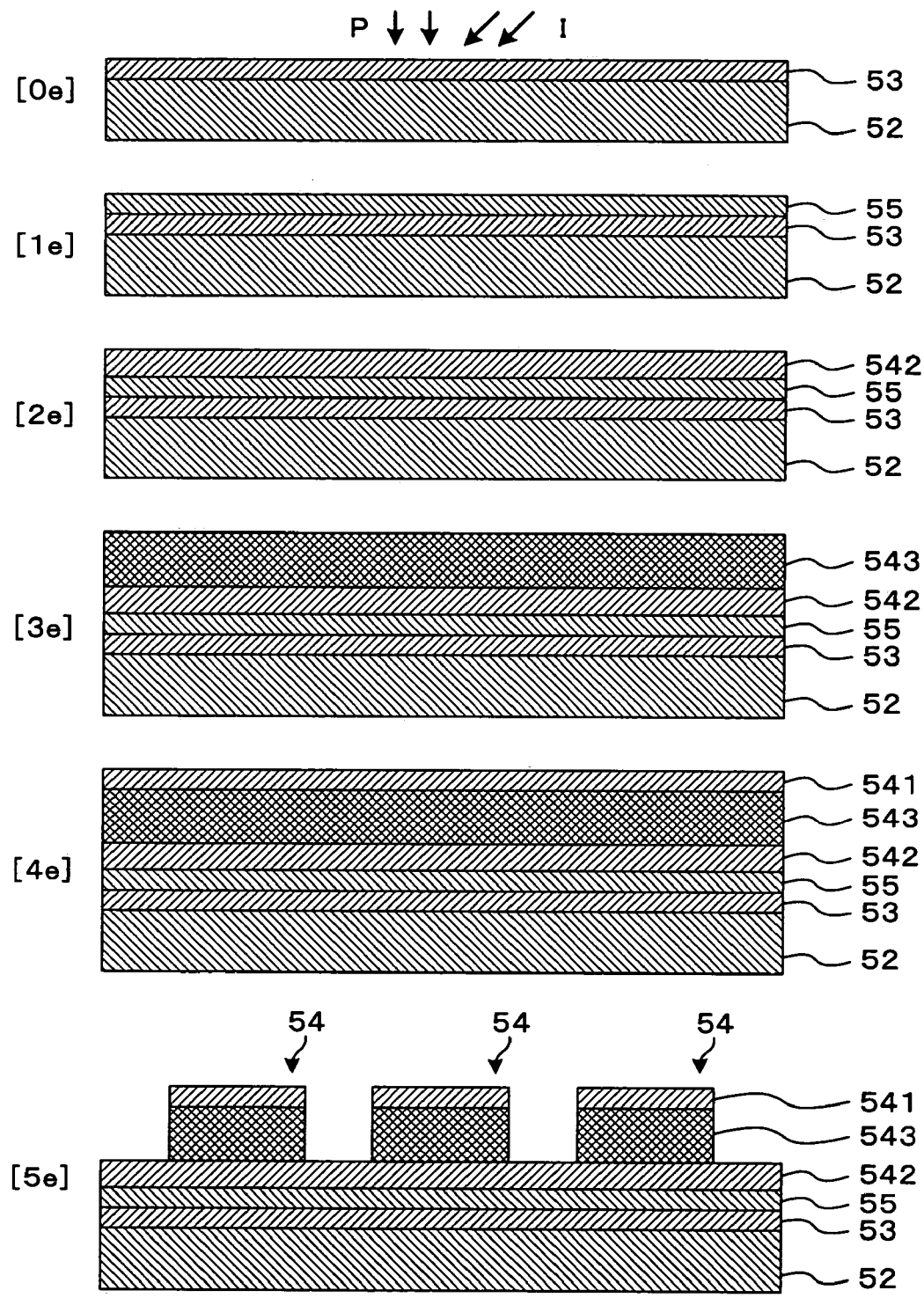
FIG. 21 is a diagram which is used to illustrate a piezoelectric device manufacturing method according to the fifth embodiment.

Next, a method for manufacturing the piezoelectric device according to a fifth embodiment [of the present invention] will be described with reference to FIG. 21.

The manufacturing method for the piezoelectric device 54 described below comprises a step in which a diaphragm 53 constituting the first layer of an intermediate film is formed on the substrate 52 (intermediate film first layer formation step), a step in which a buffer layer 55 constituting the second layer of this intermediate film is formed (intermediate film second layer formation step), a step in which a bottom electrode 542 is formed on top of the buffer layer 55 (bottom electrode formation step), a step in which a piezoelectric film 543 is formed on top of the bottom electrode 542 (piezoelectric film formation step), a step in which a top electrode 541 is formed on top of the piezoelectric film 543 (top electrode formation step), and a step in which the piezoelectric film and top electrode are patterned (patterning step). These respective steps will be described in order below.

[0e] Intermediate Film First Layer Formation Step

A diaphragm 53 constituting the first layer of the intermediate film is formed by an ion beam assist method in the same manner as in manufacturing step [0E] of the capacitor 200 according to the abovementioned fifth embodiment.

[1e] Intermediate Film Second Layer Formation Step

A buffer layer 55 constituting the second layer of the intermediate film is formed on top of the first layer of the intermediate film in the same manner as in manufacturing step [1E] of the capacitor 200 according to the abovementioned fifth embodiment.

[2e] Bottom Electrode Formation Step

This step is performed in the same manner as manufacturing step [2E] of the capacitor 200 of the abovementioned fifth embodiment.

[3e] Piezoelectric Film Formation Step

Next, a piezoelectric film 543 is formed on top of the bottom electrode 542. This can be accomplished in the same manner as in the abovementioned step [3E].

[4e] Top Electrode Formation Step

Next, a top electrode 541 is formed on top of the piezoelectric thin film 543. In concrete terms, platinum (Pt) or the like is formed into a film with a film thickness of 100 nm as the top electrode 541 by a direct-current sputtering method.

[5e] Patterning Step

A piezoelectric device is formed by working the piezoelectric thin film 543 and top electrode 541 into specified shapes. In concrete terms, the surface of the top electrode 541 is spin-coated with a resist, and is then patterned into a specified shape by exposure and development. The top electrode 541 and piezoelectric thin film 543 are then etched by ion milling or the like using the remaining resist as a mask.

The [abovementioned] piezoelectric device 54 is manufactured by the abovementioned steps [0e] through [5e].

<25. Piezoelectric Device Constructions (6 Through 8)

Next, piezoelectric devices constituting sixth through eighth embodiments [of the present invention] and liquid jetting heads using these piezoelectric devices will be described. The piezoelectric devices 54 and liquid jetting heads 50 according to these sixth through eighth embodiments have the same constructions as in the first embodiment shown in FIG. 15. In particular, the sixth embodiment is an embodiment in which the diaphragm 53 which is an intermediate film includes a layer that is formed with an in-plane orientation by an ion beam assist method, the seventh embodiment is an embodiment in which the bottom electrode 542 includes a layer that is formed with an in-plane orientation by an ion beam assist method, and the eighth embodiment is an embodiment in which the piezoelectric film 543 includes a layer that is formed with an in-plane orientation by an ion beam assist method.

The diaphragm 53 in the sixth embodiment, the bottom electrode 542 in the seventh embodiment and the piezoelectric film 543 in the eighth embodiment all include a second layer that is formed by continuing deposition with the ion beam assist stopped on top of a first layer that is formed with an in-plane orientation by an ion beam assist method. Furthermore, these layers may also include a layer which is further formed with an in-plane orientation by an ion beam assist method on top of the abovementioned first layer and second layer, by repeating the performance and stopping of the ion beam assist. Furthermore, these layers may also include a layer which is further deposited with the ion beam assist stopped on top of the abovementioned layers. Furthermore, the above-mentioned layers may further repeatedly include layers similar to those described above on top of these layers.

In the piezoelectric devices constructed according to these sixth through eighth embodiments, since the second layer that is deposited with the ion beam assist stopped is grown as a crystal while being influenced by the first layer that is oriented in an in-plane orientation, the second layer has a good orientation. Accordingly, a film with a good orientation can be formed while reducing the amount of energy that is consumed by the generation of the ion beam. Furthermore, since the thin film is not etched by the ion beam during deposition in the case of deposition with the ion beam stopped, the advantage of a high deposition speed is obtained in these embodiments.

In regard to the composition of the diaphragm 53, oxides and the like similar to those used in the buffer layers 12 of the capacitors 200 according to the abovementioned sixth through eighth embodiments can be used. However, especially in the sixth embodiment, compounds with an NaCl structure such as MgO, CaO, SrO, BaO, NiO and the like are desirable. Furthermore, a buffer layer (not shown in the figures) may be installed as the underlayer of the diaphragm 53.

The bottom electrode 542 can be constructed from materials similar to those used in the capacitors 200 according to the abovementioned sixth through eighth embodiments. Furthermore, in the case of the sixth embodiment, which includes a layer with an in-plane orientation formed by an ion beam assist method as the diaphragm 53, the orientation of the diaphragm 53 is uniformly arranged; accordingly, the bottom electrode 542 has a uniformly arranged orientation as a result of this bottom electrode 542 being formed on top of this diaphragm 53. In particular, it is desirable that the bottom electrode 542 be formed on top of the diaphragm 53 by epitaxial growth.

Furthermore, in the seventh embodiment which includes a layer with an in-plane orientation formed by an ion beam assist method as a bottom electrode 542, it is especially desirable that the composition of the bottom electrode 542 contain at least one substance selected from a set comprising $SrRuO_3$, $LaNiO_x$, $YBa_2Cu_3O_x$ and solid solutions containing these compounds.

Furthermore, in cases where the bottom electrode 542 is a metal oxide that has a perovskite structure, there is little lattice mismatching with ferroelectric materials that have a perovskite structure. Accordingly, in the sixth and seventh embodiments, the piezoelectric film 543 can be easily and reliably grown by epitaxial growth with a rhombohedral crystal (100) orientation on top of the bottom electrode 542. Furthermore, the bonding of the piezoelectric film 543 with the bottom electrode 542 is improved.

The piezoelectric film 543 can be constructed from various types of ferroelectric materials. However, it is desirable that this film contain ferroelectric materials that have a perovskite structure, and a piezoelectric film in which ferroelectric materials that have a perovskite structure are the main materials is even more desirable. Furthermore, such ferroelectric materials that have a perovskite structure may be either materials with a rhombohedral crystal (100) orientation or materials with a tetragonal crystal (001) orientation; however, materials with a rhombohedral crystal (100) orientation are especially desirable.

Materials similar to those cited for the above-mentioned capacitor 200 can be used as such ferroelectric materials that have a perovskite structure. As a result, the piezoelectric device 54 is especially superior in terms of various characteristics.

Furthermore, there are no particular restrictions on the mean thickness of the piezoelectric film 543; however, for example, it is desirable that this mean thickness be approximately 100 to 3000 nm, and a mean thickness of approximately 500 to 2000 nm is even more desirable. By setting the mean thickness of the piezoelectric film 543 in the above-mentioned range, it is possible to form a piezoelectric device which appropriately manifests various characteristics while preventing an increase in the size of the piezoelectric device 54.

In the sixth embodiment which includes a layer with an in-plane orientation formed by an ion beam assist method as the diaphragm 53, and the seventh embodiment which includes a layer with an in-plane orientation formed by an ion beam assist method as the bottom electrode 542, since the orientation of the bottom electrode 542 is uniformly arranged in both of these embodiments as described above, the piezoelectric film 543 has a uniformly arranged orientation as a result of this piezoelectric film 543 being formed on top of this bottom electrode 542. In particular, it is desirable that the piezoelectric film 543 be formed on top of the bottom electrode by epitaxial growth.

Furthermore, in the eighth embodiment, the piezo-electric film 543 includes a layer with an in-plane orientation formed by an ion beam assist method; accordingly, as was described above, the piezoelectric film 543 as a whole shows a good orientation.

A top electrode 541 is formed on top of the piezoelectric film 543. The constituent materials and mean thickness of this top electrode 541 may be the same as those of the top electrode 25 described in the capacitors 200 according to the abovementioned sixth through eighth embodiments.

<26. Piezoelectric Device Manufacturing Methods (6 Through 8)>

Figure 22:
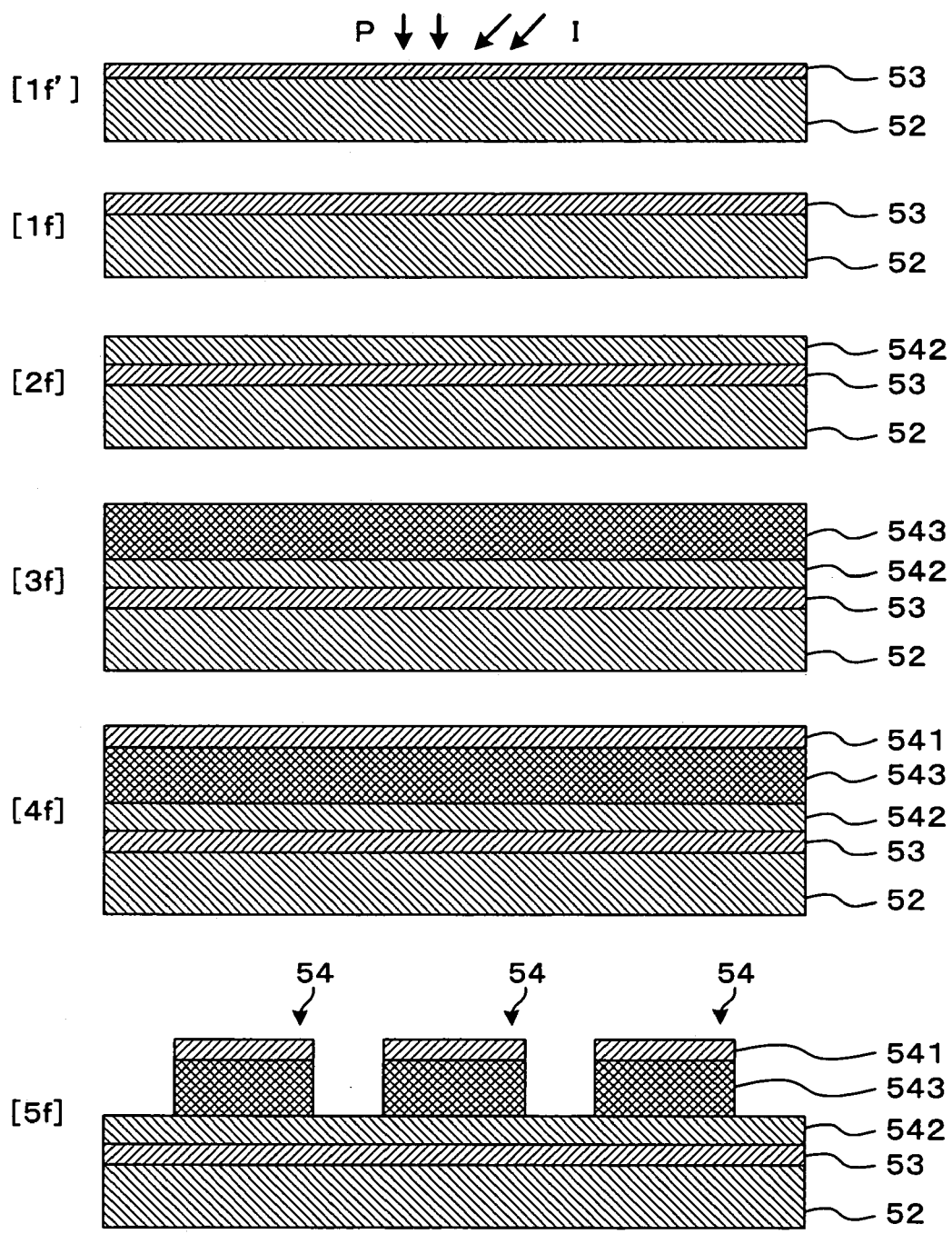
FIG. 22 is a diagram which is used to illustrate a piezoelectric device manufacturing method according to a sixth embodiment.
Figure 23:
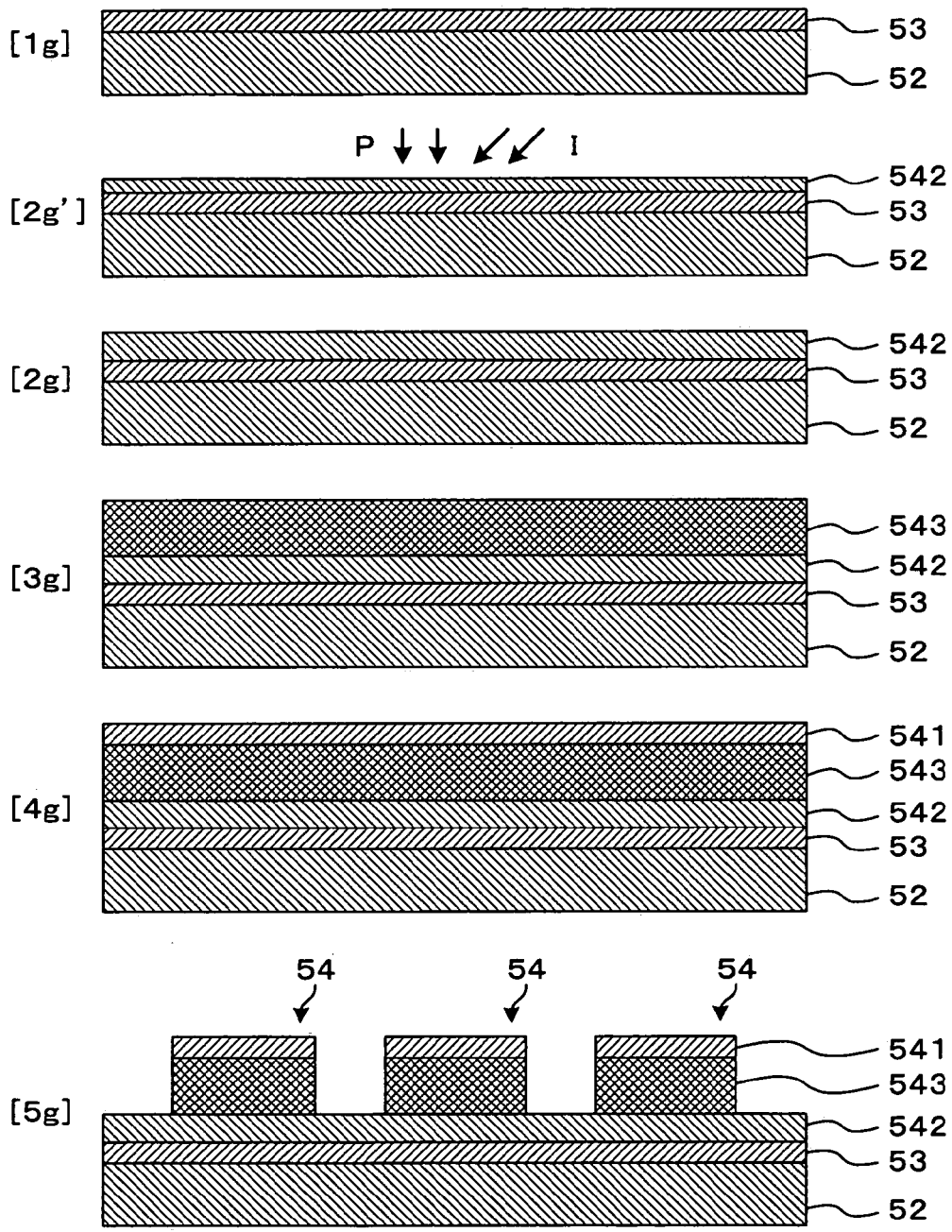
FIG. 23 is a diagram which is used to illustrate a piezoelectric device manufacturing method according to a seventh embodiment.
Figure 24:
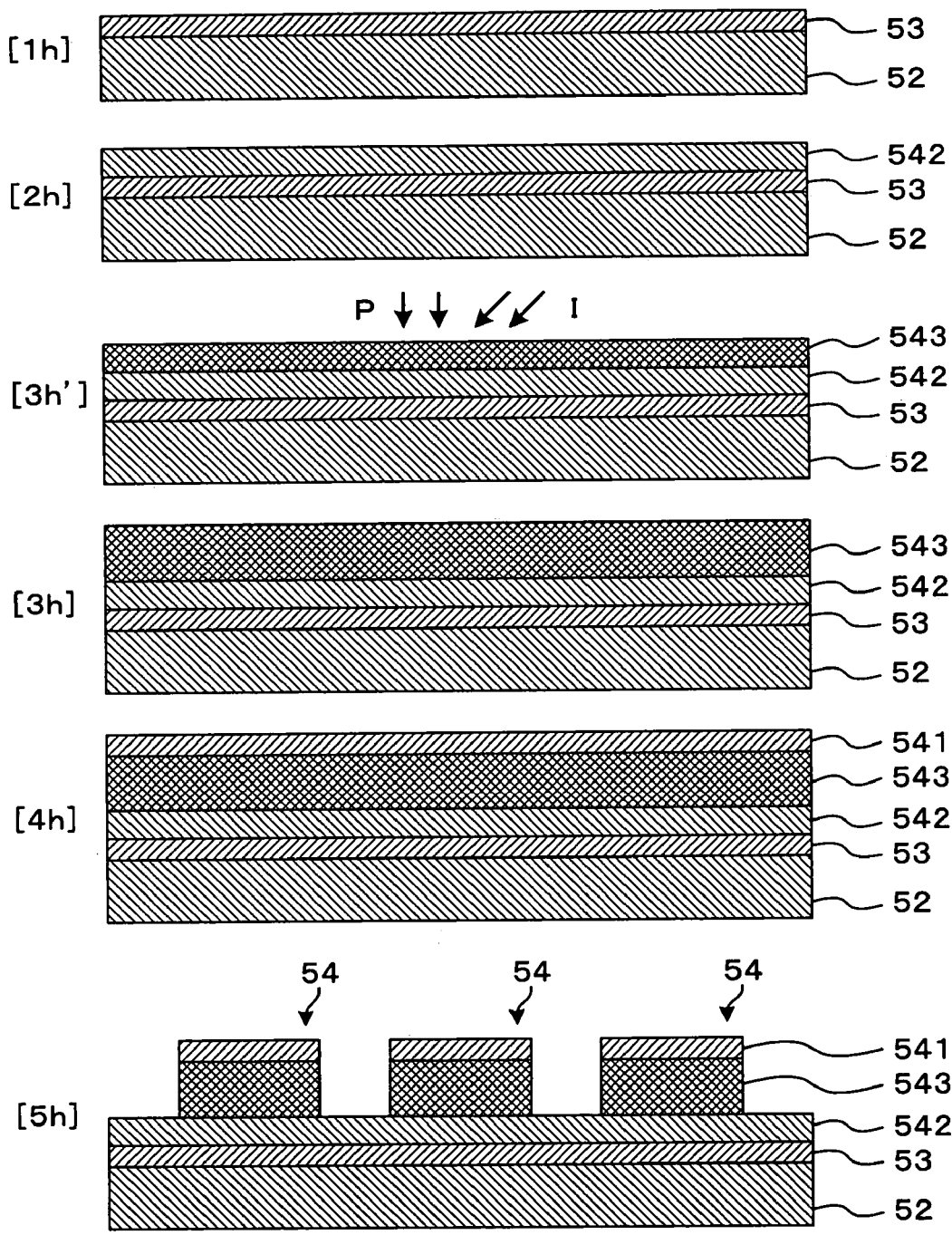
FIG. 24 is a diagram which is used to illustrate a piezoelectric device manufacturing method according to an eighth embodiment.

Next, methods for manufacturing the piezoelectric devices according to the [abovementioned] sixth through eighth embodiments will be described with reference to FIGS. 22 through 24. FIG. 22 corresponds to the sixth embodiment, FIG. 23 corresponds to the seventh embodiment, and FIG. 24 corresponds to the eighth embodiment.

The methods for manufacturing the piezoelectric devices 54 described below [each] comprise a step in which a diaphragm 53 is formed on the substrate 52 (diaphragm formation step), a step in which a bottom electrode 542 is formed on top of the diaphragm 53 (bottom electrode formation step), a step in which a piezoelectric film 543 is formed on top of the bottom electrode 542 (piezoelectric film formation step), a step in which a top electrode 541 is formed on top of the piezoelectric film 543 (top electrode formation step), and a step in which the piezoelectric film and top electrode are patterned (patterning step). These respective steps will be described in order below.

[1f'] [1f] [1g] [1h] Diaphragm

These steps are performed in the same manner as in the case of the buffer layers in manufacturing steps [1F'], [1F], [1G] and [1H] of the capacitors 200 according to the abovementioned sixth through eighth embodiments. In the manufacture of the piezoelectric device 54 according to the sixth embodiment, as in the case of the capacitor 200 according to the abovementioned sixth embodiment, there is a step in which a first layer is formed with an in-plane orientation by an ion beam assist method, and a step in which a second layer is formed by continuing deposition with the ion beam assist stopped.

[2f] [2g'] [2g] [2h] Bottom Electrode Formation Step

These steps are performed in the same manner as in the case of the buffer layers in manufacturing steps [2F], [2G'], [2G] and [2H] of the capacitors 200 according to the abovementioned sixth through eighth embodiments. In the manufacture of the piezoelectric device 54 according to the seventh embodiment, as in the case of the capacitor 200 according to the abovementioned seventh embodiment, there is a step in which a first layer is formed with an in-plane orientation by an ion beam assist method, and a step in which a second layer is formed by continuing deposition with the ion beam assist stopped. In the sixth embodiment, it is desirable that the bottom electrode 542 be formed on top of the diaphragm 53 by epitaxial growth.

[3f] [3g] [3h'] [3h]

Next, a piezoelectric film 543 is formed on top of the bottom electrode 542. This can be accomplished in the same manner as in manufacturing steps [3F], [3G], [3H'] and [3H] of the capacitors 200 according to the abovementioned sixth through eighth embodiments. In the manufacture of the piezoelectric device 54 according to the eighth embodiment, as in the case of the capacitor 200 according to the abovementioned eighth embodiment, there is a step in which a first layer is formed with an in-plane orientation by an ion beam assist method, and a step in which a second layer is formed by continuing deposition with the ion beam assist stopped. In the sixth and seventh embodiments, it is desirable that the piezoelectric film 543 be epitaxially grown on top of the bottom electrode 542.

[4f] [4g] [4h] Top Electrode Formation Step

Next, a top electrode 541 is formed on top of the piezoelectric film 543. In concrete terms, platinum (Pt) or the like is formed into a film with a film thickness of 100 nm as the top electrode 541 by a direct-current sputtering method.

[5f] [5g] [5h] Patterning Step

A piezoelectric device is formed by working the piezoelectric thin film 543 and top electrode 541 into specified shapes. In concrete terms, the surface of the top electrode 541 is spin-coated with a resist, and is then patterned into a specified shape by exposure and development. The top electrode 541 and piezoelectric thin film 543 are then etched by ion milling or the like using the remaining resist as a mask.

The piezoelectric devices 54 according to the sixth, seventh and eighth embodiments are respectively manufactured by the abovementioned steps [1f'] through [5f], [1g] through [5g] and [1h] through [5h].

<27. Piezoelectric Device Constructions (9 Through 11)>

Next, piezoelectric devices constituting ninth through eleventh embodiments [of the present invention] and liquid jetting heads using these piezoelectric devices will be described. The piezoelectric devices 54 and liquid jetting heads 50 according to these ninth through eleventh embodiments have constructions similar to those of the fifth embodiment shown in FIG. 20. In particular, the ninth embodiment is an embodiment in which the surface on which the buffer layer 55 constituting the second layer of the intermediate film is to be formed is irradiated with an ion beam, the tenth embodiment is an embodiment in which the surface on which the bottom electrode 542 is to be formed is irradiated with an ion beam, and the eleventh embodiment is an embodiment in which the surface on which the piezoelectric film 543 is to be formed is irradiated with an ion beam.

Since the surface on which the buffer layer 55 is to be formed in the ninth embodiment, the surface on which the bottom electrode 542 is to be formed in the tenth embodiment and the surface on which the piezoelectric film 543 is to be formed in the eleventh embodiment are all surface-treated by irradiation with an ion beam, [crystals] in which the crystal planes are oriented in a specified direction remain on the surface, while other [crystals] are etched away. Accordingly, the buffer layer 55 in the ninth embodiment, the bottom electrode 542 in the ninth and tenth embodiments, and the piezoelectric film 543 in the ninth, tenth and eleventh embodiments, undergo crystal growth while being influenced by the respective underlayers, so that all of these layer have a good orientation. In cases where these layers are epitaxially grown on the respective underlayers, the resulting layers have an even better orientation.

In regard to the composition of the diaphragm 53, oxides and the like similar to those used in the insulating layers 15 of the capacitors 200 according to the abovementioned ninth through eleventh embodiments can be used. In regard to the composition of the buffer layer 55, oxides and the like similar to those used in the buffer layers 12 of the capacitors 200 according to the abovementioned ninth through eleventh embodiments can be used. However, especially in the ninth embodiment, compounds with an NaCl structure such as MgO, CaO, SrO, BaO, NiO and the like are desirable.

The bottom electrode 542 can be constructed from materials similar to those of the capacitors 200 according to the abovementioned ninth through eleventh embodiments. Furthermore, in the ninth embodiment in which the surface on which the buffer layer 55 constituting an intermediate film is to be formed is oriented in an in-plane orientation by irradiation with an ion beam, since the orientation of the [resulting] buffer layer 55 is uniformly arranged, the bottom electrode 542 has a uniformly arranged orientation as a result of this bottom electrode 542 being formed on top of this buffer layer 55. In particular, it is desirable that the bottom electrode 542 be formed on top of the buffer layer 55 by epitaxial growth.

Furthermore, in the tenth embodiment in which the surface on which the bottom electrode 542 is to be formed is oriented in an in-plane orientation by irradiation with an ion beam, it is especially desirable that the composition of the bottom electrode 542 contain at least one substance from a set comprising SrRuO$_3$, LaNiO$_x$, YBa$_2$Cu$_3$O$_x$ and solid solutions containing these compounds.

Furthermore, in cases where the bottom electrode 542 is a metal oxide which has a perovskite structure, there is little lattice mismatching with ferroelectric materials that have a perovskite structure. Accordingly, in the ninth and tenth embodiments, the piezoelectric film 543 can be easily and reliably grown on top of the bottom electrode 542 with a rhombohedral crystal (100) orientation by epitaxial growth. Furthermore, the bonding characteristics of the piezoelectric film 543 with the bottom electrode 542 are improved.

Furthermore, the piezoelectric film 543 can be constructed from various types of ferroelectric materials. However, it is desirable that this film contain ferroelectric materials that have a perovskite structure, and a piezoelectric film in which ferroelectric materials that have a perovskite structure are the main materials is even more desirable. Furthermore, such ferroelectric materials that have a perovskite structure may be either materials that have a rhombohedral crystal (100) orientation or materials that have a tetragonal crystal (001) orientation. In particular, materials that have a rhombohedral crystal (100) orientation are especially desirable. As a result, the abovementioned effect is improved.

Materials similar to those cited for the capacitors 200 according to the abovementioned ninth through eleventh embodiments can be used as such ferroelectric materials that have a perovskite structure. As a result, the piezoelectric device 54 is superior in terms of various characteristics.

Furthermore, there are no particular restrictions on the mean thickness of the piezoelectric film 543; however, for example, it is desirable that this mean thickness be approximately 100 to 3000 nm, and a mean thickness of approximately 500 to 2000 nm is even more desirable. By setting the mean thickness of the piezoelectric film 543 in the abovementioned range, it is possible to form a piezoelectric device which appropriately manifests various characteristics while preventing an increase in the size of the piezoelectric device 54.

In the ninth embodiment in which the surface on which the buffer layer 55 is to be formed is irradiated with an ion beam, and the tenth embodiment in which the surface on which the bottom electrode 542 is to be formed is irradiated with an ion beam, since the orientation of the bottom electrode 542 is uniformly arranged in both cases as described above, the piezoelectric film 543 has a uniformly arranged orientation by forming the piezoelectric film 543 on the bottom electrode 542. In particular, it is desirable that the piezoelectric film 543 be formed on top of the bottom electrode by epitaxial growth.

Furthermore, in the eleventh embodiment, since the surface on which the piezoelectric film 543 is to be formed is irradiated with an ion beam, the piezoelectric film 543 as a whole shows a good orientation as described above.

A top electrode 541 is formed on top of the piezoelectric film 543. The constituent materials and mean thickness of this top electrode 541 may be the same as those of the top electrode 25 described in the capacitors 200 according to the abovementioned ninth through eleventh embodiments.

Furthermore, in the ninth embodiment, it would also be possible to reverse the lamination order of the diaphragm 53 and the buffer layer 55, to orient the buffer layer in an in plane orientation by irradiating the surface of the buffer layer with an ion beam, to form a diaphragm constituting an intermediate film on top of this buffer layer by epitaxial growth, and to form a bottom electrode 542 on top of this diaphragm.

<28. Piezoelectric Device Manufacturing Methods (9 Through 11)>

Figure 25:
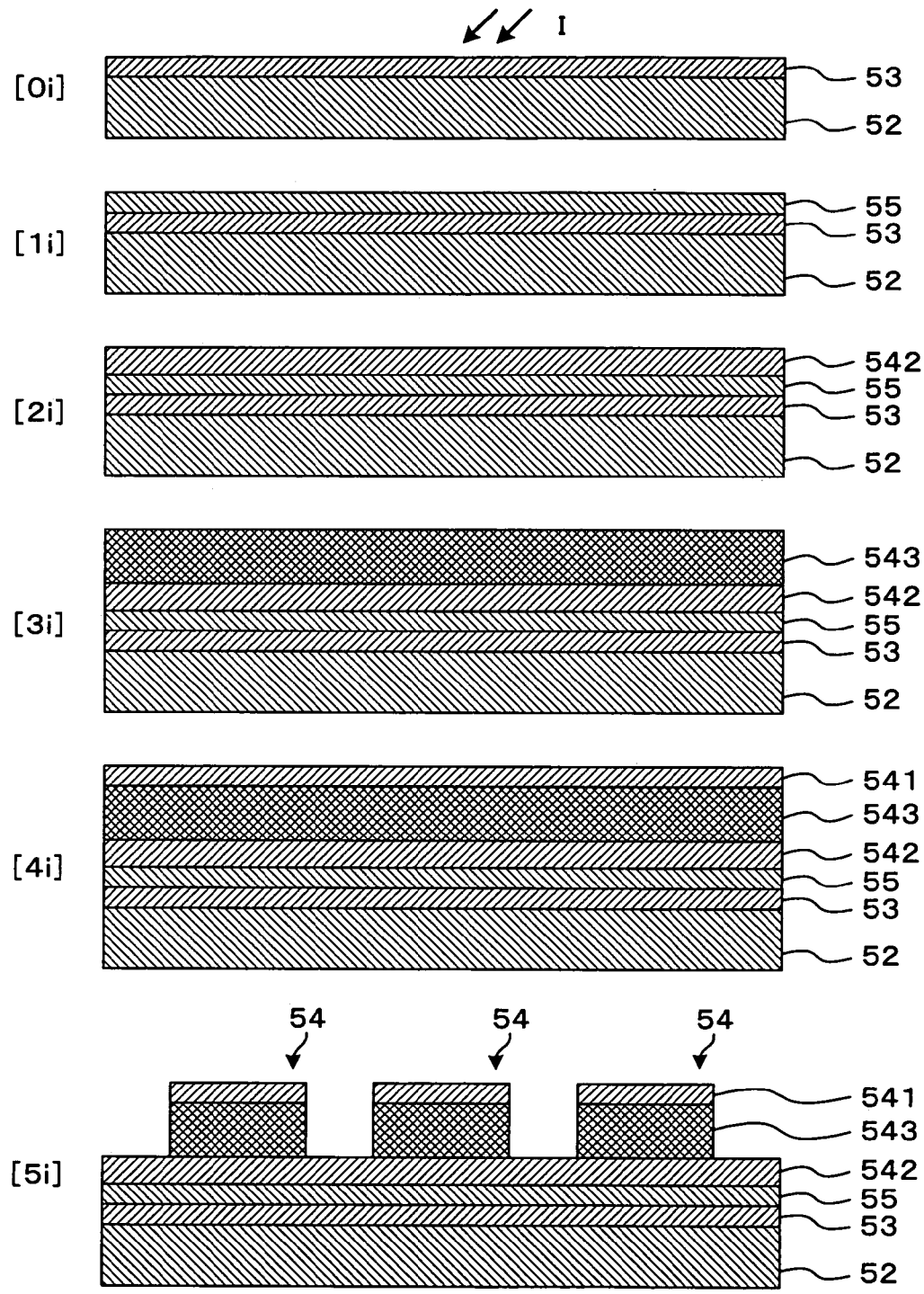
FIG. 25 is a diagram which is used to illustrate a piezoelectric device manufacturing method according to a ninth embodiment.
Figure 26:
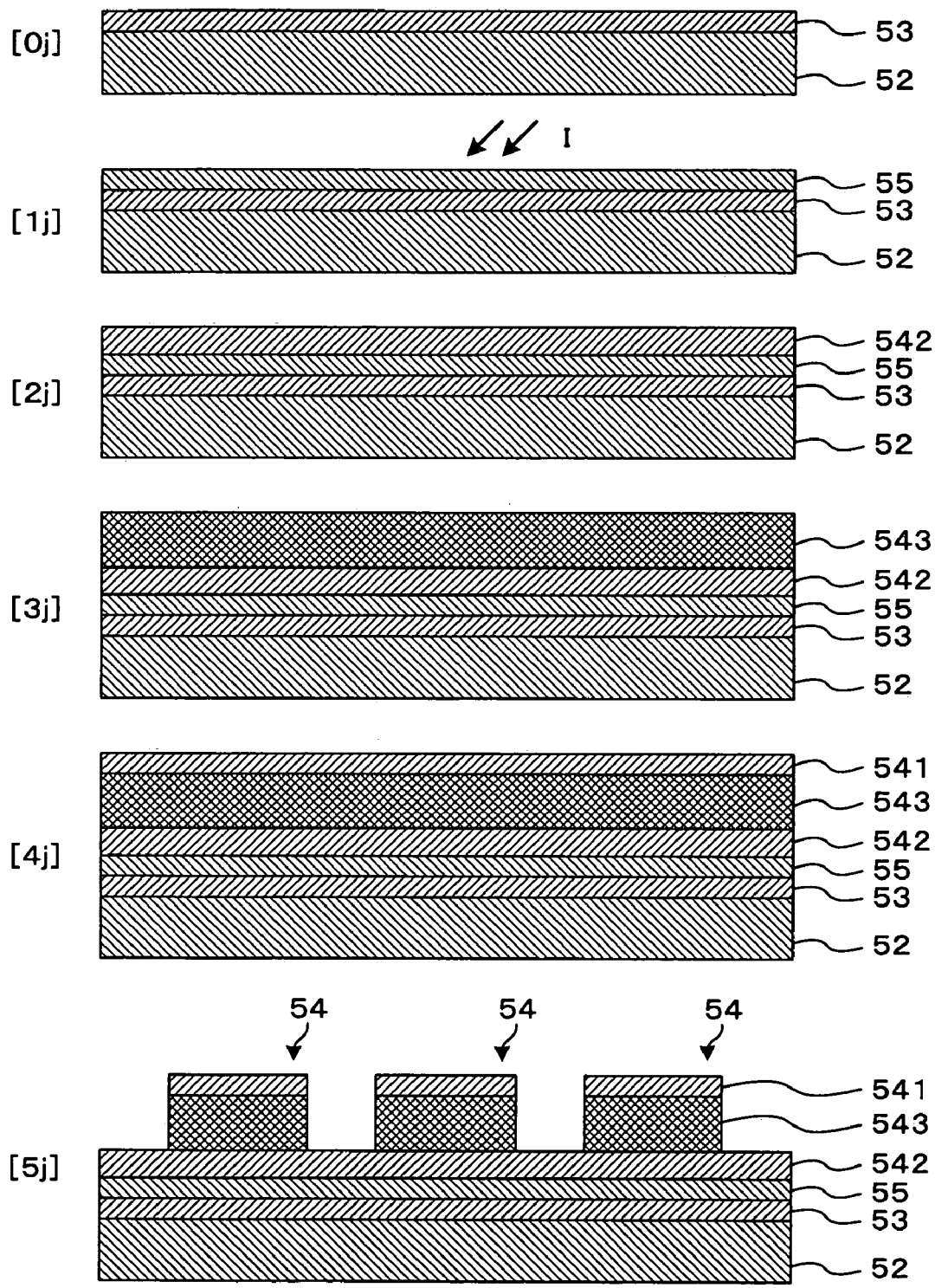
FIG. 26 is a diagram which is used to illustrate a piezoelectric device manufacturing method according to an tenth embodiment.
Figure 27:
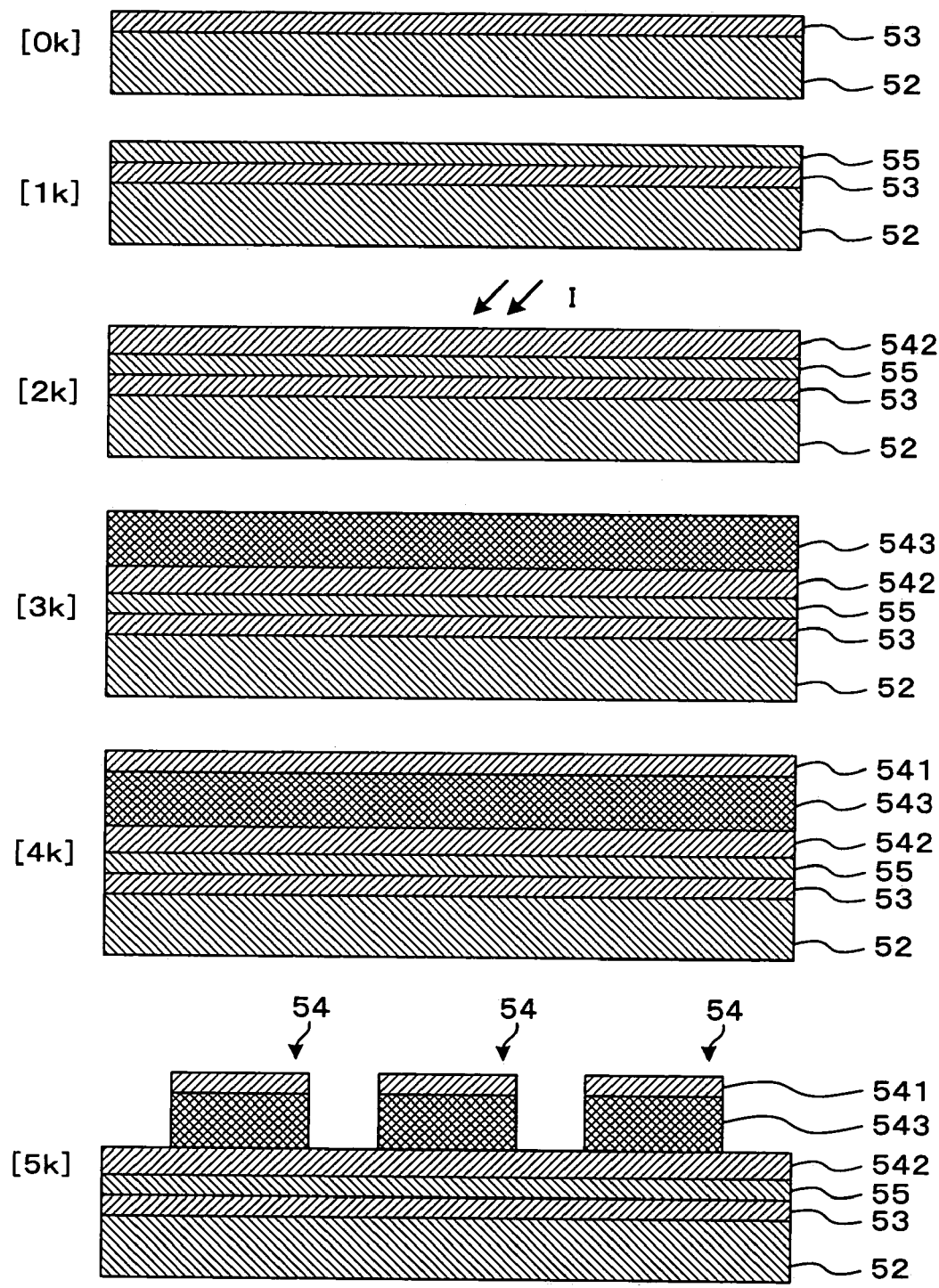
FIG. 27 is a diagram which is used to illustrate a piezoelectric device manufacturing method according to an eleventh embodiment.

Next, methods for manufacturing [the abovementioned] piezoelectric devices according to the ninth through eleventh embodiments [of the present invention] will be described with reference to FIGS. 25 through 27.

The methods for manufacturing the piezoelectric devices 54 described below [each] comprise a step in which a diaphragm 53 is formed on the substrate 52 (diaphragm formation step), a step in which a buffer layer 55 is formed (buffer layer formation step), a step in which a bottom electrode 542 is formed on top of the buffer layer 55 (bottom electrode formation step), a step in which a piezoelectric film 543 is formed on top of the bottom electrode 542 (piezoelectric film formation step), a step in which a top electrode 541 is formed on top of the piezoelectric film 543 (top electrode formation step), and a step in which the piezoelectric film and top electrode are patterned (patterning step). These respective steps will be described in order below.

[0$i$] [0$j$] [0$k$] Diaphragm Formation Step

These steps are performed in the same manner as in the case of the insulating layers in the abovementioned steps [0I], [0J] and [0K].

[1$i$] [1$j$] [1$k$] Buffer Layer Formation Step

These steps are performed in the same manner as in the case of the buffer layers in the abovementioned steps [1I], [1J] and [1K]. In the manufacturing method for the piezoelectric device 54 according to the ninth embodiment, as in the case of the capacitor 200 according to the abovementioned ninth embodiment, the surface on which the buffer layer 55 is to be formed is irradiated with an ion beam [0$i$] in FIG. 25), and the buffer layer 55 is then formed by epitaxial growth ([1$i$] in FIG. 25).

[2$i$] [2$j$] [2$k$] Bottom Electrode Formation Step

These steps are performed in the same manner as the abovementioned steps [2I], [2J] and [2K]. In the manufacturing method for the piezoelectric device 54 according to the tenth embodiment, as in the case of the capacitor 200 according to the abovementioned tenth embodiment, the surface on which the bottom electrode 542 is to be formed is irradiated with an ion beam ([1$j$] in FIG. 26), and the bottom electrode 542 is then formed by epitaxial growth ([2$j$] in FIG. 26]). In the ninth embodiment, it is desirable that the bottom electrode 542 be epitaxially grown on top of the buffer layer 55.

[3$i$] [3$j$] [3$k$] Piezoelectric Film Formation Step

Next, a piezoelectric film 543 is formed on top of the bottom electrode 542. This can be accomplished in the same manner as in the abovementioned steps [3I], [3J] and [3K]. In the manufacturing method for the piezoelectric device 54 according to the eleventh embodiment, as in the case of the capacitor 200 according to the abovementioned eleventh embodiment, the surface on which the piezoelectric film 543 is to be formed is irradiated with an ion beam ([2$k$] in FIG. 27), and the piezoelectric film 543 is formed by epitaxial growth ([3$k$] in FIG. 27). In the ninth and tenth embodiments, it is desirable that the piezoelectric film 543 be epitaxially grown on top of the bottom electrode 542.

[4$i$] [4$j$] [4$k$] Top Electrode Formation Step

Next, a top electrode 541 is formed on top of the piezoelectric film 543. In concrete terms, platinum (Pt) or the like is formed into a film with a film thickness of 100 nm as the top electrode 541 by a direct-current sputtering method.

[5*i*] [5*j*] [5*k*] Patterning Step

A piezoelectric device is formed by working the piezoelectric thin film 543 and top electrode 541 into specified shapes. In concrete terms, the surface of the top electrode 541 is spin-coated with a resist, and is then patterned into a specified shape by exposure and development. The top electrode 541 and piezoelectric thin film 543 are then etched by ion milling or the like using the remaining resist as a mask.

The piezoelectric devices 54 according to the ninth, tenth and eleventh embodiments are respectively manufactured by the abovementioned steps [0*i*] through [5*i*], [0*j*] through [5*j*] and [0*k*] through [5*k*].

<29. Ferroelectric Memory Construction>

Next, a ferroelectric memory which is equipped with the ferroelectric device of the present invention as a capacitor will be described.

Figure 28:
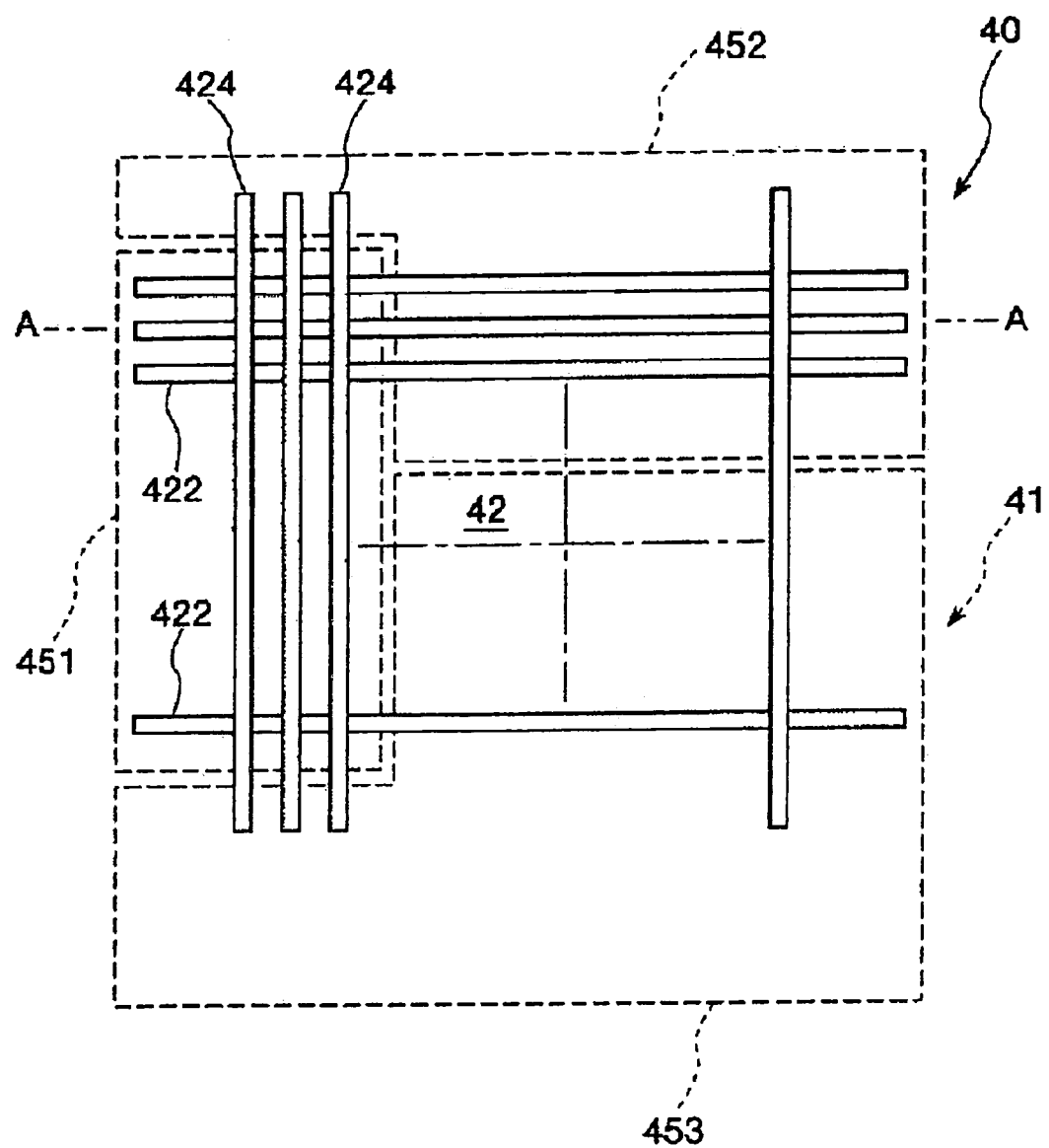
FIG. 28 is a plan view which shows an embodiment of the ferroelectric memory of the present invention in model form.
Figure 29:
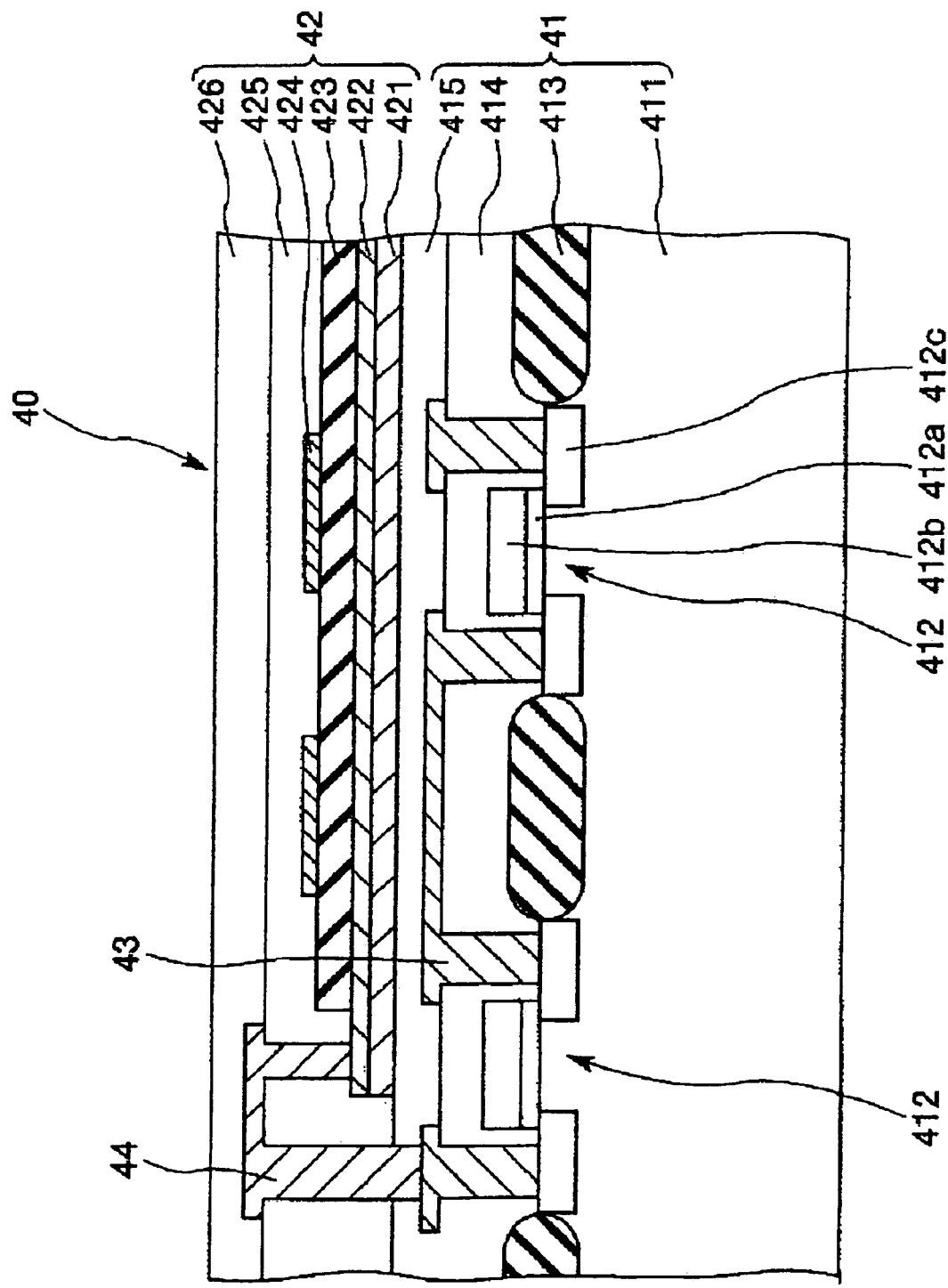
FIG. 29 is a sectional view along line A—A in FIG. 28.

FIG. 28 is a plan view which shows an embodiment of the ferroelectric memory of the present invention in model form, and FIG. 29 is an enlarged sectional view along line A—A in FIG. 28. Furthermore, in order to avoid complexity, a portion of the shading indicating that the figure is a sectional view is omitted from FIG. 28.

As is shown in FIG. 29, the ferroelectric memory 40 comprises a memory cell array 42 and a peripheral circuit part 41. This memory cell array 42 and peripheral circuit part 41 are formed in different layers. In the present embodiment, the peripheral circuit 41 is formed in the lower layer (lower side), and the memory cell array 42 is formed in the upper layer (upper side).

In the memory cell array 42, first signal electrodes (word lines) 422 used for row selection and second signal electrodes (bit lines) 424 used for column selection are disposed perpendicular to each other. Furthermore, the disposition of the signal electrodes is not limited to this disposition, but may also be the opposite of this disposition. Specifically, the first signal electrodes 422 may be bit lines, and the second signal electrodes 424 may be word lines.

Ferroelectric films 423 are disposed between these first signal electrodes 422 and second signal electrodes 424, so that respective unit capacitors (memory cells) are constructed in the regions where the first signal electrodes 422 and second signal electrodes 424 intersect.

Furthermore, a first protective layer 425 comprising an insulating material is formed so that this layer covers the first signal electrodes 422, ferroelectric films 423 and second signal electrodes 424.

Furthermore, a second protective layer 426 comprising an insulating material is formed on top of the first protective layer 425 so that this second protective layer 427 covers a second wiring layer 44.

The first signal electrodes 422 and second signal electrodes 424 are respectively electrically connected to a first wiring layer 43 of the peripheral circuit part 41 by the second wiring layer 44.

As is shown in FIG. 28, the peripheral circuit part 41 comprises a first driving circuit 451 which is used for selective control of the first signal electrodes 422, a second driving circuit 452 which is used for selective control of the second signal electrodes 424, and a signal detection circuit 453 such as a sense amplifier or the like, so that the writing or reading of information can be selectively performed with respect to the abovementioned unit capacitors (memory cells).

Furthermore, as is shown in FIG. 29, the peripheral circuit part 41 has MOS transistors 412 that are formed on a semiconductor substrate 411. [Each of] these MOS transistors 412 has a gate insulating layer 412*a*, a gate electrode 412*b* and a source/drain region 412*c*.

The MOS transistors 412 are respectively separated by element separating regions 413, and are respectively electrically connected by the first wiring layer 43, which is formed in a specified pattern.

A first inter-layer insulating layer 414 is formed on the surface of the semiconductor substrate 411 on which the MOS transistors 412 are formed, and a second inter-layer insulating layer 415 is formed on top of the first inter-layer insulating layer 414 so as to cover the first wiring layer 43.

A memory cell array 42 which includes a buffer layer 421 is formed on top of this second inter-layer insulating layer 415.

Furthermore, the peripheral circuit part 41 and memory cell array 42 are electrically connected by the second wiring layer 44.

In the present embodiment, the abovementioned capacitor 200 is constructed by [elements comprising] the second inter-layer insulating layer 415, buffer layer 421, first signal electrode 422, ferroelectric film 423 and second signal electrode 424.

In a ferroelectric memory 40 constructed as described above, since the peripheral circuit part 41 and memory cell array 42 are laminated on a single semiconductor substrate 411, the chip area can be greatly reduced compared to a case in which the peripheral circuit part 41 and memory cell array 42 are disposed on the same surface, so that the degree of integration of the unit capacitors (memory cells) can be increased.

One example of the write and read operations in such a ferroelectric memory 40 will be described.

First, in the read operation, a read-out voltage "Vo" is applied to the selected unit capacitor. This simultaneously serves as a "0" write operation. In this case, the current flowing through the selected bit line or the potential when the bit line is placed at a high impedance is read out by the sense amplifier.

In this case, furthermore, a specified voltage is applied to the unit capacitors that are not selected, in order to prevent crosstalk during read-out.

Meanwhile, in the write operation, in cases where "1" is to be written, a voltage of "−Vo" is applied to the selected unit capacitor. In cases where "0" is to be written, a voltage that does not invert the polarity of the selected unit capacitor is applied to this selected unit capacitor, so that a written "0" state is maintained during the read-out operation.

In this case, furthermore, a specified voltage is applied to the unit capacitors that are not selected, in order to prevent crosstalk during the write operation.

<30. Ferroelectric Memory Manufacturing Method>

Next, one example of the method used to manufacture the ferroelectric memory 40 will be described.

For example, the ferroelectric memory 40 described above can be manufactured as follows:

1—First, the peripheral circuit part 41 is formed using a universally known LSI process (semiconductor process).

In concrete terms, MOS transistors 412 are formed on a semiconductor substrate 411. For example, element separating regions 413 are formed in specified regions on the semiconductor substrate 411 using a trench separation method, LOCOS method or the like; next, gate insulating films 412*a* and gate electrodes 412*b* are formed, and source/drain regions 412*c* are then formed by doping the semiconductor substrate 411 with impurities.

2—Next, after a first inter-layer insulating layer 414 is formed, contact holes are formed, and a first wiring layer 43 with a specified pattern is then formed.

3—Next, a second inter-layer insulating layer 415 is formed on top of the first inter-layer insulating layer 414 on which the first wiring layer 43 has been formed.

In this way, a peripheral circuit part 41 which has various types of circuits such as driving circuits 451, 452, a signal detection circuit 453 and the like is formed.

4—Next, a memory cell array 42 is formed on top of the peripheral circuit part 41. This can be accomplished in the same manner as in the abovementioned steps [1A] through [5A], [1B] through [5B] or the like.

5—Next, a first protective layer 425 is formed on top of the ferroelectric film 423 on which the second signal electrodes 424 have been formed, contact holes are formed in specified regions of the first protective layer 425, and a second wiring layer 44 with a specified pattern is then formed. As a result, the peripheral circuit part 41 and memory cell array 42 are electrically connected.

6—Next, a second protective layer 426 is formed on the uppermost layer.

In this way, a memory cell array 42 is formed, and a ferroelectric memory 40 is obtained.

Such a ferroelectric memory 40 can be applied to various types of electronic devices. Examples of such electronic devices include personal computers, IC cards, tags, portable telephones and the like.

<31. Ink Jet Recording Head Construction (1)>

Next, an ink jet recording head which is a liquid jetting head equipped with the piezoelectric device of the present invention will be described.

Figure 30:
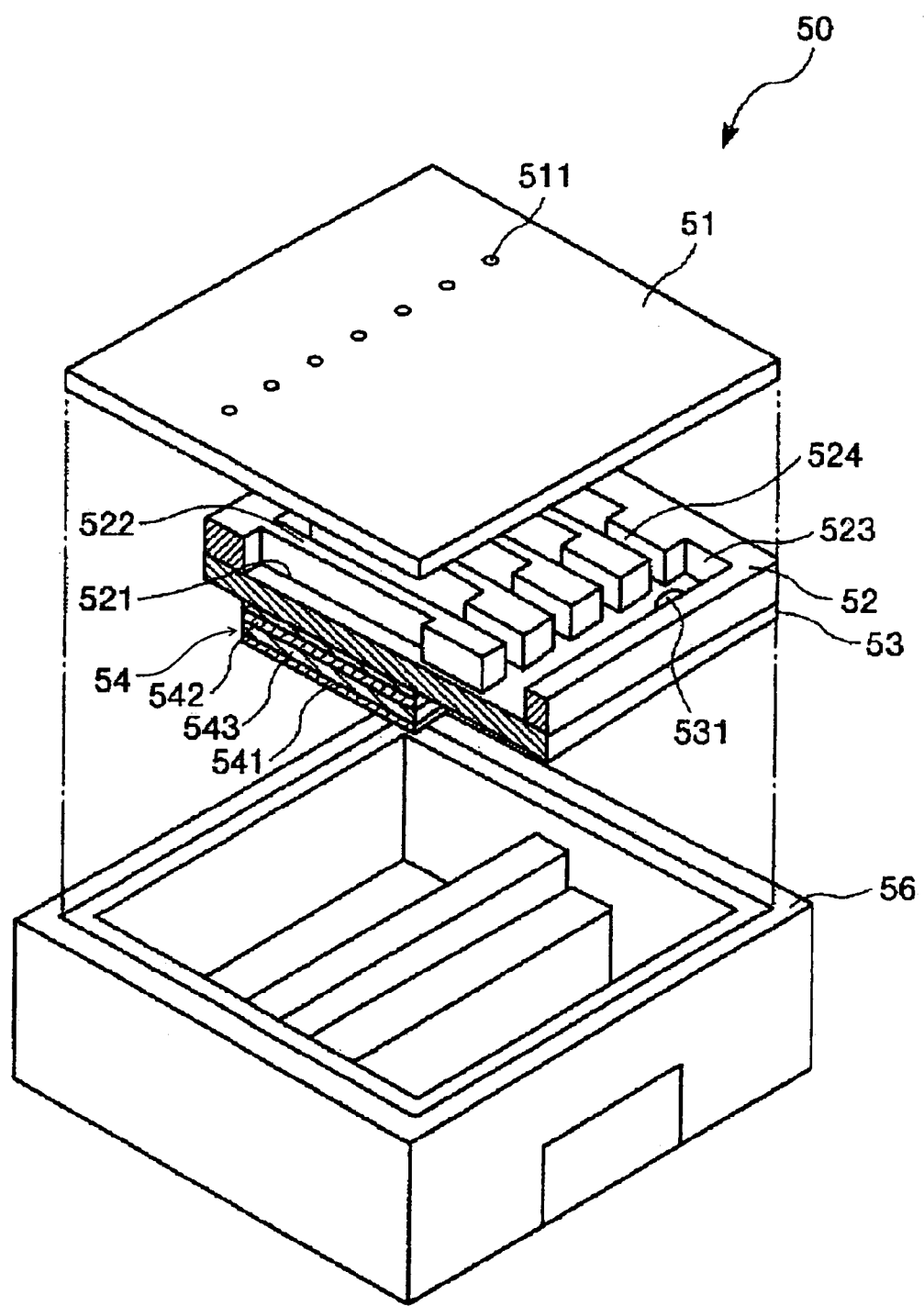
FIG. 30 is an exploded perspective view showing an embodiment of an ink jet type recording head which is a liquid jetting head according to a first embodiment of the present invention.

FIG. 30 is an exploded perspective view which shows an ink jet recording head constituting a first embodiment [of the present invention]. The abovementioned FIG. 15 shows the main parts of the ink jet recording head in FIG. 30 in a sectional view. Furthermore, FIG. 30 shows the head upside down (with respect to the state in which the head is ordinarily used).

The ink jet recording head 50 (hereafter referred to simply as the "head 50") shown in FIG. 30 comprises a nozzle plate 51, ink compartment substrate 52, diaphragm 53, and piezoelectric element (vibration source) 54 which is bonded to the diaphragm 53. These parts are accommodated in a base part 56. Furthermore, this head 50 forms an on-demand type piezo-jetting system.

For example, the nozzle plate 51 is constructed from a rolled plate made of stainless steel or the like. Numerous nozzles 511 which are used to jet ink droplets are formed on this nozzle plate 51. The pitch between these nozzles 511 is appropriately set in accordance with the printing precision.

An ink compartment substrate 52 is fixed (fastened) to this nozzle plate 51. In this ink compartment substrate 52, a plurality of ink compartments (cavities or pressure compartments) 521, a reservoir 523 which temporarily holds ink that is supplied from an ink cartridge 631, and supply ports 524 which respectively supply ink to the respective ink compartments 521 from the reservoir 523, are demarcated by the nozzle plate 51, side walls (partition walls) 522 and diaphragm 53 (described later).

These ink compartments 521 are respectively formed in the shape of a rectangular solid, and are disposed in positions corresponding to the respective nozzles 511. The volume of each ink compartment 521 can be varied by the vibration of the diaphragm 53 (described later), so that ink can be jetted as a result of this variation in volume.

For example, a silicon single-crystal substrate, various types of glass substrates, various types of plastic substrates or the like can be employed as the matrix material that is used to obtain this ink compartment substrate 52. These substrates are all commonly used substrates; accordingly, the manufacturing cost of the head 50 can be reduced by using such substrates.

Furthermore, among these substrates, a silicon single-crystal substrate with a (110) orientation is especially desirable for use as the matrix material. Since such a silicon single-crystal substrate with a (110) orientation is suitable for anisotropic etching, the ink compartment substrate 52 can be formed easily and reliably.

There are no particular restrictions on the mean thickness of this ink compartment substrate 52; however, it is desirable to set this thickness as approximately 10 to 1000 μm, and it is even more desirable to set this thickness at approximately 100 to 500 μm.

There are no particular restrictions on the volume of the ink compartments 521; however, it is desirable to set this volume at approximately 0.1 to 100 nL, and it is even more desirable to set this volume at approximately 0.1 to 10 nL.

Meanwhile, the diaphragm 53 is bonded to the opposite side of the nozzle plate 51 from the ink compartment substrate 52, and a plurality of piezoelectric elements 54 are disposed on the opposite side of the ink compartment substrate 52 from the diaphragm 53.

Furthermore, a through-hole 531 which passes through the diaphragm 53 in the direction of thickness is formed in a specified position on the diaphragm 53. Ink can be supplied to the reservoir 523 from an ink cartridge 631 (described later) via this through-hole 531.

The respective piezoelectric elements 54 are formed by interposing piezoelectric film 543 between bottom electrodes 542 and top electrodes 541, and are disposed in positions corresponding to substantially the central portions of the respective ink compartments 521. The respective piezoelectric elements 54 are electrically connected to a piezoelectric element driving circuit (described later), and are constructed so that these elements are operated (caused to vibrate or undergo deformation) on the basis of signals from the piezoelectric element driving circuit.

These piezoelectric elements 54 respectively function as vibration sources; the diaphragm 53 is caused to vibrate by the vibration of the piezoelectric elements 54, and functions to cause an instantaneous increase in the internal pressure of the ink compartments 521.

The base part 56 is constructed (for example) from various types of resin materials, various types of metal materials or the like; the ink compartment substrate plate 52 is fastened to and supported on this base part 56.

When this head 50 is in a state in which specified jetting signals are not input via the piezoelectric element driving circuit, i.e., a state in which no voltage is applied across the bottom electrodes 542 and top electrodes 541 of the piezoelectric elements 54, no deformation occurs in the piezoelectric films 543. Accordingly, no deformation occurs in the diaphragm 53, either, so that no variation occurs in the volume of the ink compartments 521. Consequently, ink droplets are not jetted from the nozzles 511.

On the other and, in a state in which specified jetting signals are input via the piezoelectric element driving circuit, i.e., in a state in which a fixed voltage is applied across the bottom electrodes 542 and top electrodes 541 of the piezoelectric elements 54, deformation occurs in the piezoelectric films 543. As a result, the diaphragm 53 shows a large flexing movement, so that a variation in the volume of the ink compartments 521 occurs. In this case, the pressure inside the ink compartments 521 increases instantaneously, so that ink droplets are caused to jet from the nozzles 511.

When one ink jetting operation is completed, the piezoelectric element driving circuit stops the application of a voltage across the bottom electrodes 542 and top electrodes 541. As a result, the piezoelectric elements 54 return to substantially their original shape, and the volume of the ink compartments 521 increases. In this case, furthermore, pressure directed toward the nozzles 511 from the ink cartridge 631 described later (i.e., pressure directed in the positive direction) acts on the ink. Accordingly, air is prevented from entering the ink compartments 521 from the nozzles 511, and an amount of ink corresponding to the amount of ink that was discharged is supplied to the ink compartments 521 from the ink cartridge 631 via the reservoir 523.

Thus, in the head 50, any desired characters, figures or the like can be printed by successively inputting jetting signals via the piezoelectric element driving circuit to piezoelectric elements 54 located in positions where it is desired to perform printing.

<32. Ink Jet Recording Head Construction (2)>

Figure 31:
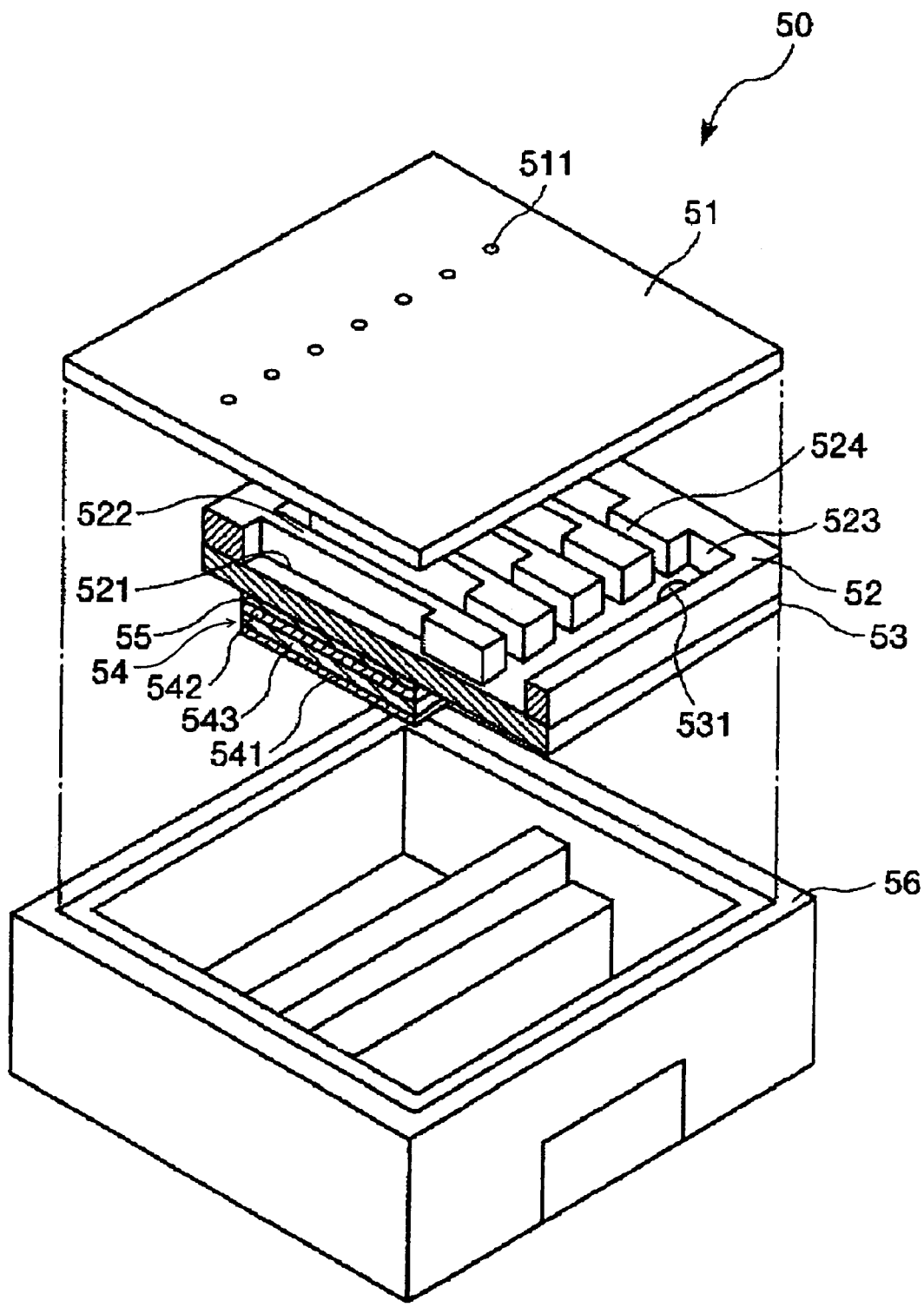
FIG. 31 is an exploded perspective view showing an embodiment of an ink jet type recording head which is a liquid jetting head according to a fifth embodiment of the present invention.

FIG. 31 is an exploded perspective view of an ink jet recording head according to a second embodiment [of the present invention]. The ink jet recording head 50 shown in FIG. 31 is similar to the first embodiment shown in FIG. 30, except for the fact that a buffer layer 55 constituting the second layer of an intermediate film is added to the diaphragm 53 constituting the first layer of this intermediate film.

<33. Ink Jet Recording Head Manufacturing Method>

Next, an example of the method used to manufacture the head 50 will be described. For example, the head 50 described above can be manufactured as follows:

10—First, the matrix material constituting the ink compartment substrate 52 and the diaphragm 53 are pasted together (bonded) so that these parts are formed into an integral unit.

For example, a method in which the matrix material and diaphragm 53 are heat-treated in a state in which these parts are pressed together may be appropriately used for this bonding. If such a method is used, the matrix material and diaphragm 53 can be easily and reliably formed into an integral unit.

There are no particular restrictions on the conditions of this heat treatment; however, it is desirable to perform this heat treatment for 1 to 24 hours at 100 to 600° C., and it is even more desirable to perform this heat treatment for 6 to 12 hours at 300 to 600° C. Furthermore, various types of adhesive bonding methods, various types of fusion methods and the like may also be used for this bonding.

20—Next, piezoelectric elements 54 are formed on top of the diaphragm 53. This can be accomplished in the same manner as in the abovementioned steps [1a] through [5a], [1b] through [5b] or the like.

30—Next, recessed parts that form the respective ink compartments 521 are formed in positions corresponding to the piezoelectric elements 54 in the matrix material that forms the ink compartment substrate 52, and recessed parts that form the reservoir 523 and supply ports 524 are also formed in specified positions [in this matrix material].

In concrete terms, a mask layer is formed in accordance with the positions where the ink compartments 521, reservoir 523 and supply ports 524 are to be formed; then, dry etching using a parallel flat plate type reactive ion etching system, inductive coupling system, electron cyclotron resonance system, helicon wave excitation system, magnetron system, plasma etching system, ion beam etching system or the like, or wet etching using a highly concentrated aqueous solution of an alkali such as 5 wt % to 40 wt % potassium hydroxide, tetramethylammonium hydroxide or the like, is performed.

As a result, the matrix material is etched away (removed) in the direction of thickness until the diaphragm 53 is exposed, so that an ink compartment substrate 52 is formed. In this case, furthermore, the portions that remain without being etched form the side walls 522, and the exposed diaphragm 53 assumes a state that allows this plate to function as a diaphragm.

Furthermore, in cases where a silicon substrate with a (110) orientation is used as the matrix material, the matrix material can easily be anisotropically etched using the abovementioned highly concentrated aqueous solution of an alkali; accordingly, formation of the ink compartment substrate 52 is facilitated.

40—Next, a nozzle plate 51 in which a plurality of nozzles 511 have been formed is positioned and bonded so that the respective nozzles 511 correspond to the recessed parts that form the respective ink compartments 521. As a result, a plurality of ink compartments 521, a reservoir 523 and a plurality of supply ports 524 are demarcated.

For example, various types of adhesive bonding methods such as adhesive bonding using an adhesive agent or the like, or various types of fusion methods or the like can be used for this bonding.

50—Next, the ink compartment substrate 52 is attached to a base part 56. In this way, an ink jet recording head 50 is obtained.

<34. Ink Jet Printer>

Next, an ink jet printer which is a liquid jetting device equipped with the ink jet recording head of the present invention will be described.

Figure 32:
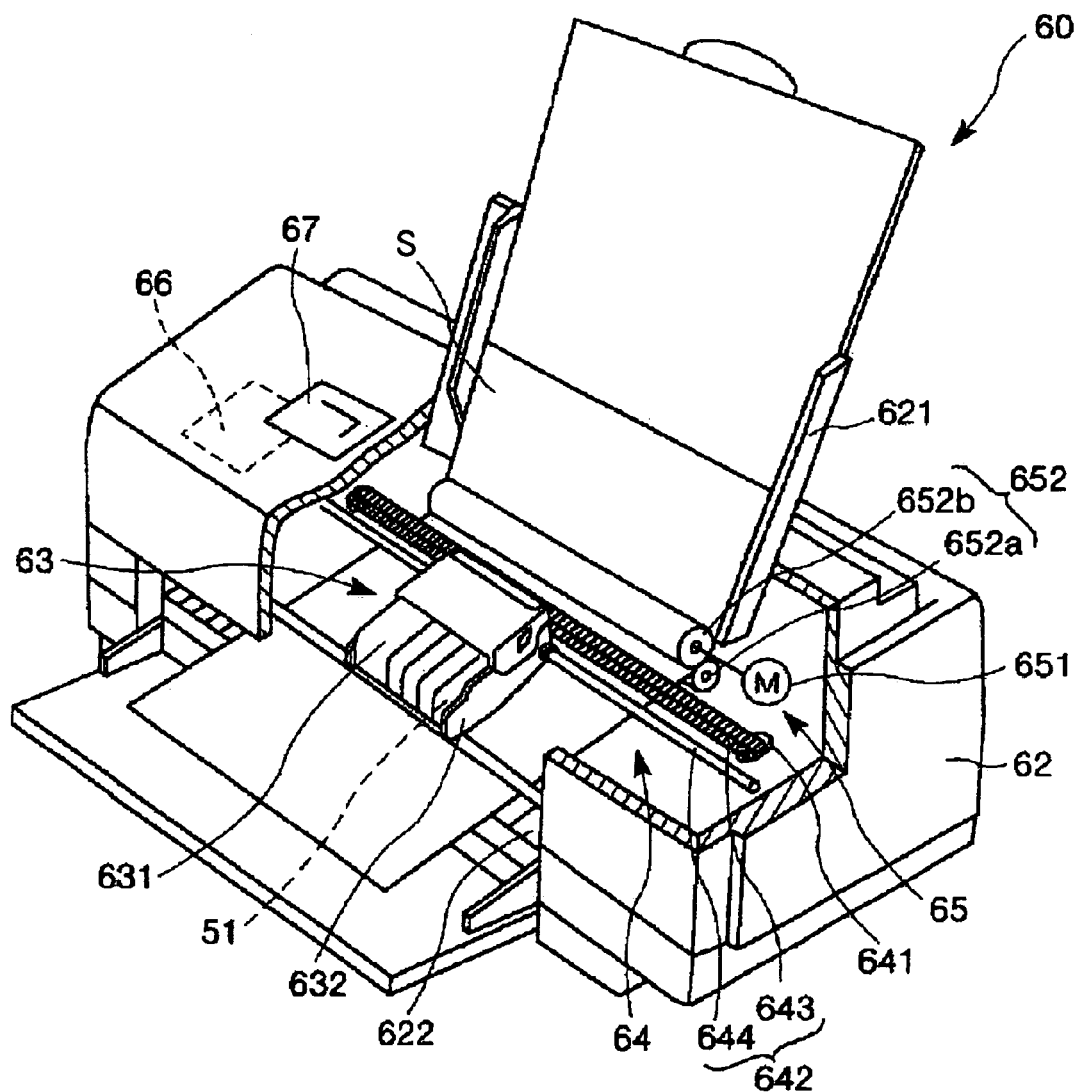
FIG. 32 is a schematic diagram showing an embodiment of an ink jet printer constituting the liquid jetting apparatus of the present invention.

FIG. 32 is a schematic diagram which shows an embodiment of the ink jet printer in the present embodiment. Furthermore, in the following description, the upper side in FIG. 32 will be referred to as the "top part", and the lower side will be referred to as the "bottom part".

The ink jet printer 60 shown in FIG. 32 comprises an apparatus main body 62; a tray 621 in which recording paper S is placed is disposed on the rear side of the top part, a discharge opening 622 which discharges this recording paper S is disposed on the front side of the bottom part, and an operating panel 67 is disposed on the surface of the top part.

The operating panel 67 comprises a display part (not shown in the figures) which is constructed from (for example) a liquid crystal display, organic EL display, LED lamps or the like, and which displays error messages and the like, and an operating part (not shown in the figures) which is constructed from various types of switches and the like.

Furthermore, the main parts disposed inside the apparatus main body 62 are a printing apparatus (printing means) 64 comprising a reciprocating head unit 63, a paper feeding apparatus (paper feeding means) 65 which feeds the recording paper S into the printing apparatus 64 one sheet at a time, and a control part (control means) 66 which controls the printing apparatus 64 and paper feeding apparatus 65.

Under the control of the control part 66, the paper feeding apparatus 65 intermittently feeds the recording paper S one sheet at a time. This recording paper S passes through the area in the vicinity of the bottom part of the head unit 63. In this case, the head unit 63 performs a reciprocating motion in a direction that is substantially perpendicular to the feeding direction of the recording paper S, so that printing is performed on the recording paper S. Specifically, the reciprocating motion of the head unit 63 and the intermittent feeding of the recording paper S constitute the main scan and sub-scan in the printing operation, so that ink jet printing is performed.

The printing apparatus 64 comprises the [abovementioned] head unit 63, a carriage motor 641 which constitutes the driving source of the head unit 63, and a reciprocating mechanism 642 which receives the rotation of the carriage motor 641 and causes the head unit 63 to perform a reciprocating motion.

The bottom part of the head unit 63 has an ink jet recording head 50 comprising numerous nozzles 511, an ink cartridge 631 which supplies ink to the ink jet recording head 50, and a carriage 632 on which the ink jet recording head 50 and ink cartridge 631 are mounted.

Furthermore, full color printing can be accomplished by using a cartridge filled with inks of four colors, i.e., yellow, cyan, magenta and black, as the ink cartridge 631. In this case, ink jet recording heads 50 corresponding to the respective colors are disposed on the head unit 63.

The reciprocating mechanism 642 comprises a carriage guide shaft 643 which is supported at both ends on a frame (not shown in the figures), and a timing belt 644 which extends in a direction parallel tot high-sensitivity image pickup element 15 carriage guide shaft 643.

The carriage 632 is supported on the carriage guide shaft 643 so that this carriage 632 is free to perform a reciprocating motion, and is fastened to a portion of the timing belt 644.

When the timing belt 644 is caused to move in the forward or reverse direction via pulleys by the operation of the carriage motor 641, the head unit 63 performs a reciprocating motion while being guided by the carriage guide shaft 643. Furthermore, during this reciprocating motion, ink is appropriately caused to jet from the ink jet recording head(s) 50, so that printing is performed on the recording paper S.

The paper feeding apparatus 65 comprises a paper feeding motor 651 which constitutes the driving source of this apparatus, and paper feeding rollers 652 which are caused to rotate by the operation of the paper feeding motor 651.

The paper feeding rollers 652 are constructed from a driven roller 652a and a driving roller 652b which face the feeding path of the recording paper S (i.e., which clamp the recording paper S) from above and below, and this driving roller 652b is connected to the paper feeding motor 651. As a result, the paper feeding rollers 652 feed the numerous sheets of recording paper S disposed in the tray 621 into the printing apparatus 64 one sheet at a time. Furthermore, instead of the tray 621, it would also be possible to use a construction in which a paper supply cassette which accommodates recording paper S is detachably attached.

The control part 66 performs printing by controlling the printing apparatus 64, paper feeding apparatus 65 and the like on the basis of printing data that is input from a host computer such as a personal computer, digital camera or the like.

The control part 66 comprises mainly a memory which stores control programs the control the various parts and the like, a piezoelectric element driving circuit which drives the piezoelectric elements (vibration sources) 54 and controls the timing at which the ink is caused to jet, a driving circuit which drives the printing apparatus 64 (carriage motor 641), a driving circuit which drives the paper feeding apparatus 65 (paper feeding motor 651), a communications circuit which acquires printing data from the host computer, and a CPU which is electrically connected to these parts, and which performs various types of control in various parts (none of these components are shown in the figures).

Furthermore, for example, various types of sensors which can detect the remaining amount of ink in the ink cartridge 631, the position of the head unit 63, and the printing environment such as temperature, humidity and the like, are electrically connected to the CPU.

The control part 66 acquires printing data via the communications circuit, and stores this data in the memory. The CPU processes this printing data, and outputs driving signals to the respective driving circuits on the basis of this processed data and the input data from the various types of sensors. The piezoelectric elements 54, printing apparatus 64 and paper feeding apparatus 65 are respectively operated by these driving signals. As a result, printing is performed on the recording paper S.

<35. Other>

The ferroelectric device, piezoelectric device, ferroelectric memory, electronic device, ink jet recording head and ink jet printer of the present invention were described above in terms of embodiments shown in the attached figures. However, the present invention is not limited to these embodiments.

For example, the respective parts that constitute the ferroelectric device, piezoelectric device, ferroelectric memory, electronic device, ink jet recording head and ink jet printer of the present invention may be replaced by other arbitrary parts that show a similar function, and other constructions may be added.

Furthermore, for example, arbitrary steps may be added to the methods used to manufacture the [abovementioned] ferroelectric device, piezoelectric device, ferroelectric memory and ink jet recording head.

Furthermore, for example, the construction of the ink jet recording head of the abovementioned embodiment may be applied to the liquid jetting mechanisms of various types of industrial liquid jetting devices. In this case, besides the abovementioned inks (colored dye inks such as yellow, cyan, magenta and black inks or the like), solutions, liquid substances or the like that have a viscosity suitable for jetting from the nozzles (liquid jet openings) of the liquid jetting mechanism can be used in the liquid jetting device.

What is claimed is:

1. A method for manufacturing a piezoelectric device, comprising the steps of:
    forming a bottom electrode on a substrate by an ion beam assist method, wherein by irradiating ion beams on the bottom electrode, said bottom electrode has a specific crystal orientation;
    forming a piezoelectric film on top of said bottom electrode by performing a process in which a sol containing the material of the piezoelectric film is applied as a coating, dried and degreased to form a precursor, and this precursor is then fired; and
    forming a top electrode on top of said piezoelectric film;
    wherein said precursor is irradiated with an ion beam at least once following said degreasing in said step of forming said piezoelectric film.

2. The method for manufacturing a piezoelectric device according to claim 1, wherein said piezoelectric film is formed by repeating a multiple number of times a process in which a sol is applied as a coating, dried and degreased to form a precursor, and this precursor is then fired, and said irradiation with an ion beam is performed in a single process of said processes.

3. The method for manufacturing a piezoelectric device according to claim 1 or claim 2, wherein said irradiation with an ion beam is performed after said degreasing and before said firing.

4. The method for manufacturing a piezoelectric device according to claim 1, wherein said irradiation with an ion beam is performed during said firing.

5. A method for manufacturing a piezoelectric device, the method comprising:
   forming a bottom electrode on a substrate by an ion beam assist method, wherein by irradiating ion beams on the bottom electrode, said bottom electrode has a specific crystal orientation;
   forming a piezoelectric film on top of said bottom electrode by an ion beam assist method, wherein by irradiating ion beams on the piezoelectric film, said piezoelectric film has a specific crystal orientation; and
   forming a top electrode on top of said piezoelectric film.

6. The method for manufacturing a piezoelectric device according to claim 1 or 5, wherein said piezoelectric film is formed by PZT, BST or a relaxer material.

7. The method for manufacturing a piezoelectric device according to claim 1 or 5, wherein said piezoelectric film contains a solid solution of $PMN_y$-$PZT_{1-y}$ consisting of a relaxer material PMN comprising any of the compounds $Pb(M_{1/3}N_{2/3})O_3$ (M=Mg, Zn, Co, Ni, Mn; N=Nb, Ta), $Pb(M_{1/2}N_{1/2})O_3$ (M=Sc, Fe, In, Yb, Ho, Lu; N=Nb, Ta), $Pb(M_{1/2}N_{1/2})O_3$ (M=Mg, Cd, Mn, Co; N=W, Re) or $Pb(M_{2/3}N_{1/3})O_3$ (M=Mn, Fe; N=W, Re) or mixed phases of these compounds, and $Pb(Zr_xT_{1-x})O_3$ (PZT, $0.0 \leq x \leq 1.0$), and is oriented in any of the orientations of a cubic crystal (100), tetragonal crystal (001), rhombohedral crystal (100) or quasi-cubic crystal (100).

8. The method for manufacturing a piezoelectric device according to claim 7, wherein said piezoelectric film is formed on top of said bottom electrode by epitaxial growth.

9. The method for manufacturing a piezoelectric device according to claim 7, wherein said piezoelectric film contains a solid solution of $PMN_y$-$PZT_{1-y}$ consisting of a relaxer material PMN comprising any of the compounds $Pb(M_{1/3}N_{2/3})O_3$ (M=Mg, Zn, Co, Ni, Mn; N=Nb, Ta), $Pb(M_{1/2}N_{1/2})O_3$ (M=Sc, Fe, In, Yb, Ho, Lu; N=Nb, Ta), $Pb(M_{1/2}N_{1/2})O_3$ (M=Mg, Cd, Mn, Co; N=W, Re) or $Pb(M_{2/3}N_{1/3})O_3$ (M=Mn, Fe; N=W, Re) or mixed phases of these compounds, and $Pb(Zr_xT_{1-x})O_3$ (PZT, $0.0 \leq x \leq 1.0$), and is oriented in any of the orientations of a cubic crystal (100), tetragonal crystal (001), rhombohedral crystal (100) or quasi-cubic crystal (100).

10. The method for manufacturing a piezoelectric device according to claim 7, wherein said bottom electrode is formed by a metal material.

11. The method for manufacturing a piezoelectric device according to claim 7, wherein said bottom electrode is formed by a conductive oxide material with a perovskite crystal structure.

12. The method for manufacturing a piezoelectric device according to claim 7, wherein said bottom electrode contains any of the compounds $M_2RuO_4$ (M=Ca, Sr, Ba), $RE_2NiO_4$ (RE=La, Ce, Pr, Nd, Pm, Sm, Eu, Gd, Tb, Dy, Ho, Er, Tm, Yb, Lu, Y), $REBa_2Cu_3O_x$ (RE=La, Ce, Pr, Nd, Pm, Sm, Eu, Gd, Tb, Dy, Ho, Er, Tm, Yb, Lu, Y), $MRuO_3$ (M=Ca, Sr, Ba), $(RE,M)CrO_3$ (RE=La, Ce, Pr, Nd, Pm, Sm, Eu, Gd, Tb, Dy, Ho, Er, Tm, Yb, Lu, Y; M=Ca, Sr, Ba), $(RE,M)MnO_3$ (RE=La, Ce, Pr, Nd, Pm, Sm, Eu, Gd, Tb, Dy, Ho, Er, Tm, Yb, Lu, Y; M=Ca, Sr, Ba), $(RE,M)CoO_3$ (RE=La, Ce, Pr, Nd, Pm, Sm, Eu, Gd, Tb, Dy, Ho, Er, Tm, Yb, Lu, Y; M=Ca, Sr, Ba), or $RENiO_3$ (RE=La, Ce, Pr, Nd, Pm, Sm, Eu, Gd, Tb, Dy, Ho, Er, Tm, Yb, Lu, Y), or a solid solution containing these compounds, and is oriented in any of the orientations of a cubic crystal (100), tetragonal crystal (001), rhombohedral crystal (100) or quasi-cubic crystal (100).

13. A method for manufacturing a piezoelectric device comprising the steps of:
   forming a bottom electrode on a substrate;
   forming a piezoelectric film on top of said bottom electrode; and
   forming a top electrode on top of said piezoelectric film;
   wherein said step of forming a piezoelectric film comprises the steps of forming a first layer by an ion beam assist method, and forming a second layer by continuing deposition with the ion beam assist stopped.

14. A method for manufacturing a piezoelectric device comprising the steps of:
   forming a bottom electrode on a substrate;
   forming a piezoelectric film on top of said bottom electrode by an ion beam assist method, wherein by irradiating ion beams on the piezoelectric film, said piezoelectric film has a specific crystal orientation; and
   forming a top electrode on top of said piezoelectric film;
   wherein said step of forming a bottom electrode comprises the steps of forming a first layer by an ion beam assist method whereby irradiating ion beams on the bottom electrode, said bottom electrode has a specific crystal orientation, and forming a second layer by continuing deposition with the ion beam assist stopped.

15. The method for manufacturing a piezoelectric device according to claim 14, wherein said piezoelectric film is formed on top of said bottom electrode by epitaxial growth.

16. A method for manufacturing a piezoelectric device comprising the steps of:
   forming a bottom electrode on a substrate by an ion beam assist method, wherein by irradiating ion beams on the bottom electrode, said bottom electrode has a specific crystal orientation;
   forming a piezoelectric film on top of said bottom electrode by an ion beam assist method, wherein by irradiating ion beams on the piezoelectric film, said piezoelectric film has a specific crystal orientation; and
   forming a top electrode on top of said piezoelectric film;
   wherein the surface on which said piezoelectric film is to be formed is irradiated with an ion beam prior to the formation of said piezo electric film.

17. The method for manufacturing a piezo electric device according to claim 16, wherein said piezoelectric film is formed by epitaxial growth following said ion beam irradiation.

18. A method for manufacturing a piezoelectric device comprising the steps of:
   forming a bottom electrode on a substrate by an ion beam assist method, wherein by irradiating ion beams on the bottom electrode, said bottom electrode has a specific crystal orientation;
   forming a piezoelectric film on top of said bottom electrode by an ion beam assist method, wherein by irradiating ion beams on the piezoelectric film, said piezoelectric film has a specific crystal orientation; and
   forming a top electrode on top of said piezoelectric film;
   wherein the surface on which said bottom electrode is to be formed is irradiated with an ion beam prior to the formation of said bottom electrode.

19. The method for manufacturing a piezoelectric device according to claim 18, wherein said bottom electrode and said piezoelectric film are successively formed by epitaxial growth following said ion beam irradiation.

20. A method for manufacturing a ferroelectric device comprising the steps of:
forming a bottom electrode on a substrate by an ion beam assist method, wherein by irradiating ion beams on the bottom electrode, said bottom electrode has a specific crystal orientation;
forming a ferroelectric film on top of said bottom electrode by performing a process in which a sol containing the material of the ferroelectric film is applied as a coating, dried and degreased to form a precursor, and this precursor is then fired; and
forming a top electrode on top of said ferroelectric film;
wherein said precursor is irradiated with an ion beam at least once following said degreasing in said step of forming said ferroelectric film.

21. A method for manufacturing a ferroelectric device, the method comprising:
forming a bottom electrode on a substrate by an ion beam assist method, wherein by irradiating ion beams on the bottom electrode, said bottom electrode has a specific crystal onentation;
forming ferroelectric film on top of said bottom electrode by an ion beam assist method, wherein by irradiating ion beams on the ferroelectric film, said ferroelectric film has a specific crystal orientation; and
forming a top electrode on top of said ferroelectric film.

22. The method for manufacturing a ferroelectric device according to claim 21 or claim 20, wherein said ferroelectric film contains a solid solution of $PMN_y$-$PZT_{1-y}$ consisting of a relaxer material PMN comprising any of the compounds $Pb(M_{1/3}N_{2/3})O_3$ (M=Mg, Zn, Co, Ni, Mn; N=Nb, Ta), $Pb(M_{1/2}N_{1/2})O_3$ (M=Sc, Fe, In, Yb, Ho, Lu; N=Nb, Ta), $Pb(M_{1/2}N_{1/2})O_3$ (M=Mg, Cd, Mn, Co; N=W, Re) or $Pb(M_{2/3}N_{1/3})O_3$ (M=Mn, Fe; N=W, Re) or mixed phases of these compounds, and $Pb(Zr_xTi_{1-x})O_3$ (PZT, $0.0 \leq x \leq 1.0$), and is oriented in any of the orientations of a cubic crystal (100), tetragonal crystal (001), rhombohedral crystal (100) or quasi-cubic crystal (100).

23. The method for manufacturing a ferroelectric device according to claim 22, wherein said ferroelectric film contains a solid solution of $PMN_y$-$PZT_{1-y}$ consisting of a relaxer material PMN comprising any of the compounds $Pb(M_{1/3}N_{2/3})O_3$ (M=Mg, Zn, Co, Ni, Mn; N=Nb, Ta), $Pb(M_{1/2}N_{1/2})O_3$ (M=Sc, Fe, In, Yb, Ho, Lu; N=Nb, Ta), $Pb(M_{1/2}N_{1/2})O_3$ (M=Mg, Cd, Mn, Co; N=W, Re) or $Pb(M_{2/3}N_{1/3})O_3$ (M=Mn, Fe; N=W, Re) or mixed phases of these compounds, and $Pb(Zr_xTi_{1-x})O_3$ (PZT $0.0 \leq x \leq 1.0$), and is oriented in any of the orientations of a cubic crystal (100), tetragonal crystal (001), rhombohedral crystal (100) or quasi-cubic crystal (100).

24. The method for manufacturing a ferro electric device according to claim 22, wherein said bottom electrode contains any of the compounds $M_2RuO_4$ (M=Ca, Sr, Ba), $RE_2NiO_4$ (RE=La, Ce, Pr, Nd, Pm, Sm, Eu, Gd, Tb, Dy, Ho, Er, Tm, Yb, Lu, Y), $REB_{a2}Cu_3O_x$ (RE=La, Ce, Pr, Nd, Pm, Sm, Eu, Gd, Tb, Dy, Ho, Er, Tm, Yb, Lu, Y), $MRuO_3$ (M=Ca, Sr, Ba), (RE,M)$CrO_3$ (RE=La, Ce, Pr, Nd, Pm, Sm, Eu, Gd, Tb, Dy, Ho, Er, Tm, Yb, Lu, Y; M=Ca, Sr, Ba), (RE,M)$MnO_3$ (RE=La, Ce, Pr, Nd, Pm, Sm, Eu, Gd, Tb, Dy, Ho, Er, Tm, Yb, Lu, Y; M=Ca, Sr, Ba), (RE,M)$CoO_3$ (RE=La, Ce, Pr, Nd, Pm, Sm, Eu, Gd, Tb, Dy, Ho, Er, Tm, Yb, Lu, Y; M=Ca, Sr, Ba), or $RENiO_3$ (RE=La, Ce, Pr, Nd, Pm, Sm, Eu, Gd, Tb, Dy, Ho, Er, Tm, Yb, Lu, Y), or a solid solution containing these compounds, and is oriented in any of the orientations of a cubic crystal (100), tetragonal crystal (001), rhombohedral crystal (100) or quasi-cubic crystal (100).

25. A method for manufacturing a ferroelectric device comprising the steps of:
forming a bottom electrode on a substrate;
forming a ferroelectric film on top of said bottom electrode; and
forming a top electrode on top of said ferroelectric film;
wherein said step of forming a ferroelectric film comprises the steps of forming a first layer with an in-plane orientation by an ion beam assist method, and forming a second layer by continuing deposition with the ion beam assist stopped.

26. A method for manufacturing a ferroelectric device comprising the steps of:
forming a bottom electrode on a substrate;
forming a ferroelectric film on top of said bottom electrode by an ion beam assist method, wherein by irradiating ion beams on the ferroelectric film, said ferroelectric film has a specific crystal orientation; and
forming a top electrode on top of said ferroelectric film;
wherein said step of forming a bottom electrode comprises the steps of forming a first layer with an in-plane orientation by an ion beam assist method, whereby irradiating ion beams on the bottom electrode, said bottom electrode has a specific crystal orientation and forming a second layer by continuing deposition with the ion beam assist stopped.

27. A method for manufacturing a ferroelectric device comprising the steps of:
forming a bottom electrode on a substrate by an ion beam assist method, wherein by irradiating ion beams on the bottom electrode, said bottom electrode has a specific crystal orientation;
forming a ferroelectric film on top of said bottom electrode by an ion beam assist method, wherein by irradiating ion beams on the ferroelectric film, said ferroelectric film has a specific crystal orientation; and
forming a top electrode on top of said ferroelectric film;
wherein the surface on which said ferroelectric film is to be formed is irradiated with an ion beam prior to the formation of said ferroelectric film.

28. A method for manufacturing a ferroelectric device comprising the steps of:
forming a bottom electrode on a substrate by an ion beam assist method, wherein by irradiating ion beams on the bottom electrode, said bottom electrode has a specific crystal orientation;
forming a ferroelectric film on top of said bottom electrode by an ion beam assist method, wherein by irradiating ion beams on the ferroelectric film, said ferroelectric film has a specific crystal orientation; and
forming a top electrode on top of said ferroelectric film;
wherein the surface on which said bottom electrode is to be formed is irradiated with an ion beam prior to the formation of said bottom electrode.

* * * * *